(12) United States Patent
Ashdown et al.

(10) Patent No.: US 10,290,148 B2
(45) Date of Patent: May 14, 2019

(54) SYSTEM AND METHOD FOR REAL TIME DYNAMIC LIGHTING SIMULATION

(71) Applicant: Suntracker Technologies Ltd., Victoria (CA)

(72) Inventors: Ian Ashdown, West Vancouver (CA); Wallace Jay Scott, Victoria (CA)

( * ) Notice: Subject to any disclaimer, the term of this patent is extended or adjusted under 35 U.S.C. 154(b) by 57 days.

(21) Appl. No.: 15/666,938

(22) Filed: Aug. 2, 2017

(65) Prior Publication Data
US 2017/0345208 A1 Nov. 30, 2017

Related U.S. Application Data

(63) Continuation-in-part of application No. 15/470,180, filed on Mar. 27, 2017, and a continuation-in-part of
(Continued)

(51) Int. Cl.
*G06T 15/50* (2011.01)
*G06T 15/00* (2011.01)
(Continued)

(52) U.S. Cl.
CPC .......... *G06T 15/506* (2013.01); *G05B 19/042* (2013.01); *G06F 17/11* (2013.01); *G06F 17/504* (2013.01); *G06F 17/5004* (2013.01); *G06F 17/5009* (2013.01); *G06F 17/5018* (2013.01); *G06T 15/005* (2013.01); *G06T 15/04* (2013.01); *G06T 15/55* (2013.01); *G06T 15/80* (2013.01); *H05B 37/0218* (2013.01);
(Continued)

(58) Field of Classification Search
USPC ........................................................ 345/582
See application file for complete search history.

(56) References Cited

U.S. PATENT DOCUMENTS

| 4,396,872 A | 8/1983 | Nutter |
| 4,430,828 A | 2/1984 | Oglevee |

(Continued)

OTHER PUBLICATIONS

Glassner, A. S. 1991. "Adaptive Run-Length Encoding," in Graphics Gems II, pp. 89-92. San Diego, CA: Academic Press.
(Continued)

*Primary Examiner* — Wesner Sajous

(57) ABSTRACT

Sustainable building lighting and energy modelling and control, and the associated computer graphics, including real-time dynamic lighting simulation, are concerned with: an optimized method for radiance modelling, including its application to predictive daylight harvesting; and the real-time simulation of physically-based electric lighting and daylighting for architectural, horticultural, and theatrical lighting systems visualization. In order to display and analyze in real time a photometrically accurate representation of an environment, thousands of lighting channels may have their intensity settings continually varied such that a user may interactively view the three-dimensional environment without the need for ongoing global illumination calculations. This can be accomplished utilizing texture maps as a multiplicity of canonical radiosity solutions, each representing a lighting channel for dynamic lighting simulation, and storing the solutions in the texture memory of a graphics processing unit.

20 Claims, 32 Drawing Sheets

Related U.S. Application Data application No. 15/407,176, filed on Jan. 16, 2017, and a continuation-in-part of application No. 14/792,590, filed on Jul. 6, 2015, now Pat. No. 9,955,552, which is a continuation-in-part of application No. 13/446,577, filed on Apr. 13, 2012, now Pat. No. 9,078,299.

(60) Provisional application No. 62/369,912, filed on Aug. 2, 2016, provisional application No. 62/313,718, filed on Mar. 26, 2016, provisional application No. 62/279,764, filed on Jan. 17, 2016, provisional application No. 62/172,641, filed on Jun. 8, 2015, provisional application No. 61/565,195, filed on Nov. 30, 2011, provisional application No. 61/457,509, filed on Apr. 14, 2011.

(51) Int. Cl.
| | | |
|---|---|---|
| G06T 15/04 | (2011.01) | |
| G06T 15/80 | (2011.01) | |
| G06F 17/11 | (2006.01) | |
| G06F 17/50 | (2006.01) | |
| H05B 37/02 | (2006.01) | |
| F24F 11/47 | (2018.01) | |
| F24F 11/30 | (2018.01) | |
| G06T 15/55 | (2011.01) | |
| G05B 19/042 | (2006.01) | |
| F24F 120/10 | (2018.01) | |
| F24F 130/20 | (2018.01) | |

(52) U.S. Cl.
CPC ..... *H05B 37/0227* (2013.01); *H05B 37/0281* (2013.01); *F24F 11/30* (2018.01); *F24F 11/47* (2018.01); *F24F 2120/10* (2018.01); *F24F 2130/20* (2018.01); *F24S 2201/00* (2018.05); *G06T 2215/16* (2013.01); *Y02B 20/42* (2013.01); *Y02B 20/46* (2013.01)

(56) References Cited

U.S. PATENT DOCUMENTS

| | | |
|---|---|---|
| 4,470,405 A | 9/1984 | Landstrom |
| 4,527,247 A | 7/1985 | Kaiser |
| 4,569,150 A | 2/1986 | Carlson |
| 4,930,446 A | 6/1990 | Huisinga |
| 4,992,942 A | 2/1991 | Bauerle |
| 5,014,225 A | 5/1991 | Vidaver |
| 5,031,358 A | 7/1991 | Sussman |
| 5,058,042 A | 10/1991 | Hanna |
| 5,130,925 A | 7/1992 | Janes |
| 5,269,093 A | 12/1993 | Horaguchi |
| 5,369,738 A | 2/1994 | Bremner |
| 5,313,568 A | 5/1994 | Wallace |
| 5,323,567 A | 6/1994 | Nakayama |
| 5,546,313 A | 8/1996 | Masters |
| 5,546,327 A | 8/1996 | Hattori |
| 5,668,446 A | 9/1997 | Baker |
| 5,734,385 A | 3/1998 | Mima |
| 5,923,331 A | 7/1999 | Dusseux |
| 5,936,633 A | 8/1999 | Aono |
| 6,262,742 B1 | 7/2001 | Tampieri |
| 6,313,842 B1 | 11/2001 | Tampieri |
| 6,366,283 B1 | 4/2002 | Tampieri |
| 6,411,297 B1 | 6/2002 | Tampieri |
| 6,441,820 B2 | 8/2002 | Prater |
| 6,487,322 B1 | 11/2002 | Bastos |
| 6,496,597 B1 | 12/2002 | Tampieri |
| 6,525,730 B2 | 2/2003 | Tampieri |
| 6,567,083 B1 | 5/2003 | Baum et al. |
| 6,753,859 B1 | 6/2004 | Segal |
| 7,019,276 B2 | 3/2006 | Cloutier |
| 7,045,968 B1 | 5/2006 | Bierman |
| 7,333,903 B2 | 2/2008 | Walters |
| 7,501,774 B2 | 3/2009 | Hick |
| 7,545,101 B2 | 6/2009 | Hick |
| 7,546,167 B2 | 6/2009 | Walters |
| 7,546,168 B2 | 6/2009 | Walters |
| 7,603,184 B2 | 10/2009 | Walters |
| 7,608,807 B2 | 10/2009 | Hick |
| 7,676,403 B2 | 3/2010 | Crutchfield, Jr. |
| 7,683,301 B2 | 3/2010 | Papamichael |
| 7,761,260 B2 | 7/2010 | Walters |
| 7,781,713 B2 | 8/2010 | Papamichael |
| 7,911,359 B2 | 3/2011 | Walters |
| 8,010,319 B2 | 8/2011 | Walters |
| 8,110,994 B2 | 2/2012 | Hick |
| 8,138,690 B2 | 3/2012 | Chemel et al. |
| 8,416,365 B1 | 4/2013 | Rosenberg |
| 9,078,299 B2 | 7/2015 | Ashdown |
| 9,103,529 B2 | 8/2015 | Edwards |
| 9,674,924 B2 | 6/2017 | Lashina |
| 9,695,629 B2 | 7/2017 | Kostro |
| 9,734,433 B1 | 8/2017 | Mysore Vijaya |
| 9,836,557 B2 | 12/2017 | Marceau |
| 9,955,551 B2 | 4/2018 | Spero |
| 2005/0041024 A1 | 2/2005 | Green |
| 2006/0020563 A1* | 1/2006 | Coleman ............... G06N 3/049 706/20 |
| 2008/0007394 A1 | 1/2008 | Roberts |
| 2010/0006749 A1 | 1/2010 | Hick |
| 2010/0045675 A1* | 2/2010 | Wyborn ............... G06T 15/005 345/426 |
| 2010/0045676 A1* | 2/2010 | Wyborn ............... G06T 15/50 345/426 |
| 2010/0289412 A1 | 5/2010 | Middleton-White |
| 2010/0259931 A1 | 6/2010 | Chemel |
| 2010/0262296 A1 | 10/2010 | Chemel |
| 2010/0262297 A1 | 10/2010 | Shloush et al. |
| 2011/0276269 A1 | 11/2011 | Hummel |
| 2011/0282514 A1 | 11/2011 | Ropp et al. |
| 2011/0292070 A1 | 12/2011 | Hasegawa |
| 2011/0310270 A1* | 12/2011 | Gladnick ............ G01N 21/8806 348/229.1 |
| 2012/0193028 A1 | 8/2012 | Willham |
| 2012/0206050 A1 | 8/2012 | Spero |
| 2012/0265350 A1* | 10/2012 | Ashdown ............ H05B 37/0218 700/276 |
| 2012/0293077 A1 | 11/2012 | Tousain et al. |
| 2012/0299498 A1* | 11/2012 | Quaal ............... H05B 33/0845 315/210 |
| 2013/0063065 A1 | 3/2013 | Berman et al. |
| 2014/0292206 A1 | 10/2014 | Lashina et al. |
| 2014/0365182 A1 | 12/2014 | Marceau |
| 2014/0375222 A1 | 12/2014 | Rains et al. |
| 2015/0225999 A1 | 8/2015 | Berman et al. |
| 2015/0234944 A1 | 8/2015 | Marceau |
| 2015/0234945 A1 | 8/2015 | Marceau |
| 2015/0242095 A1 | 8/2015 | Sonnenberg |
| 2015/0249336 A1 | 9/2015 | Raneri |
| 2015/0302637 A1 | 10/2015 | Glaser |
| 2016/0007426 A1* | 1/2016 | Ashdown ............ H05B 37/0227 700/90 |
| 2016/0258209 A1 | 9/2016 | Berman |
| 2017/0130920 A1 | 5/2017 | Tsujimoto |
| 2018/0108153 A1 | 4/2018 | Hasegawa |

OTHER PUBLICATIONS

Ritschel et al., 2011, Computer Graphics Forum 31(1):160-168.
Larson, G. W. 1998. "The LogLuv Encoding for Full Gamut, High Dynamic Ranges Images," Journal of Graphics Tools 3(1):15-31.
Radiosity: A Programmer's Perspective 1994 by John Wiley & Sons, New York, NY.
Lee et al. A Study on Measurement of the Amount of Incoming Light in a Virtual Green House.
Wilcox and Marion 2008, Users Manual for TMY3 Data Sets, National Renewable Energy Laboratory Technical Report NREL/TP-581-43156.

(56) References Cited

OTHER PUBLICATIONS

Chelle and Andrieu 2007, Modelling the Light Environment of Virtual Crop Canopies, Functional-Structural Plant Modelling in Crop Production, Vos et al. Eds, pp. 75-89.

Hosek and Wilkie 2012, An Analytic Model for Full Spectral Sky-Dome Radiance, ACM Transactions on Graphics 31(4) Article 5.

ANSI/IES RP-16-10, Nomenclature and Definitions for Illuminating Engineering.

Ashdown 1994, Radiosity: A Programmer's Perspective, Chapter 5.

BS EN 15242:2007, Ventilation for buildings—Calculation methods for the determination of air flow rates in buildings including infiltration.

Johkan et al. 2011 Effect of green light wavelength and intensity on photomorphogenesis and photosynthesis in Lactuca sativa Environmental and Experimental Botany 75 (2012) 128-133.

Zhai et al. 2017 Scalable-manufactured randomized glass-polymer hybrid metamaterial for daytime radiative cooling Science 355, 1062-1066.

Fairman, H. and Brill, M. 2004 The Principal Components of Reflectances Color research and application vol. 29, No. 2 pp. 104-110.

Folta et al. 2007, Green Light: A Signal to Slow Down or Stop, Journal of Experimental Botany 58(12):3099-3111.

Garland, M., and P. GS. Heckbert. 1997. "Surface Simplification using Quadric Error Metrics," Proc. ACM SIGGRAPH 1997, pp. 209-216.

Hinker, P., and C. Hansen. 1993. "Geometric Optimization," Proc. Visualization '93, pp. 189-195.

IES LM-83-12, IES Spatial Daylight Autonomy (sDA) and Annual Sunlight Exposure (ASE).

ISO Standard 21348:2007, Space environment (natural and artificial)—Process for determining solar irradiances.

Karras, T. 2012. "Maximizing Parallelism in the Construction of BVHs, Octrees, and k-d Trees," Proc. ACM High Speed Graphics 2015, pp. 33-37.

Legrand, H., and T. Boubekeur. 2015. "Morton Integrals for High Speed Geometry Simplification," Proc. ACM High Speed Graphics 2015, pp. 105-112.

Masala, G. L., B. Golosio, and P. Oliva. 2013. "An Improved Marching Cube Algorithm for 3D Data Segmentation," Computer Physics Communications 184:777-782.

Nooruddin, F. S., and G. Turk, 1999. Simplification and Repair of Polygonal Models Using Volumetric Techniques, Technical Report GIT-GVU-99-37, Georgia Institute of Technology.

Perez, F. et al. 1997, Global Illumination Techniques for the Simulation of Participating Media, Proc. Eighth Eurographics Workshop on Rendering.

Samet, H. 1990. Application of Spatial Data Structures: Computer Graphics, Image Processing and GIS: Boston, MA: Addison-Wesley.

Siltanen, S., T. Lokki, L. Savioja, and C. L. Christensen. 2008. "Geometry Reduction in Room Acoustics Modeling," Acta Acustica United with Acustica vol. 94, pp. 410-418.

Smith 2000, Phytochromes and Light Perception by Plants—An Emerging Synthesis, Nature 407:585-591.

Willa et al. 2014. When Nanoparticles Meet Poly(ionic Liquid)s: Chemoresistive $CO_2$ Sensing at Room Temperature, Advanced Functional Materials 25(17):2537-2542.

Zuk-Golaszewska et al. 2003, The Effect of UV-B Radiation on Plant Growth and Development, Plant Soil Environ 49 (3):135-140.

Ehret et al. 2011 Neural network modeling of greenhouse tomato yield, growth and water use from automated crop monitoring data Computers and Electronics in Agriculture 79 pp. 82-89.

Dutre, P., P. Bekaert, and K. Bala. 2003 Advanced Global Illumination. Natick, Massachusetts: A. K. Peters, Ltd.

* cited by examiner

SYSTEM AND METHOD FOR REAL TIME DYNAMIC LIGHTING SIMULATION

This application claims benefit of U.S. provisional Ser. No. 62/369,912 filed 2 Aug. 2016, which is incorporated by reference herein in its entirety, and is a continuation in part of U.S. patent application Ser. No. 15/470,180 filed 27 Mar. 2017 which claims benefit of U.S. provisional Ser. No. 62/313,718 filed 26 Mar. 2016 and is a continuation in part of U.S. patent application Ser. No. 15/407,176 filed 16 Jan. 2017 which claims benefit of U.S. provisional Ser. No. 62/279,764 filed 17 Jan. 2016 and is a continuation in part of U.S. patent application Ser. No. 14/792,590 filed 6 Jul. 2015 which claims benefit of U.S. provisional Ser. No. 62/172,641 filed 8 Jun. 2015 and is a continuation in part of U.S. patent application Ser. No. 13/446,577 filed 13 Apr. 2012 (U.S. Pat. No. 9,078,299) which claims benefit of U.S. provisional Ser. No. 61/565,195 filed 30 Nov. 2011 and claims benefit of U.S. provisional Ser. No. 61/457,509 filed 14 Apr. 2011.

TECHNICAL FIELD

The subject matter of the present invention relates to the field of sustainable building lighting and energy modelling and control and computer graphics, and more particularly, is concerned with: an optimized method for radiance modelling, including its application to predictive daylight harvesting; and the real-time simulation of physically-based electric lighting and daylighting for architectural and theatrical lighting systems visualization.

BACKGROUND

Electric lighting accounts for approximately 40 percent of all energy consumed in modern buildings. Incorporating available daylight can reduce these annual energy costs by 40 to 50 percent using "daylight harvesting" techniques. The basic principle of daylight harvesting is to monitor the amount of daylight entering an interior space and dim the electric lighting as required to maintain a comfortable luminous environment for the occupants. Where required, motorized blinds and electrochromic windows may also be employed to limit the amount of daylight entering the occupied spaces. Further energy savings can be realized through the use of occupancy sensors and personal lighting controls that operate in concert with the daylight harvesting system. These systems can be onerous to model and control using current methods, and rely on extensive computing resources to adequately model and control the variables involved.

Three-dimensional virtual representations of architectural and theatrical lighting systems were first developed in the 1980s, and today are often used by architects and lighting designers to both visualize and analyze their daylighting and electric lighting system designs. Architectural and theatrical lighting systems are not limited to interior lighting, and include lighting systems on the exterior of buildings or structures.

A typical workflow for the creation of said virtual representations comprises the steps of: 1) using a computer-aided drafting (CAD) program to create a three-dimensional representation of the geometry of a building or similar architectural environment; 2) assigning material properties such as color, transparency, and texture to the geometric surfaces; 3) specifying the photometric properties of light sources within the environment; 4) calculating the distribution of direct and indirect illumination due to the light sources within the environment; and 5) displaying the virtual representations on a computer monitor or other visual display medium.

Calculation of the distribution of direct and indirect illumination is typically performed using global illumination techniques such as those described in, for example, "The State of the Art in Interactive Global Illumination" (Ritschel et al., 2011, Computer Graphics Forum 31(1):160-168). Critically for the photometric analysis of lighting designs (including both electric lighting and daylight), these techniques are based on the physical principles of light interaction with surfaces and materials, rather than mere artistic representations.

Most global illumination techniques are based on ray tracing, including those techniques known as irradiance caching, photon mapping, and multidimensional light cuts. The advantage of ray tracing techniques is that they can accurately model reflections from specular and semispecular ("glossy") surfaces, refraction by transparent materials such as glass and water, interactions with participating media such as smoke and fog, and subsurface translucency of human skin, marble, and so forth. These features are critically important for the generation of high quality "photorealistic" imagery, including both still images and motion pictures.

One of the disadvantages of ray tracing techniques is that they are view-dependent; a specific position and view direction within the virtual environment must be chosen in order to trace rays to and from the virtual camera. The various ray tracing techniques are computationally expensive, typically necessitating the distribution of direct and indirect illumination within the environment to be calculated offline using minutes to days of CPU time. (While it is possible to approximate the appearance of direct and indirect illumination within an environment in real time for computer games, the resultant images are unsuitable for photometric analysis as required by architects and lighting designers.)

The view dependency of ray tracing techniques further means that only those surfaces visible in the rendered images are available for photometric analysis. For an architectural building with multiple rooms, for example, one or more rendered images must be generated for each room.

Not all global illumination techniques are based on ray tracing; there is also a class of finite element methods referred to as "radiosity." These methods are more commonly used in thermal engineering to model radiative flux transfer between surfaces, but they are equally capable of modeling reflections from diffuse and semispecular surfaces, and transmission by transparent and translucent surfaces, as described in, for example, "Radiosity: A Programmer's Perspective" (Ashdown 1994. New York, N.Y.: John Wiley & Sons). While less capable of generating high quality photorealistic imagery, they are ideally suited for photometric analysis. In addition to the calculated illuminance distributions being physically accurate, they are view-independent. Once the calculations have been completed, the entire three-dimensional environment can be interactively viewed and photometrically analyzed in real time without the need for further calculations.

A particular disadvantage of both ray tracing techniques and radiosity methods, however, is that they are incapable of generating representations of "dynamic" lighting systems in real time. Examples of such lighting systems include theatrical and entertainment lighting where the intensity and color of the light sources is continuously varied, and architectural lighting systems where the light sources may be dimmable or have varying color temperatures (e.g., "warm white" to "cool white"). Another example is daylighting, where it may be desirable to display and analyze the distribution of daylight in architectural spaces throughout the year.

Theatrical and entertainment lighting systems in particular may have tens to hundreds, and even thousands, of lighting "channels" wherein each channel dims one or a plurality of electric light sources ("luminaires"). Three such channels may be assigned to color-changing luminaires with red, green, and blue light sources. Architectural lighting systems are similar, albeit with only a few lighting channels to dim the luminaires and possibly change their color temperatures.

If possible, lighting designers would like to have the ability to both visualize and photometrically analyze these electric lighting and daylighting system in a virtual environment as a design tool. Ideally, it should be possible (especially for theatrical and entertainment lighting systems) to interactively control the lighting channel settings while interactively viewing the three-dimensional environment.

One prior art approach has been to specify a fixed virtual camera position and view direction, then generate a multiplicity of static images wherein for each image, exactly one of the lighting channels is set at full intensity while the other channels are disabled. These images are then blended in real time during display to simulate the effect of dimming the different lighting channels. This approach is mostly limited, however, to the representation of simple architectural dimming system, as each lighting channel requires a full-resolution still image. A theatrical lighting system with hundreds to thousands of lighting channels would overwhelm the graphics capabilities of most desktop computers, not to mention the more limited capabilities of tablet computers and smartphones.

Another prior art approach relies on the real-time display capabilities of graphics hardware subsystems such as OpenGL from Khronos Group and Direct3D from Microsoft. Commercial software products such as, for example, WYSIWIG from Cast Software, enable lighting designers to visualize theatrical lighting systems with hundreds to thousands of lighting channels controlled by physical lighting consoles that are connected to a desktop computer. The disadvantage of this approach is that, while the 3D virtual environment can be interactively viewed, only the direct illumination from the luminaires can be modeled; indirect illumination due to interreflections from surfaces (which can often constitute over half of the illumination in an enclosed environment) is necessarily ignored. Further, the luminous intensity distributions of the luminaires—a critical aspect of professional lighting design—can only be approximated using the real-time capabilities of the graphic hardware subsystems. The resultant renderings are schematic rather than physically accurate.

There is therefore as need for a system and method of real-time dynamic lighting simulation, wherein a photometrically accurate representation of an environment can be displayed and analyzed in real time, while a plurality of hundreds to thousands of lighting channels may have their intensity settings being continually varied and the user may interactively view the three-dimensional environment, all without the need for ongoing global illumination calculations. The system and method should further be suitable for implementation on a variety of platforms, ranging from desktop computers to smartphones with bandwidth-limited communications.

SUMMARY

A method performed by a lighting modelling system for displaying real-time dynamic lighting simulations, the method comprising: encoding a texture map as a multiplicity of canonical radiosity solutions, each representing a lighting channel; storing the solutions in the texture memory of a graphics processing unit; generate a multiplicity of lighting channel intensity settings; store the lighting channel intensity settings; access the canonical radiosity solutions on a per-vertex basis with a vertex shader; multiply the associated vertex channel colors by the lighting channel intensity settings; and sum the resultant colors to generate a vertex color for display.

The disclosed and/or claimed subject matter is not limited by this summary as additional aspects are presented by the following written description and associated drawings.

DETAILED DESCRIPTION

Figure 1A:
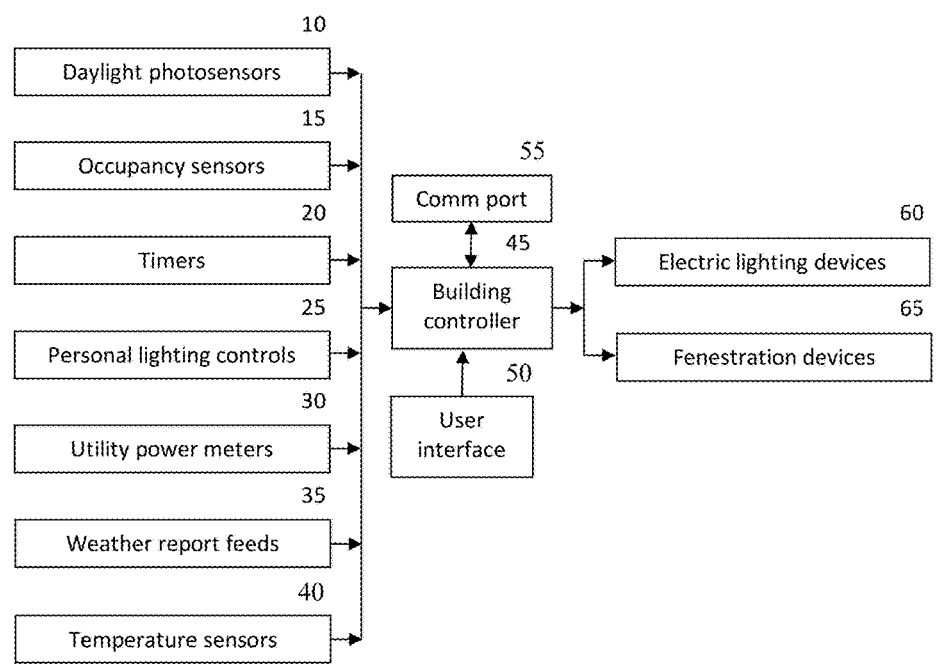
FIG. 1A shows a block diagram of the predictive daylight harvesting system for buildings.

Electric lighting accounts for approximately 40 percent of all energy consumed in modern buildings. Incorporating available daylight can reduce these annual energy costs by 40 to 50 percent using "daylight harvesting" techniques. The basic principle of daylight harvesting is to monitor the amount of daylight entering an interior space and dim the electric lighting as required to maintain a comfortable luminous environment for the occupants. Where required, motorized blinds and electrochromic windows may also be employed to limit the amount of daylight entering the occupied spaces. Further energy savings can be realized through the use of occupancy sensors and personal lighting controls that operate in concert with the daylight harvesting system and are therefore considered integral thereto.

As a non-limiting example, the present invention provides a predictive daylight harvesting system for buildings which can be implemented as a method comprising the steps of: a) inputting data values regarding a plurality of variable building design parameters; b) calculating the effects on a building's environmental characteristics based on the data values regarding a plurality of building design parameters; c) changing at least one of the data values regarding variable building design parameters; d) recalculating the effects on a building's environmental characteristics based on the data values regarding a plurality of building design parameters. Buildings in the context of this patent are inclusive of any structure wherein the ambient environment may be augmented through controlled means, including but not limited to light, heat, and humidity. As a result, buildings include, but are not limited to, residential premises, commercial premises (including offices and warehouses), aviculture facilities, agriculture facilities and animal husbandry facilities. In addition to buildings in general, specific reference will be made to greenhouses and aquaculture facilities without limiting the application of the predictive daylight harvesting system described herein.

Daylight harvesting is important wherever the amount of available daylight must be controlled or supplemented with electric lighting. Examples include hospitals and long-term care facilities where daily exposure to natural lighting is beneficial, fish farms and aquaponic facilities where overhead or underwater lighting is used to entrain the circadian rhythms of fish, and free-range aviculture where birds require a minimum amount of natural and electric lighting for optimum health and well-being.

The parameters may be used to control any building environmental system including lighting, heating, humidity or all of them together. This enables the selection of building design parameter settings to maximize energy savings while maintaining selected minimal occupant, including plant or animal, requirements, for example, for heating, lighting, and/or humidity. Daylight harvesting is well suited to lighting control and to a lesser extent heating control, but the system is not limited to that prime example of a use for the system.

Solar insolation is not necessarily a parameter to be used in the system, but it is a prime parameter to be considered in building design. In practice it would be preferred to include the steps of: a) measuring actual solar insolation and fine-tuning selected building design parameter settings to maximize energy savings while maintaining selected minimal occupant, including plant or animal, requirements for heating and lighting; b) analyzing a combination of historical weather data, in situ daylight measurements over time, and current weather predictions, and determining an optimal strategy for predictive daylight harvesting that maximizes energy savings while maintaining selected minimal occupant, including plant or animal, requirements for heating and lighting; c) analyzing occupant behavior, based on input from occupancy event sensors and personal lighting control actions, or plant or animal growth and health based on input from plant sensors and/or manual greenhouse operator input, and determining an optimal strategy for daylight harvesting that maximizes energy savings while maintaining selected minimal occupant, including plant or animal, requirements for heating and lighting, based on predicted occupant behavior, or plant or animal growth and health; and d) interacting with a building's HVAC control system and implementing an optimal strategy for maximizing energy savings while maintaining selected minimal occupant requirements, including plant or animal, for heating, ventilation, air-conditioning, and lighting.

The variable building design parameters would include one or more daylight photosensor locations, luminaire locations and illumination levels, occupancy sensor locations, temperature sensor locations and temperatures, humidity sensor locations and humidity levels, glazing transmittance characteristics, and thermal emissivity and thermal mass of objects and surfaces in a building's interior environment for the purpose of determining radiative heat transfer within the building environment due to solar insolation.

The variable greenhouse design parameters would include one or more daylight photosensor locations, luminaire locations and illumination levels, temperature sensor locations and temperatures, humidity sensor locations and humidity levels, soil moisture levels, carbon dioxide and oxygen gas concentrations, plant phytometrics, wind speed and direction, glazing transmittance characteristics, and thermal emissivity and thermal mass of objects and surfaces in a building's interior environment for the purpose of determining radiative heat transfer within the building environment due to solar insolation.

As another non-limiting example, in a basic implementation, the predictive daylight harvesting method would have the following steps: a) receiving input data from at least one ambient condition sensor and at least one information feed about anticipated solar conditions; b) calculating a luminous environment for a building based on the input data; c) generating messages based on output data about the calculated luminous environment; and d) transmitting the messages via an interconnect system to a building environmental control subsystem, in order to maximize energy savings while maintaining selected minimal occupant, including plant or animal, requirements for a building's environmental characteristics.

As yet another non-limiting example, the predictive daylight harvesting system can be implemented as an apparatus having a controller that: a) reads input data from a variety of sensors and information feeds, the sensors and feeds to include at least a plurality of sensors and information feeds from among the class of sensors and information feeds that includes daylight photosensors, temperature sensors, occupancy sensors, humidity sensors, soil moisture sensors, gas concentration sensors, anemometers, timers, personal lighting controls, utility smart power meters, weather report feeds, HVAC and energy storage controllers; b) calculates the effects of variable building design parameters on building environment characteristics, such as light, heat, and humidity balance and on energy management; and c) outputs building design parameter setting command signals, in order to maximize energy savings while maintaining selected minimal occupant, including plant or animal, requirements for the building environment characteristics respectively. The controller would read input data from a variety of sensors and information feeds, including but not limited to daylight photosensors, temperature sensors, occupancy sensors, humidity sensors, soil moisture sensors, gas concentration sensors, anemometers, timers, personal lighting controls, utility power meters, weather report feeds, and other energy management systems, including HVAC and energy storage controllers. The controller would receive and process information about light fixtures and light sources (luminaires) located in a building's interior environment, including photometric and electrical properties of the luminaires.

The controller may also read input data from and output command signals and data to: a) variable power generation systems, including wind turbines, solar panels, tidal power generators, run-of-river power generators, geothermal power generators, electrical batteries, compressed air and molten salt storage systems, biomass power generators, and other off-grid power sources; b) local heat sources, including geothermal and biomass fermenters; c) water recycling and reclamation systems, including rainfall collectors and cisterns, snowmelt, and atmospheric water generators; and d) air pollution control systems, including air filters and scrubbers.

The building control system would be enhanced by having the controller maintain and access virtual representations of a building's exterior and interior environments, including the geometry and material properties of objects that may significantly influence the distribution of daylight and artificial (for example, electrically-generated) luminous flux within the environments, such as luminaires located in the interior environment, including their photometric and electrical properties, daylight photosensors located in the interior and optionally exterior environments, and occupancy sensors located in the interior environment. These virtual representations of building exterior and interior environments would be accessed by the controller to perform calculations on the effects of solar insolation on building heat balance and energy management. Specifically, virtual representations of thermal emissivity and heat capacity (thermal mass) of objects and surfaces in a building's interior environment, would accessed by the controller for the purpose of determining radiative and conductive heat transfer within the environment due to solar insolation. Additionally, virtual representations of occupants and their behaviors, including where the occupants are likely to be located within a building's interior environments at any given time and date, and the occupants' personal lighting preferences, would be accessed by the controller for the purpose of calculating optimal output settings for building design parameter setting command signals in order to maximize energy savings while maintaining selected minimal occupant requirements for heating and lighting.

Similarly, a greenhouse control system would be enhanced by having the controller maintain and access virtual representations of a greenhouse's exterior and interior environments, including the geometry and material properties of objects that may significantly influence the distribution of daylight and artificial (for example, electrically-generated) luminous flux within the environments, such as luminaires located in the interior environment, including their photometric and electrical properties, daylight photosensors, and humidity sensors located in the interior and optionally exterior environments, soil moisture and gas concentration sensors located in the interior environment, and wind speed and direction sensors located in the exterior environment. These virtual representations of building exterior and interior environments would be accessed by the controller to perform calculations on the effects of solar insolation on greenhouse heat balance and energy management. Specifically, virtual representations of thermal emissivity and heat capacity (thermal mass) of objects and surfaces in a greenhouse's interior environment, would accessed by the controller for the purpose of determining radiative and conductive heat transfer within the environment due to solar insolation. Additionally, virtual representations of plant growth and health, including the plants' photosynthetic and photomorphogenetic processes, temperature, humidity and other environmental requirements, would be accessed by the controller for the purpose of calculating optimal output settings for greenhouse design parameter setting command signals in order to maximize energy savings while maintaining selected minimal plant requirements for heating and lighting.

Optimally, the building control system would include a fuzzy-logic inference engine that learns weather patterns and occupant usage patterns and preferences, and the controller would maintain a mathematical model of sky conditions, historical weather data, and a database of weather patterns and occupant usage patterns and preferences, continually reads data from external input and communication devices, calculates the optimal settings for luminaires and fenestration devices, and controls luminaires and fenestration devices to achieve maximal energy savings while providing an interior luminous and thermal environment that is consistent with predefined goals and occupant preferences.

Similarly, an optimal greenhouse control system would include a fuzzy-logic inference engine that learns weather patterns and optimal plant and animal growth and health parameters, and the controller would maintain a mathematical model of sky conditions, historical weather data, and a database of weather patterns and plant short-term and long-term environmental requirements, continually reads data from external input and communication devices, calculates the optimal settings for luminaires and fenestration devices, and controls luminaires, fenestration devices, humidity control devices, and supplemental carbon dioxide distribution devices to achieve maximal energy savings while providing an interior luminous and thermal environment that is consistent with predefined goals and plant requirements.

In one elementary form, the predictive daylight harvesting system would also comprise: a) at least one controller that reads input data from a variety of sensors and information feeds, and that includes an artificial intelligence engine; b) at least one ambient condition sensor and at least one information feed; and c) an interconnect system operatively coupling the controller to the sensor and the information feed, configured to provide output data suitable for dimming or switching luminaires and operating automated fenestration and other environmental devices.

The controller may further maintain communication with other building automation subsystems, including but not limited to HVAC and energy storage systems. It may also maintain communication with external systems such as electrical power utilities and smart power grids.

In a preferred mode of operation, the controller would continually read data from the external input and communication devices, calculate the optimal settings for the luminaires, fenestration, and other environmental control devices, and control those devices to achieve maximal annual energy savings while providing an interior luminous and thermal environment that is consistent with predefined goals and occupant preferences or plant or animal requirements. The "what-if" scenarios capability of the invention deriving from its simulating a virtual building interior environment on a regular basis (for example, hourly) enable a physical daylight harvesting controller system to be designed (for example, including an optimal layout of daylight photosensors) and programmed accordingly. The controller can then further access the virtual representation during operation to refine its behavior in response to the building performance by means of "what-if" simulations.

The present invention is herein described more fully with reference to the accompanying drawings, in which embodiments of the invention are shown. This invention may, however, be embodied in many different forms, and should not be construed as limited to the embodiments described herein. Rather, these embodiments are provided so that this disclosure will be thorough and complete, and will fully convey the scope of the invention to those skilled in the art. As used in the present disclosure, the term "diffuse horizontal irradiance" refers to that part of solar radiation which reaches the Earth as a result of being scattered by the air molecules, aerosol particles, cloud particles, or other airborne particles, and which is incident upon an unobstructed horizontal surface, the term "direct normal irradiance" refers to solar radiation received directly from the Sun on a plane perpendicular to the solar rays at the Earth's surface, the term "solar insolation" refers to the solar radiation on a given surface, and the terms "illuminance," "irradiance," "luminous exitance," "luminous flux," "luminous intensity," "luminance," "spectral radiant flux," "spectral radiant exitance," and "spectral radiance" are commonly known to those skilled in the art.

As used in the present disclosure, the term "photosynthetically active radiation" (abbreviated "PAR") refers to the spectral range of electromagnetic radiation (either solar or electrically-generated) from 400 nm to 700 nm that photosynthetic organisms are able to use in the process of photosynthesis. It is commonly expressed in units of micromoles per second ($\mu$mol/sec).

As used in the present disclosure, the term "photosynthetic photon flux density" (abbreviated "PPFD") refers to the density of photosynthetic photons incident upon a physical or imaginary surface. It is commonly measured in units of micromoles per square meter per second ($\mu$mol/m2-sec) with a spectrally-weighted "quantum" photosensor.

As used in the present disclosure, the term "ultraviolet radiation" refers to the spectral range of electromagnetic radiation (either solar or electrically-generated) from 280 nm to 400 nm. It may be further referred to as "ultraviolet A" (abbreviated "UV-A") with spectral range of 280 nm to 315 nm, and "ultraviolet B" (abbreviated "UV-B") with a spectral range of 315 nm to 400 nm. It may be expressed in units of micromoles per second ($\mu$mol/sec) or watts.

As used in the present disclosure, the term "visible light" refers to the spectral range of electromagnetic radiation (either solar or electrically-generated) from 400 nm to 700 nm.

As used in the present disclosure, the term "infrared radiation" refers to the spectral range of electromagnetic radiation (either solar or electrically-generated) from 700 nm to 850 nm for horticultural purposes, and from 700 nm to 2800 nm for solar insolation purposes. It may be expressed in units of micromoles per second ($\mu$mol/sec) or watts.

As used in the present disclosure, the term "environment" may refer to a virtual environment comprised of a finite element model or similar computer representation with virtual sensors and control devices, or a physical environment with physical sensors and control devices.

As used in the present disclosure, the term "luminous environment" refers to a physical or virtual environment wherein visible light, ultraviolet radiation, and/or infrared radiation, is distributed across material surfaces.

As used in the present disclosure, the term "solar heat gain" refers to the increase in temperature in an object that results from solar radiation.

Electric lighting accounts for approximately 40 percent of all energy consumed in modern buildings. It has long been recognized that incorporating available daylight can reduce these annual energy costs by 40 to 50 percent using "daylight harvesting" techniques.

Daylight harvesting is also an essential feature of agricultural greenhouses, whose primary function is to provide a controlled environment for growing vegetables or flowers. Optimizing daylight usage minimizes supplemental lighting and heating costs while maintaining optimal growing conditions.

The basic principle of daylight harvesting is to monitor the amount of daylight entering an interior space and dim the electric lighting as required to maintain a comfortable luminous environment for the occupants. Where required, motorized blinds and electrochromic windows may also be employed to limit the amount of daylight entering the occupied spaces.

The same principle applies to greenhouses, where it is necessary to provide supplemental electric lighting and heating or ventilation as required to maintain optimal growing conditions. Where required, motorized shading devices and electrochromic windows may also be employed to limit the amount of daylight entering the greenhouse spaces.

Further energy savings can be realized through the use of occupancy sensors and personal lighting controls that operate in concert with the daylight harvesting system and are therefore considered integral thereto. At the same time, the building occupants' comfort and productivity must be taken into consideration by for example limiting visual glare due to direct sunlight.

Yet further energy savings can be realized through the use of transparent or semi-transparent solar panels, particularly those which absorb and convert to electricity ultraviolet and/or infrared radiation while remaining substantially transparent to visible light. The performance of such panels when used for building glazing thereby becomes integral to the performance of the daylight harvesting system.

Daylight harvesting is also related to solar insolation management in that the infrared solar irradiation entering interior spaces is absorbed by the floors, walls and furniture as thermal energy. This influences the building heat and humidity balance that must be considered in the design and operation of heating, ventilation and air conditioning (HVAC) systems. For example, the energy savings provided by electric light dimming may need to be balanced against the increased costs of HVAC system operation needed to maintain building occupant's comfort and productivity or plant growth and health. The use of temperature sensors and humidity sensors are therefore also considered integral to a daylight harvesting system.

For greenhouses, the amount of daylight entering the greenhouse space is directly related to plant photosynthesis and water evaporation. Further energy savings and optimization of plant growth and health can therefore be realized through the use of temperature sensors, humidity sensors, soil moisture sensors, carbon dioxide and oxygen concentration sensors, and sensors for directly monitoring plant growth and health (for example, U.S. Pat. Nos. 7,660,698 and 8,836,504). Such sensors operate in concert with the daylight harvesting system and are therefore considered integral thereto.

Related to solar insolation management is the design and operation of solar energy storage systems for high performance "green" buildings, wherein thermal energy is accumulated by means of solar collectors and stored in insulated tanks or geothermal systems for later use in space heating. Similarly, electrical energy may be accumulated by means of solar photovoltaic panels or wind power plants and stored in batteries for later use in operating electric lighting. The decision of whether to store the thermal and/or electrical energy or use it immediately is dependent in part on daylight harvesting through the operation of motorized blinds and other active shading devices that affect solar insolation of interior surfaces.

The operation of such systems may therefore benefit from weather data and other information that is shared by the daylight harvesting system. More generally, the design and operation of a daylight harvesting system is advantageously considered a component of an overall building automation system that is responsible for energy usage and conservation.

Annual lighting energy savings of 40 to 50 percent are possible with well-designed electric lighting systems incorporating daylight harvesting, even as standalone controllers that function independently of the HVAC systems. However, it has also been shown that roughly half of all installed daylight harvesting systems do not work as designed. These systems do not provide significant energy savings, and in many cases have been physically disabled by the building owners due to unsatisfactory performance.

The underlying problem is that the performance of these systems is determined by many parameters, including lamp dimming (continuous versus bi-level switched), photosensor placement and orientation, photosensor spatial and spectral sensitivity, luminaire zones, timer schedules, occupancy sensors, interior finishes, window transmittances, exterior and interior light shelves, motorized blinds and other shading devices, and personal lighting controls. In addition, the presence of exterior occluding objects such as other buildings, large trees and surrounding geography need to be considered, as do the hour-by-hour weather conditions for the building site.

A similar underlying problem exists with greenhouses in that the performance of greenhouse control systems is determined by many parameters, including lamp switching, photo sensor placement and orientation, photosensor spatial and spectral sensitivity, luminaire zones, timer schedules, humidity sensors, soil moisture sensors, gas sensors, and plant monitoring sensors, interior finishes, exterior and interior light shelves and similar reflectors, motorized shading devices, heating and ventilation devices, humidity control devices, supplemental carbon dioxide distribution devices, and greenhouse operator controls. In addition, the presence of exterior occluding objects such as other buildings, large trees and surrounding geography need to be considered, as do the hour-by-hour weather conditions for the greenhouse building site. Wind direction and speed is also a concern, due to the typically high rate of conductive heat loss through the greenhouse glazing system.

Given all this, there are at present no suitable design tools for the architect or lighting designer to simulate the performance of such complex systems. In particular, the current state-of-the-art in lighting design and analysis software requires ten of minutes to hours of computer time to simulate a single office space for a given time, date, and geographic location. Architects and lighting designers have no choice but to calculate the lighting conditions at noon on the winter and summer solstices and spring and fall equinoxes, then attempt to estimate the performance of their daylight harvesting designs for the entire year based solely on this limited and sparse information.

Existing daylight harvesting systems are therefore designed according to basic rules of thumb, such as "locate the photosensor away from direct sunlight" and "dim the two rows of luminaires closest to the south-facing windows." There is no means or opportunity to quantify how the system will perform when installed.

There are software tools for building HVAC systems design that take solar insolation into account, but they do so in the absence of design information concerning daylight harvesting and electric lighting. The mechanical engineer typically has to assume so many watts per unit area of electric lighting and design to worst-case conditions, with no consideration for energy savings due to daylight harvesting.

Once the daylight harvesting system has been installed, it must be commissioned. This typically involves a technician visiting the building site once on a clear day and once at night to calibrate the photosensor responses. This is mostly to ensure that the system is working, as there is no means or opportunity to adjust the feedback loop parameters between the photosensors and the dimmable luminaires for optimum performance. Indeed, many existing daylight harvesting systems operate in open loop mode without any feedback, mostly for the sake of design simplicity.

There is therefore a need for a method and apparatus to accomplish five related tasks: First, there is a need for a method whereby an architect or lighting designer can fully and interactively simulate the performance of a daylight harvesting design. That is, the method should account for multiple system parameters that may influence the system performance, including the effects of solar insolation on building heat balance and energy management. The method should simulate the overall system such that an hour-by-hour simulation for an entire year can be generated in at most a few minutes. Given this interactive approach, an architect or lighting designer can experiment with many different designs or variations on a design in order to determine which design maximizes annual building energy savings while respecting building occupants' comfort or plant or animal growth and health requirements.

Second, there is a need for an apparatus that uses the aforesaid method to physically implement the simulated system, and which has the ability to self-tune its initial parameters (as determined by the simulation) in order to maximize annual energy savings.

Third, there is a need for an apparatus that can analyze a combination of historical weather data, in situ daylight measurements over time, current weather predictions, and other information using the aforesaid method to autonomously determine an optimal strategy for predictive daylight harvesting that maximizes annual energy savings.

Fourth, there is a need for an apparatus that can analyze occupant behavior, including occupancy sensor events and personal lighting controls actions such as luminaire dimming and switching and setting of personal time schedules, in buildings to autonomously determine an optimal strategy for daylight harvesting that maximizes annual energy savings based on predicted occupant behavior.

Similarly, there is a need for an apparatus that can analyze plant growth and health as determined by automatic plant growth sensors or manual greenhouse operator input, and autonomously determine an optimal strategy for daylight harvesting that maximizes annual energy savings based on predicted plant growth and health.

Fifth, there is a need for a daylight harvesting apparatus that can coordinate its operation with HVAC systems, solar energy storage systems, and other high performance "green" building management technologies that are influenced by solar insolation for the purposes of maximizing annual energy savings and building occupants' comfort and productivity or plant growth and health.

FIG. 1A shows an apparatus for enabling a predictive daylight harvesting system for a building. As shown, it is logically, but not necessarily physically, comprised of three components: 1) inputs 10 to 40; 2) controller 45, user interface 50 and communications port 55; and 3) outputs 60 and 65.

Figure 1B:
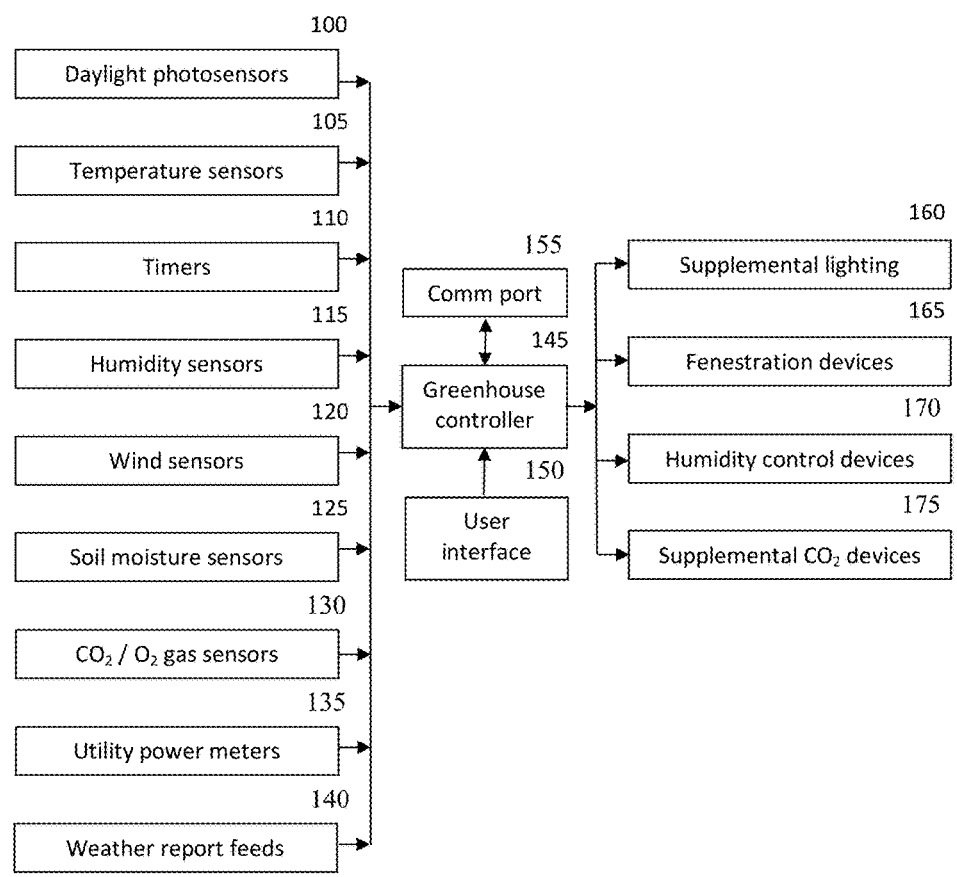
FIG. 1B shows a block diagram of the predictive daylight harvesting system for greenhouses.

FIG. 1B shows an apparatus for enabling a predictive daylight harvesting system for a greenhouse. As shown, it is logically, but not necessarily physically, comprised of three components: 1) inputs 100 to 140; 2) controller 145, user interface 150 and communications port 155; and 3) outputs 160 to 175.

Inputs

Referring to FIG. 1A, the inputs include daylight photosensors 10, occupancy or vacancy sensors 15, timers 20, personal lighting controls 25, utility power meters 30, weather report feeds 35, and optional temperature sensors 40.

Referring to FIG. 1B, the inputs include daylight photosensors 100, temperature sensors 105, timers 110, humidity sensors 115, and optional wind speed and direction sensors 120, soil moisture sensors 125, carbon dioxide and/or oxygen sensors 130, utility smart power meters 135, and weather report feeds 140.

For the purposes of this application, a photosensor 10 or 100 includes any electronic device that detects the presence of visible light, infrared radiation (IR), and/or ultraviolet (UV) radiation, including but not limited to photoconductive cells and phototransistors. The photosensor may be spectrally weighted to measure units of illuminance, irradiance, PPFD, ultraviolet power flux density, infrared power flux density, or spectral radiant flux.

For the purposes of this application, a gas concentration sensor 130 includes any electronic device that measures the partial pressure of a gas, including but not limited to, carbon dioxide and oxygen.

Spectral radiant flux may be measured with a spectroradiometer. Such instruments are useful for greenhouse application in that while knowledge of photosynthetically active radiation (PAR) and PPFD is useful for predicting plant growth and health on a per-species basis, it only measures visible light integrated across the spectral range of 400 nm to 700 nm. It is known however that ultraviolet radiation may induce changes in leaf and plant morphology through photomorphogenesis, that infrared radiation influences seed germination, flower induction, and leaf expansion, and that the presence of green light is important to many plants. The response of different plant species to spectral power distributions becomes important as multi-color LED luminaires replace high-pressure sodium and other lamp types with fixed spectral power distributions.

Similarly, for the purposes of this application, an occupancy or vacancy sensor 15 includes any electronic device that is capable of detecting movement of people, including but not limited to pyroelectric infrared sensors, ultrasonic sensors, video cameras, RFID tags, and security access cards.

Commercial daylight photosensors 10 or 100 may feature user-selectable sensitivity ranges that may be specified in foot-candles or lux (illuminance), watts/m2 (irradiance), or μmol/m2-sec (PPFD). Additionally, the photosensor may include a field of view which may be specified in degrees.

For the purposes of the present invention the spatial distribution of the photosensor sensitivity within its field of view, the spectral responsivity of the photosensor in the visible, infrared and ultraviolet portion of the electromagnetic spectrum, and the transfer function of the electrical output from the photosensor are germane. These device characteristics enable the present invention to more accurately simulate their performance, though the exclusion of one or more of these parameters will not prevent the system from functioning.

Daylight photosensors may be positioned within an interior environment (such as the ceiling of an open office) such that they measure the average luminance of objects (such as floors and desktops) within their field of view. Positioning of the photosensors may be to locate the photosensor away from direct sunlight. However, so-called "dual-loop" photosensors as disclosed in U.S. Pat. Nos. 7,781,713 and 7,683,301 may be positioned in for example skywells and skylights to measure both the average luminance of objects below and the direct sunlight and diffuse daylight incident upon the photosensors from above.

An alternative is to locate a daylight photosensor in each luminaire. In this example, the luminaire may be dimmed according to how much ambient light is detected by its photosensor.

Commercial occupancy and vacancy sensors 15 may employ pyroelectric, ultrasonic, or optical detection technologies, or a combination thereof. It can be difficult to accurately characterize the performance of these devices in enclosed spaces, as they may be influenced by the thermal emissivity of building materials for reflected far-infrared radiation and the acoustic reflectance of building materials for reflected ultrasonic radiation. In the present invention, occupancy sensors work best according to line-of-sight operation within their environments and in accordance with their sensitivity in terms of detection distance. Other motion detection techniques may also be employed.

Timers 20 or 110 may be implemented as external devices that are electrically or wirelessly connected to the building controller 45 or greenhouse controller 145, or they may be implemented within the hardware and software of said controller and accessed through the building controller's user interface 50 or greenhouse controller's user interface 150.

Personal lighting controls 25 may be implemented as for example handheld infrared or wireless remote controls or software programs executed on a desktop computer, a laptop computer, a smartphone, a personal digital assistant, or other computing device with a user interface that can be electrically or wirelessly connected to the building controller 45, including an Internet connection, on a permanent or temporary basis. The controls optionally enable the occupant or user to specify for example preferred illuminance levels in a specific area of the interior environment (such as, for example, an open office cubicle or private office), to control selected motorized blinds or electrochromic windows, to influence (such as, for example, by voting) the illuminance levels in a shared or common area of the interior environment, to specify minimum and maximum preferred illuminance levels, to specify the time rate of illumination level increase and decrease ("ramp rate" and "fade rate"), to specify time delays for occupancy sensor responses, and to specify individual time schedules.

Utility smart power meters 30 or 135 can provide real-time information on power consumption by buildings, in addition to information on variable power consumption rates that may change depending on the utility system load and policies. Such meters may be electrically or wirelessly connected to the building controller 45 or greenhouse controller 145, including an Internet connection.

Real-time weather report feeds 35 or 140 are widely available including on the Internet. These feeds can be connected to the building controller 45 or greenhouse controller 145 via a suitable electrical or wireless connection.

Geographic Information Systems (GIS) data available through various sources can additionally provide relevant environmental data, again using a feed connected to the build controller 45 or greenhouse controller 145 via a suitable electrical or wireless connection.

Temperature sensors 45 or 105 may be employed to measure room or space temperatures if such information is not available from an external HVAC controller or building automation system (not shown) in communication with building controller 45 or greenhouse controller 145.

Controller

In an embodiment, the building controller 45 or greenhouse controller 145 is a standalone hardware device, advantageously manufactured to the standards of standalone industrial computers to ensure continuous and reliable operation. It can however be implemented as a module of a larger building automation system.

In another embodiment, the building controller 45 or greenhouse controller 145 is comprised of a standalone hardware device, such as for example a communications hub, that is in communication with an external computing device, such as for example a centralized server, a networked remote computer system, or a cloud-based software-as-a-service.

The building controller may further comprise a user interface 50 and one or more communication ports 55 for communication with operators and external systems, including HVAC controllers, energy storage system controllers, building automation systems, and geographically remote devices and systems (not shown). Similarly, the greenhouse controller 145 may further comprise a user interface 150 and one or more communication ports 155 for communication with operators and external systems, including HVAC controllers, energy storage system controllers, building automation systems, and geographically remote devices and systems (not shown).

The operation of the building controller 45 or greenhouse controller 145 is as disclosed below following a description of the outputs.

Outputs

Referring to FIG. 1A, building controller 45 provides electrical signals to the dimmable or switchable luminaires 60 and optionally automated fenestration devices 65, such as for example motorized window blinds and electrochromic windows whose transmittance can be electrically controlled. Said electrical signals may include analog signals, such as for example the industry-standard 0-10 volt DC or 4-20 milliamp signals, and digital signals using a variety of proprietary and industry-standard protocols, such as DMX512 and DALI. The connections may be hard-wired using for example an RS-485 or derivative connection, an Ethernet connection, or a wireless connection, such as for example Bluetooth, Zigbee, 6LoWPAN, or EnOcean.

Referring to FIG. 1B, greenhouse controller 145 provides electrical signals to the dimmable or switchable luminaires 160, and optionally automated fenestration devices 165, such as for example motorized window blinds and electrochromic windows whose transmittance can be electrically controlled, in addition to optional humidity control devices 170 and carbon dioxide distribution devices 175. Said electrical signals may include analog signals, such as for example the industry-standard 0-10 volt DC or 4-20 milliamp signals, and digital signals using a variety of proprietary and industry-standard protocols, such as DMX512 and DALI. The connections may be hard-wired using for example an RS-485 or derivative connection, an Ethernet connection, or a wireless connection, such as for example Bluetooth, Zigbee, 6LoWPAN, or EnOcean.

Controller Operation

Figure 2:
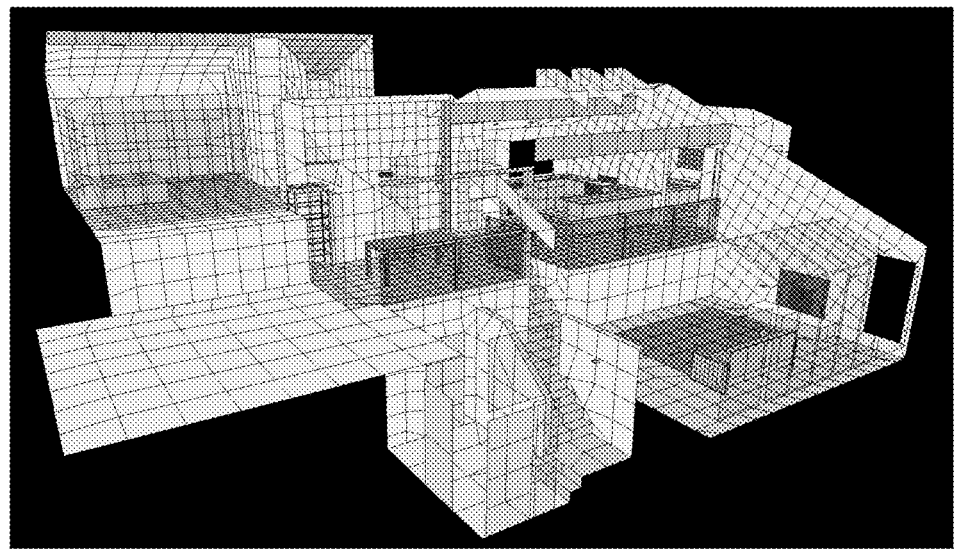
FIG. 2 shows an example of a finite element representation of a combined interior and exterior environment.

In one embodiment, the building controller 45 or greenhouse controller 145 maintains or accesses a three-dimensional finite element representation of the exterior and interior environments, such as is shown for example in FIG. 2. The representation is comprised of a set of geometric surface elements with assigned surface properties such as reflectance, transmittance, and color, and one or more electric light sources ("luminaires") with assigned photometric data, such as luminous intensity distribution. For the purposes of solar insolation analysis, thermal emissivity and heat capacity properties may also be included.

Radiative flux transfer or ray tracing techniques can be used to predict the distribution of luminous flux or spectral radiant flux emitted by the luminaires within the interior environment due to interreflections between surface elements, as disclosed in for example U.S. Pat. No. 4,928,250. An example of a commercial lighting design and analysis software products that employs such techniques is AGi32 as manufactured by Lighting Analysts Inc. (Littleton, Colo.). As disclosed by U.S. Pat. No. 4,928,250, said techniques apply to both visible and invisible radiation, including the distribution of infrared radiation due to solar insolation.

For daylighting analysis, the representation of the exterior environment may include other buildings and topographical features that may occlude direct sunlight and diffuse daylight from entering the windows and openings of the interior environment. Similarly, said buildings and topographical features may reflect direct sunlight and diffuse daylight into the interior environment via the windows and openings.

In a rural setting, for example, the site topography may be extracted from a geographic information system and represented as a set of finite elements. In an urban setting, the geometry and material properties of nearby buildings may be extracted from a series of photographs, such as are available for example from Google Street View.

Exterior Environments

For exterior environments, the light sources are direct solar irradiance and diffuse irradiance from the sky dome. Given the direct normal and diffuse horizontal irradiance measurements for a given time of day and Julian date, and the geographical position of the site in terms of longitude and latitude, the Perez Sky or similar mathematical model may be used to accurately estimate the distribution of sky luminance for any altitude and azimuth angles. The irradiance measurements may be made in situ or derived from historical weather data such as from the Typical Meteorological Year (TMY) database for the nearest geographic location. (Infrared direct normal and diffuse horizontal irradiance measurements are also often available.)

The Perez sky model does not include spectral power distributions for daylight. However, a validated extension to the Perez sky model that includes the ability to model ultraviolet radiation can be used to predict daylight spectral power distributions.

The Perez sky model also does not include the effects of low-level atmospheric phenomena, including naturally-occurring fog, dust, and man-made smog, on direct solar irradiance and diffuse irradiance from the sky dome and the spectral power distribution of daylight. However, additional mathematical models, historical weather data, and in situ measurements can be used to account for these effects.

Typical Meteorological Year (TMY3) database records also provide hourly readings for cloud coverage, dry-bulb temperature, dew-point temperature, relative humidity, wind direction, and wind speed, and other information that can be incorporated into the simulation modeling for greenhouse controllers.

Using radiative flux transfer techniques, the distribution of luminous or spectral radiant flux due to direct sunlight and diffuse daylight within the exterior environment can be predicted. In an embodiment, the sky dome is divided into a multiplicity of horizontal bands with equal altitudinal increments. Each band is then divided into rectangular "sky patches" at regular azimuthal increments such that each patch has roughly equal area. An example of such a division that yields 145 patches is commonly referred to as the Tregenza sky dome division. A preferred division however may be obtained by recursive subdivision of an octahedron to yield 256 approximately equal-area patches.

In the same embodiment, the daily solar path across the sky dome throughout the year is similarly divided into a multiplicity of bands that parallel the solar path for selected dates, such as for example December 21, February 01/November 09, February 21/October 21, March 09/October 5, March 21/September 21, April 6/September 7, April 21/August 21, May 11/August 04, and June 21. The multiplicity of bands will span 47 degrees, regardless of the site latitude. Each band is then divided into rectangular "solar patches" at regular time intervals (for example, one hour) such that each patch has roughly equal area. A subdivision with for example nine bands and one-hour intervals will be comprised of 120 solar patches.

In one embodiment, spectral radiant flux is represented as three or more separate color bands that are identified for example as "red," "green," and "blue" in correspondence with their perceived colors, and is commonly practiced in the field of computer graphics. In another embodiment, more color bands may be employed. For example, the spectral responsivity of daylight photosensors may extend from ultraviolet to infrared wavelengths. It may therefore be advantageous to represent spectral radiant flux as for example 50 nanometer-wide color bands from 300 nm to 1200 nm. In yet another embodiment, a single radiant flux value may suffice, such as for example to represent infrared radiation for solar insolation analysis.

For greater accuracy in representing the sky dome luminance distribution, a sky dome division may alternately be chosen such that the differences between adjacent patch luminances are minimized. For example, the sun will traverse a 47-degree wide band of the sky dome over a period of one year. Smaller patches within this band may be employed to more accurately represent the sky dome luminance for any given time and Julian date.

According to prior art as implemented for example by AGi32, each sky dome patch represents an infinite-distance light source that illuminates the exterior environment with a parallel light beam whose altitudinal and azimuthal angles are determined by the patch center, and whose luminous intensity is determined by the Perez sky model. (Other sky models, such as the IES and CIE Standard General Sky, may also be employed to predict the sky dome's spatial luminance distribution.) Similarly, each solar patch represents an infinite-distance light source that illuminates the exterior environment with a parallel light beam whose altitudinal and azimuthal angles are determined by the patch center, and whose luminous intensity is determined by the Perez sky model. Once the luminous flux contributions from the direct sunlight and diffuse daylight have been calculated and summed, radiative flux transfer techniques such as those disclosed in U.S. Pat. No. 4,928,250 can be employed to calculate the distribution of luminous or spectral radiant flux due to interreflections between surface elements in the exterior environment.

For greenhouse applications, it is also possible to model crop canopies for use with radiative flux transfer techniques such as those disclosed in U.S. Pat. No. 4,928,250. Such models can be updated as the greenhouse crops grow and mature.

As will be known to those skilled in the arts of thermal engineering or computer graphics, each surface element in the finite element representation is assigned a parameter representing the luminous or spectral radiant flux that it has received but not yet reflected and/or transmitted (the "unsent flux"), and another parameter representing its luminous or spectral radiant exitance. (Infrared and ultraviolet radiant flux and exitance may also be considered without loss of generality.) At each iteration of the radiative flux transfer process, the unsent flux from a selected element is transferred to all other elements visible to that element. Depending on the reflectance and transmittance properties of each element, some of the flux it receives is reflected and/or transmitted; the remainder is absorbed. The flux that is not absorbed is added to both its unsent flux and luminous exitance parameters. The total amount of unsent flux thus decreases at each iteration, and so the radiative flux transfer process converges to a "radiosity" solution, wherein the luminous exitance or spectral radiant exitance of every surface element is known.

Canonical Radiosity

In a novel contribution of the present invention, this approach is extended by assigning a multiplicity of 'n' unsent flux parameters and 'n' luminous or spectral radiant exitance parameters to each exterior environment element, where 'n' is the total number of sky and solar patches. Each sky patch and solar patch 'i' is assigned unit luminance or spectral radiance, and its contribution to the luminous or spectral radiant flux of each exterior element is saved in its 'i'th unsent flux and luminous or spectral radiant exitance parameters.

Once the luminous or spectral radiant flux contributions from the diffuse daylight (but not direct sunlight) have been calculated, radiative flux transfer techniques can be employed to calculate the distribution of luminous or spectral radiant flux due to interreflections between surface elements in the exterior environment for each sky and solar patch. The result is the generation of 'n' separate radiosity solutions for the exterior environment. Because the sky and solar patch luminances were not considered, these are referred to as 'canonical' radiosity solutions.

A particular advantage of this approach is that approximately 95 percent of the computational time needed to calculate the distribution of luminous flux due to interreflections between surface elements is devoted to calculating the "form factors" (i.e., geometric visibility) between elements, as disclosed in U.S. Pat. No. 4,928,250. Thus, if the prior art approach requires 'x' amount of time to calculate a single radiosity solution, the present approach requires 'x'+'y' time, where 'y' is typically less than five percent. (The remainder of the computational time is consumed by other "housekeeping" activities related to manipulating the geometric and material data.)

Once the 'n' canonical radiosity solutions have been calculated, the radiosity solution for any sky luminance distribution for a specified time and date can be calculated as a weighted sum of the canonical radiosity solutions, where the weights are the luminances of the associated sky and solar patches as predicted by the chosen sky model. Such solutions may be calculated in milliseconds, as opposed to minutes to hours for prior art approaches.

The present invention employs an approach wherein the solar altitudinal and azimuthal angles are used to determine the altitudinal and azimuthal angles of the four closest solar patch centers. The radiosity solution for the direct sunlight is then calculated as the weighted sum of the four canonical radiosity solutions for these patches, with the weights being the luminous intensities of the direct sunlight at the respective altitudinal and azimuthal angles.

Geometry Simplification

A disadvantage to assigning one or a multiplicity of 'n' unsent flux parameters and 'n' luminous or spectral radiant exitance parameters to each environment element, where 'n' is the total number of sky and solar patches, is that complex environments with tens or hundreds of thousands of polygonal elements may require excessive amount of memory. To address this issue, selected objects comprised of many elements (such as, for, example, furniture in an office) may be represented by geometrically simplified objects with fewer elements for the purposes of canonical radiosity calculations.

In a preferred embodiment, the elements of a selected object are first inserted into an octree or similar spatial subdivision data structure. The intersection of the object surface elements with the octree node edges are then determined.

A simplified geometric representation consisting of possibly disjoint triangles is then constructed from the octree data structure using the well-known "marching cubes" algorithm. There are many variations on the algorithm that attempt to address deficiencies in the original algorithm disclosed in U.S. Pat. No. 4,710,876, "System and Method for the Display of Surface Structures Contained within the Interior Region of a Solid Body".

A disadvantage of the marching cubes algorithm is that while it reduces the geometric complexity of objects, it still tends to generate many small triangular elements on the scale of the dimensions of the octree nodes. It is therefore necessary to perform further geometric simplification of the resultant object by merging nearly coplanar triangular elements into larger polygonal elements.

In one embodiment, after the canonical radiosity calculations have been performed using the simplified geometric objects, it is necessary to determine the radiosity solution for any sky luminance distribution for a specified time and date that includes the original object geometry. This can be accomplished by using various well-known "final gather" techniques commonly used in global illumination methods.

Figure 17:
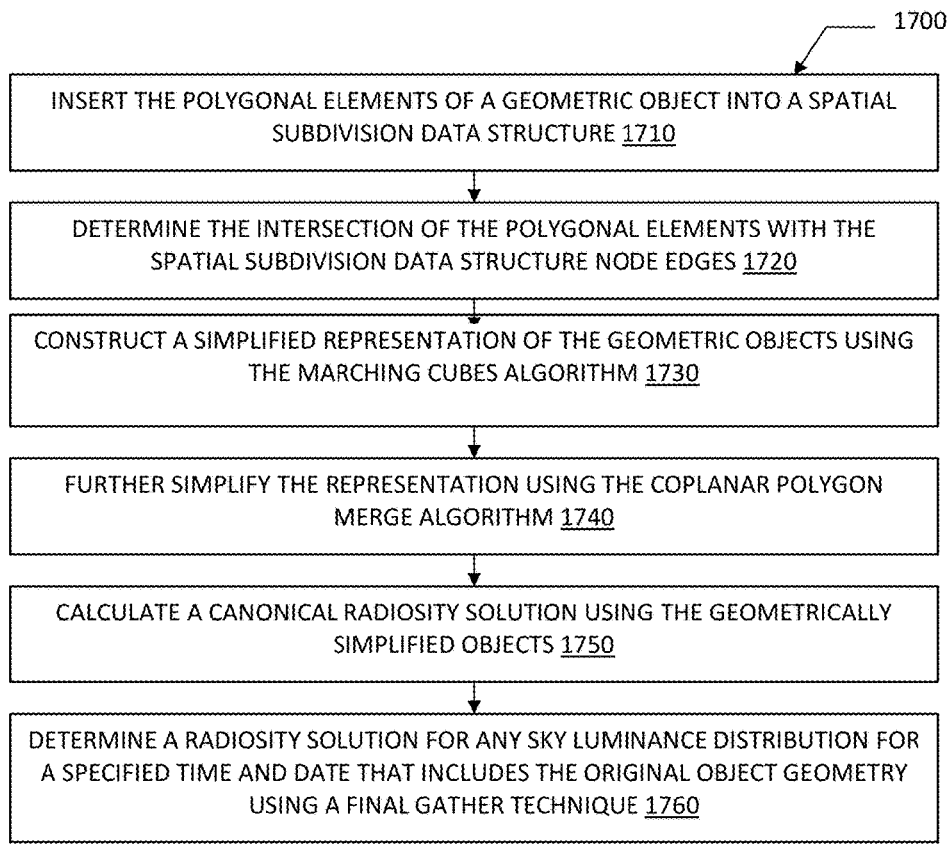
FIG. 17 is a flowchart depicting a method of geometric simplification using the marching cubes method.

Referring to FIG. 17, the method comprises: inserting the polygonal elements of a geometric object into an octree or similar spatial subdivision data structure (Step 1710); determining the intersection of the polygonal elements with the octree node edges (Step 1720); constructing a simplified representation of the geometric object using the marching cubes algorithm (Step 1730); further simplifying the representation using the coplanar polygon merge algorithm (Step 1740); calculating a canonical radiosity solution using the geometrically simplified objects (Step 1750); and determining a radiosity solution for any sky luminance distribution for a specified time and date that includes the original object geometry using a final gather technique (Step 1760).

In another embodiment, the vertices of the elements of a selected object are sorted according to their Morton codes to define a set of leaf nodes with error quadrics. (As will be known to those skilled in the art, Morton codes map three-dimensional vertex coordinates into a one-dimensional array whose ordering is equivalent to the depth-first traversal of an octree.) The cumulative sum of these Morton codes, termed a Morton integral, is then used to construct a k-d tree that is equivalent to a bounding volume hierarchy spatial subdivision data structure. This tree is then traversed using the error quadrics for each internal node to obtain an adaptive cut that represents the vertices of a simplified geometric object representative of the selected object, with the vertices remeshed to form the object surfaces.

Figure 18:
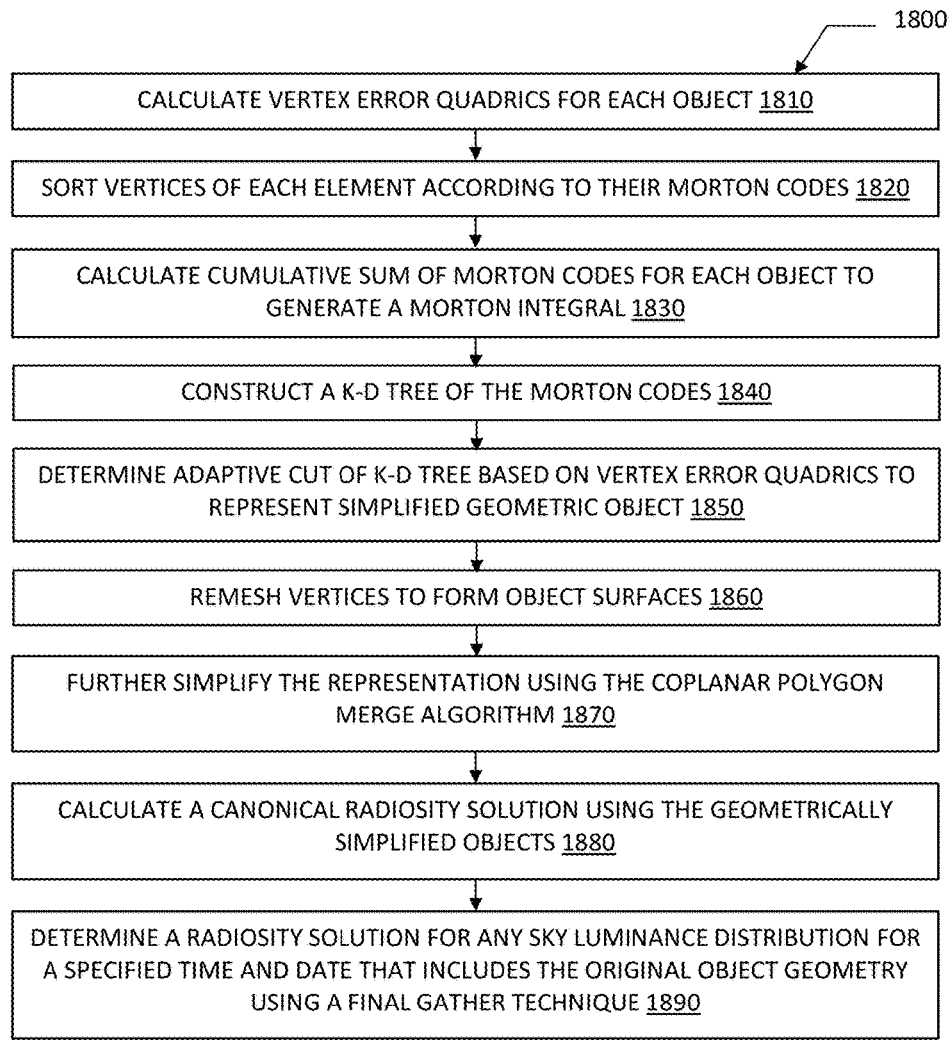
FIG. 18 is a flowchart depicting a method of geometric simplification using Morton codes and adaptive cuts of k-d trees.

Referring to FIG. 18, the method comprises: calculating the vertex error quadrics for each object (Step 1810); sorting the vertices of each element according to their Morton codes (Step 1820); calculating the cumulative sum of the Morton codes for each object to generate a Morton integral (Step 1830); constructing a k-d tree of the Morton codes and their associated vertices (Step 1840); determining an adaptive cut of the k-d tree based on the vertex error quadrics as a representation of the vertices of the simplified geometric object (Step 1850); remeshing the vertices to form object surfaces (Step 1860); further simplifying the representation using the coplanar polygon merge algorithm (Step 1870); calculating a canonical radiosity solution using the geometrically simplified objects (Step 1880); and determining a radiosity solution for any sky luminance distribution for a specified time and date that includes the original object geometry using a final gather technique (Step 1890).

Virtual Photosensors

A disadvantage of the radiative flux transfer techniques is that while the radiosity solution may provide the luminance and approximate spectral radiant exitance at any selected point on a surface element, it is computationally expensive to measure the illuminance at an arbitrary position and orientation in the virtual environment, such as would be performed with a photometer in a physical environment. The calculations become prohibitively expensive when hundreds of meter positions must be calculated for climate-based annual daylight metrics such as spatial Daylight Autonomy (sDA) and Annual Sunlight Exposure (ASE), where the meters are typically positioned 0.6 meters above the floor.

In another novel contribution of the present invention, a virtual photosensor is modeled as a transparent surface element with a finite area. As previously described and in accordance with U.S. Pat. No. 4,928,250, each iteration of the radiative flux transfer process transferred unsent flux from a selected light source or surface element to all other elements visible to that light source or element. However, each iteration then continues by transferring the same unsent flux to all photosensor elements visible to that light source or element. The photosensor elements record the flux they have received, but in being transparent they do not absorb or reflect any of the flux. Once the radiative flux transfer process has converged to a solution, the photosensors have measured the incident spectral radiant flux and hence illuminance without participating in the radiative flux transfer process.

Transition Surfaces

Figure 3:
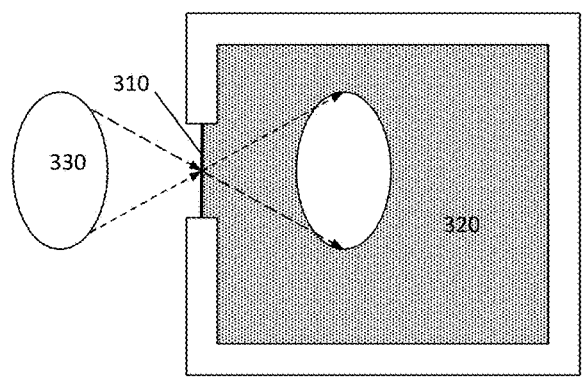
FIG. 3 shows the transfer of luminous flux from exterior environment elements through a window or opening to interior environment elements.

A disadvantage of representing diffuse daylight as n' separate infinite-distance light sources that emit parallel beams of light is that the discrete nature of the beams becomes evident when projected through small windows and openings separating the exterior environment from the interior environment (FIG. 3). These parallel beams tend to produce visible "spokes" of light patterns on the interior surfaces. Worse, they may contribute to errors in the subsequent radiative flux transfer calculations for the interior surface elements.

A prior art solution as implemented for example by AGi32 is to use a virtual camera to capture a hemispherical ("fish-eye") image of the exterior environment 300 as seen from the center of each window or opening 310 (referred to as a "transition" surface) or portion thereof (As will be understood by one skilled in the art, a virtual camera generates a two-dimensional image of the virtual three-dimensional environment in the same manner as a digital camera would capture an image of the equivalent physical environment.) One method of capture utilizes a "hemicube" or similar geometric construct as disclosed in U.S. Pat. No. 4,928,250. This image is then projected from said center into the interior environment 320. Each pixel of the virtual image projects the average luminance or spectral radiant exitance of the exterior elements it represents onto the interior elements, thereby effecting radiative flux transfer. (A portion of the luminous flux or spectral radiant flux may be absorbed or reflected by a window surface.)

It is evident that each pixel of the virtual image represents a ray of luminous or spectral radiant flux emanating from the exterior environment that intersects the window or opening at the position of the virtual camera before transitioning into the interior environment. It is further evident that the angle of incidence θ between said ray and the window surface normal can be precalculated. The reduction in transmitted flux (that is, the specular transmission coefficient) through a transparent window (glass, plastic, or more generally a dielectric material) due to Fresnel reflection can therefore be calculated on a per-pixel basis according to Schlick's approximation to the Fresnel equations:

$$T(\theta)=1-R(\theta)=1-(R_0+(1-R_0)(1-\cos(\theta))^5) \quad (1)$$

where $R_0$ is the surface reflectance at normal incidence (i.e., θ=0).

In cases where the dimensions of the window or opening are large with respect to the dimensions of the interior environment, it is advantageous to spatially divide the window or opening into one or a multiplicity of subareas called "patches," with the virtual camera (hemicube) positioned at the center of each patch.

A disadvantage of this approach is that the images project only luminous or spectral radiant flux. In order to project the luminous or spectral radiant flux distribution of the exterior environment into the interior environment for each of the 'n' canonical radiosity solutions, it would be necessary to repeat the transfer process 'n' times for each transition surface. This process involves calculating the form factors of all of the exterior and interior environment elements visible from the transition surface, which as previously noted is computationally very expensive.

The present invention avoids this computational expense by first assigning a unique identifier to every finite element in the exterior and interior environments, then transferring the exterior environment element identifiers associated with each pixel rather than their average luminance or spectral radiant exitance. When these pixels are "projected" onto the interior environment elements, it is possible to access the 'n' luminance or spectral radiant exitance values assigned to each exterior environment element through their assigned identifiers. In this manner, the 'n' radiosity solutions for the exterior environment can be transferred to the interior environment without any significant computational burden.

The 'n' luminance or spectral radiant exitance values assigned to each exterior environment element through their assigned identifiers may be considered attributes of the exterior environment elements. Without loss of generality, any set of element attributes may be accessed through their assigned identifiers and transferring them to their corresponding interior environment elements.

The process of accessing the 'n' luminance or spectral radiant exitance values assigned to each exterior environment element and transferring them to its corresponding interior environment element is computationally expensive in that the volume of data typically exceeds the cache size of current-generation CPUs. The inevitable cache misses result in excessive memory bus traffic and poor CPU utilization, particularly for large environments with hundreds of transition surfaces and thousands of thousands of transition surface patches.

Image capture and projection utilizing a hemicube or similar geometric construct utilizes the well-known Z-buffering technique wherein the distance from the virtual camera to each pixel (representing a point on the surface of an opaque geometric element) is stored in a two-dimensional "depth buffer" (also known as a "Z-buffer"), along with the element identifier. Each opaque geometric element is scanned using well-known scanline techniques separately; if another surface point scans to the same pixel, the distance of the closer element and its identifier are stored in the buffer pixel.

In a preferred embodiment, each transition surface is subdivided into one or more patches, as disclosed herein. Assuming that a given transition surface is comprised of 'n' patches, a depth buffer is temporarily assigned to the surface for the purpose of transferring element identifiers, and its pixels randomly assigned integer "patch identifiers" in the range of 1 to 'n'.

Figure 12:
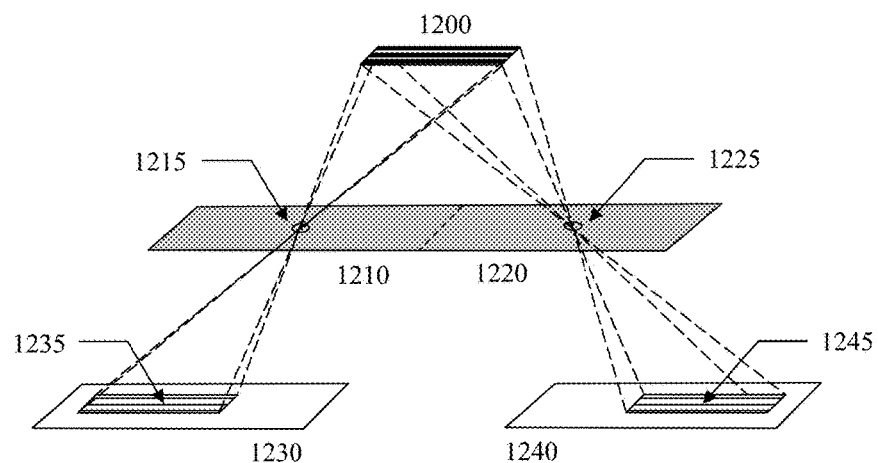
FIG. 12 shows the projection of two virtual images with randomly selected pixels onto a single depth buffer.

Referring to FIG. 12, a transition surface comprised of two patches 1210 and 1220 is shown wherein each patch is assigned a patch identifier. Virtual images 1230 and 1240 of an element 1200 in the exterior environment are then captured with the virtual camera (not shown) positioned at transition surface patch centers 1215 and 1225 respectively, As each exterior element is scanned, each of its pixels is compared with the corresponding depth buffer pixel only if the patch identifier matches that of the randomly assigned depth buffer pixel. The exterior element 1200 is thereby represented in virtual images 1230 and 1240 by the set of pixels 1235 and 1245 respectively.

Figure 13:
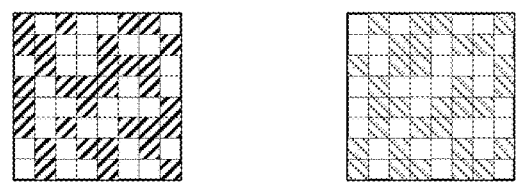
FIG. 13 shows the merger of two virtual images into a single virtual image.
Figure 13:
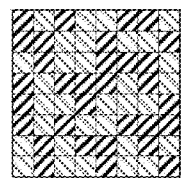

After the set of 'n' transition surface patches have been processed, the depth buffer will contain the equivalent of 'n' virtual images (one per patch). Each pixel position is then assigned a random number between 1 and 'n' such that each pixel position is unique to one of the 'n' images. In FIG. 13, for example, two virtual images 1300 and 1310 consisting of 64 pixels each have had their pixels randomly but exclusively chosen and combined in depth buffer image 1320.

Figure 14:
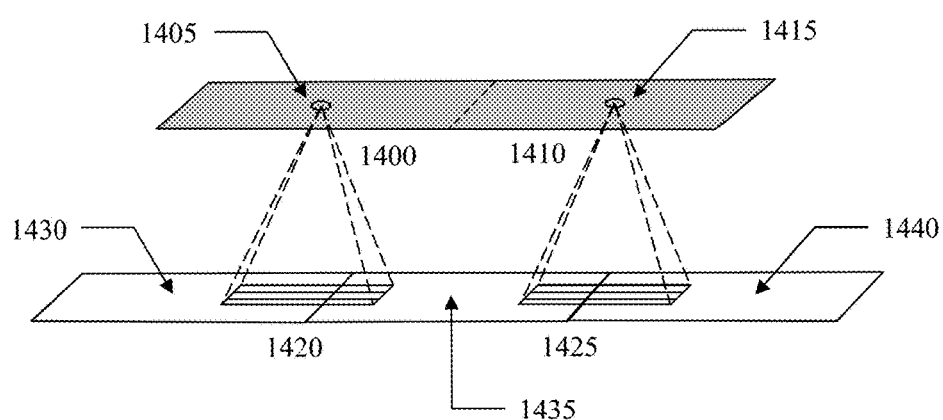
FIG. 14 shows the projection of a single virtual image through two patches onto interior elements.

These interspersed images are then projected onto the interior environment from each of the 'n' patch centers. Referring, for example, to FIG. 14, an interspersed depth buffer image is projected from patch centers 1405 and 1415 respectively of patches 1400 and 1410 onto elements 1430, 1435, and 1440 of the interior environment.

Figure 15:
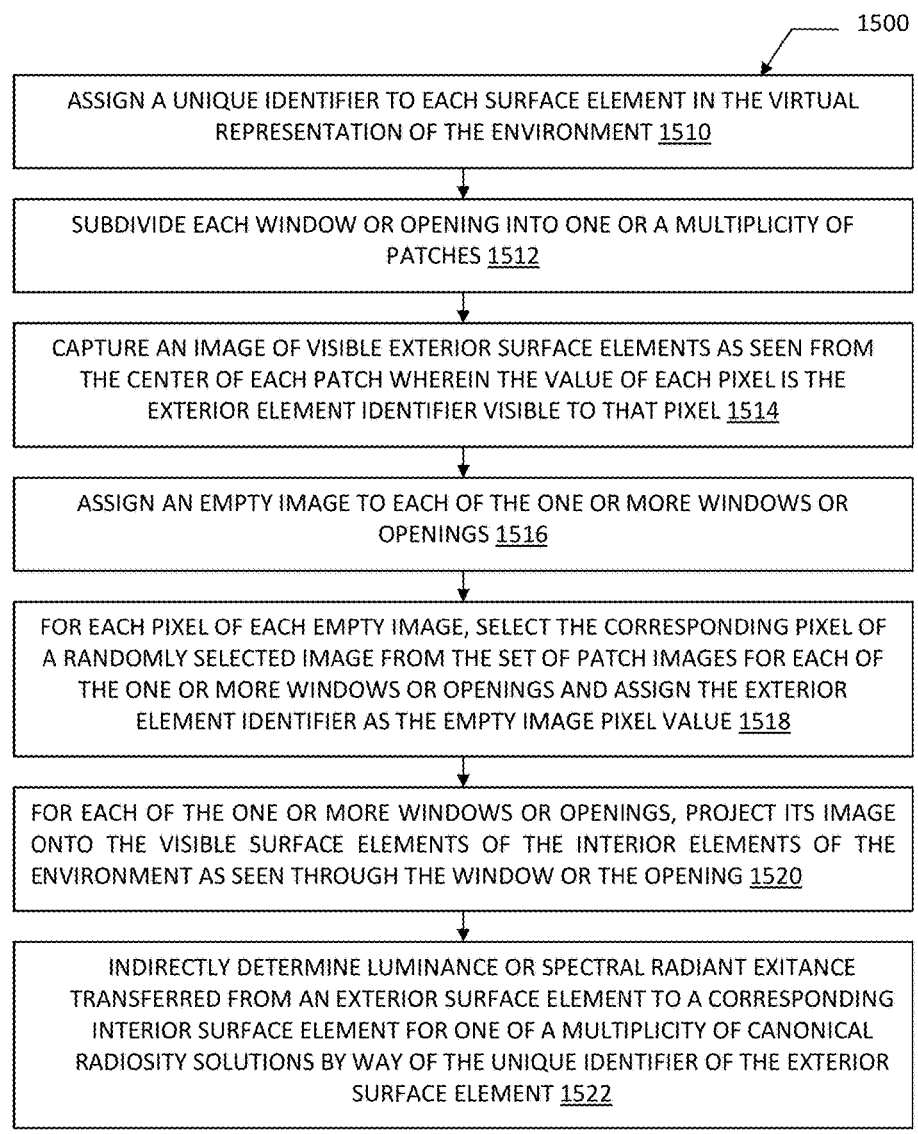
FIG. 15 is a flowchart depicting a method of transferring element identifiers through a transition surface.

Referring to FIG. 15, the method comprises: assigning a unique identifier to each surface element in the virtual representation of the environment (Step 1510); subdividing each window or opening into one or a multiplicity of patches (Step 1512); capturing an image of visible exterior surface elements as seen from the center of each patch of the one or more windows or openings, wherein the value of each pixel is the exterior element identifier visible to that pixel (Step 1514); assigning an empty image to each of the one or more windows or openings (Step 1516); for each pixel of each empty image, selecting the corresponding pixel of a randomly selected image from the set of patch images for each of the one or more windows or openings and assigning the exterior element identifier as the empty image pixel value (Step 1518); for each of the one or more windows or openings, projecting its image onto the visible surface elements of the interior elements of the environment as seen through the window or the opening (Step 1520); and indirectly determining luminance or spectral radiant exitance transferred from an exterior surface element to a corresponding interior surface element for one of a multiplicity of canonical radiosity solutions by way of the unique identifier of the exterior surface element (Step 1522).

In a preferred embodiment, the distance between the window patch centers and the nearest interior elements is greater than approximately twice the distance between adjacent patch centers. If this condition cannot be satisfied, then it is advantageous to further subdivide the transition surface into smaller patches such that the condition is satisfied.)

As previously noted, each pixel of the virtual image represents a ray of luminous or spectral radiant flux emanating from the exterior environment that intersects the window or opening at the position of the virtual camera before transitioning into the interior environment, irrespectively of whether the flux is represented directly or indirectly by means of element identifiers. Suppose the image has 'm' pixels; by choosing to randomly select pixels from 'n' virtual images for capture and projection, the above is equivalent to employing m/n rays for each transition surface patch.

The advantage of this embodiment is that the exterior element identifiers are projected through the transition surfaces onto the interior environment once per transition surface rather than once per transition surface patch. Compared to the process of accessing the 'n' luminance or spectral radiant exitance values assigned to each exterior environment element and transferring them to its corresponding interior environment element, the process of capturing and projecting virtual images is computationally inexpensive, especially if it is implemented in hardware using one or more graphics processor units (GPU). The computational expense of accessing luminance or spectral radiant exitance values is thereby reduced by a factor of 'p', where 'p' is the average number of patches per transition surface for the environment.

This preferred embodiment is particularly useful for environments that include a large number of glazed surfaces (or example, greenhouses). It is also useful for calculating spatial Daylight Autonomy (sDA) and Annual Sunlight Exposure (ASE) metrics, which require windows to be subdivided into patches no larger than 0.3 m×0.3 m.

A "half-space" may be defined as the three-dimensional space divided by the plane of the transition surface that includes either the exterior environment or the interior environment, while a "direction" is uniquely defined by two orthogonal direction coordinates (for example, a vertical angle $\theta$ and a horizontal angle $\varphi$ in a polar coordinates system) in the half-space, and a "position" is uniquely defined by two orthogonal position coordinates (for example, 'x' and 'y' in a Cartesian coordinate system).

A virtual camera may be used that has a defined position on the transition surface, while each ray corresponding to a pixel of a virtual image has a defined direction within the exterior environment. Thus, each ray is uniquely defined by its coordinates in a four-dimensional space comprised of two direction coordinates and two position coordinates.

Each ray position may be chosen from anywhere on the transition surface. The position may be chosen from a grid of positions (corresponding, for example, to the center of each transition surface patch), or randomly such that the set of positions is uniformly distributed across the transition surface. (If the transition surface has been adaptively subdivided in accordance with the nearest exterior or interior elements, then the set of positions may be randomly chosen such that approximately the same number of positions are chosen from each patch.)

Each ray may be traced from its position on the transition surface in the given direction to the closest exterior environment element, whereupon it is assigned the exterior environment identifier. The ray is then traced from its position on the transition surface in the opposite direction (that is, into the half-space defined by the transition surface and the interior environment) to the closest interior environment element, whereupon the exterior environment element identifier as an attribute to the interior environment element.

Figure 16:
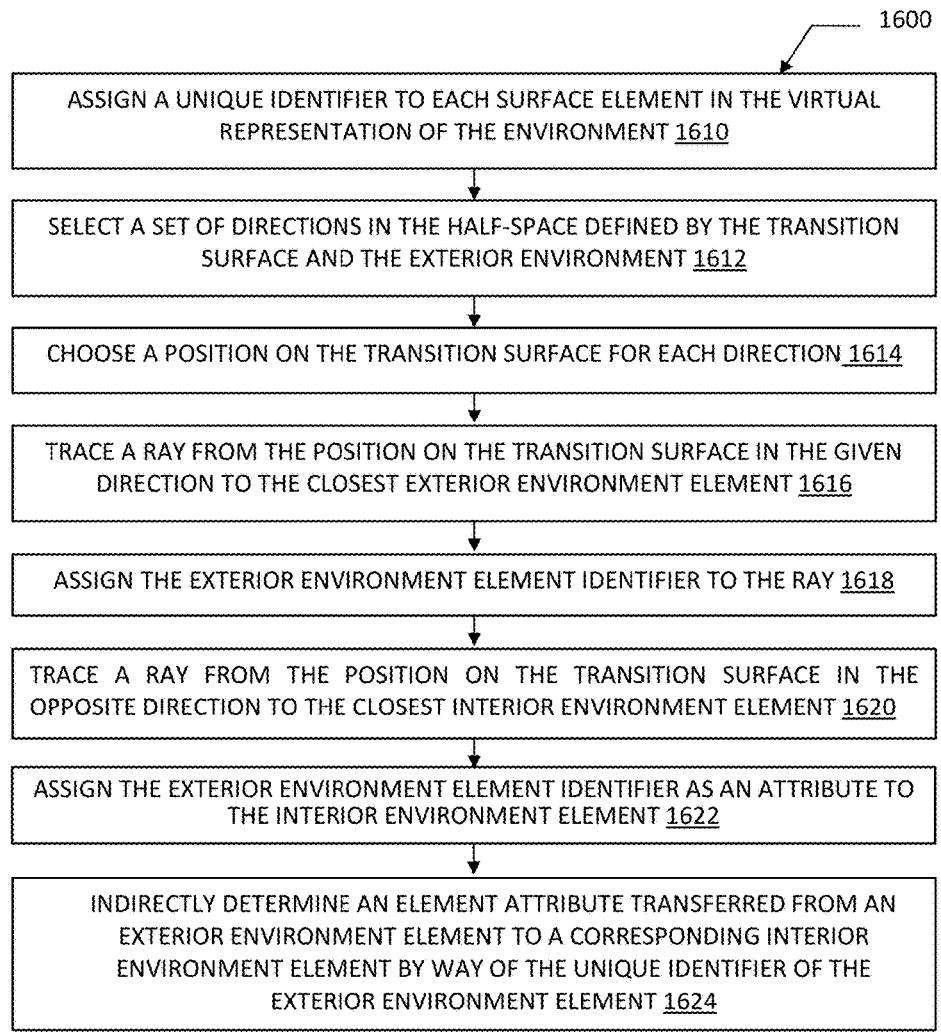
FIG. 16 is a flowchart depicting another method of transferring element identifiers through a transition surface.

Referring to FIG. 16, the method may comprise: assigning a unique identifier to each element in the virtual representation of the exterior and interior environments (Step 1610); selecting a set of directions in the half-space defined by the transition surface and the exterior environment (Step 1612); choosing a position on the transition surface for each direction (Step 1614); tracing a ray from the position on the transition surface in the given direction to the closest exterior environment element (Step 1616); assigning the exterior environment element identifier to the ray (Step 1618); tracing a ray from the position on the transition surface in the opposite direction to the closest interior environment element (Step 1620); assigning the exterior environment element identifier as an attribute to the interior environment element (Step 1622); and indirectly determining an element attribute transferred from an exterior environment element to a corresponding interior environment element by way of the unique identifier of the exterior environment element (Step 1624).

The above approaches assume that the windows are fully transparent. Recent advances in daylight control for high performance buildings have however introduced glazing systems with complex bidirectional scattering distribution functions (BSDFs), including light redirecting materials such as frits, ground glass, opal glass and plastics, prismatic glass and plastics, holographic films, diffraction gratings, and Fresnel lens arrays. The BSDFs may be spectrally neutral or (particularly with holographic and diffraction gratings) spectrally dependent.

In particular, the BSDFs of opal glass and plastics, which are comprised of a dispersion of colloidal particles with a refractive index significantly different from that of the matrix material, are determined mostly by Tyndall scattering, wherein the degree of scattering is a function of the fourth power of the wavelength of the incident light. Thus, while visible light with wavelengths of 400 nm to 700 nm may be subject to approximately the same degree of scattering, infrared radiation with wavelengths of 1 to 10 microns will be subject to significantly less scattering.

To address such systems, it is noted that such glazing systems both redirect and scatter the incident flux. Thus, rather than simply projecting a captured virtual image into the interior environment, each pixel can be assigned a scattering distribution function that describes how an incident ray with given altitudinal and azimuthal angles corresponding to the pixel will be scattered. These functions can be compactly represented using spherical and hemispherical harmonics, wavelets, radial basis functions, and other two-dimensional signal compression techniques as will be known to those skilled in the art of image compression. The BSDF function coefficients may be measured or calculated from virtual representations of the glazing systems.

Numerous bidirectional reflectance distribution function (BRDF) models have been developed for computer graphics applications. Their primary intent is to generate photorealistic reflections from glossy surfaces in computer games, architectural renderings, and computer graphics animations. For the purposes of daylight simulations, however, it is essential that the BRDF (or more generally, BSDF) model is energy conservative.

A BSDF model is energy conservative if no more light can be reflected from a point on a surface than the amount of light incident on that point. Many models include in their formulation a normalization factor—different for each model—that is necessary to ensure energy conservation as the model parameters are changed.

Figure 19:
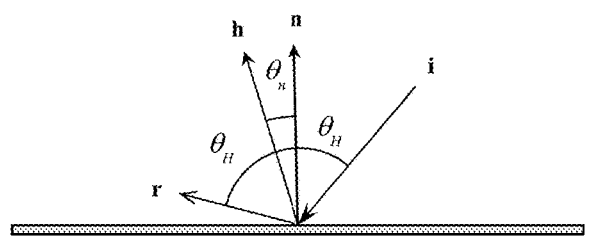
FIG. 19 illustrates the geometry of a glossy reflection.

A widely-used BRDF model for representing glossy reflections from opaque materials such as plastic is the Blinn-Phong model, and defined mathematically as:

$$L_r(i,r) = R(n \cdot h) \qquad (2)$$

where in FIG. 19, i is the incident light vector, r is the reflected light vector, R is the diffuse reflectance of surface, m is the Blinn-Phong exponent, n is the surface normal, $$h = \frac{i+r}{|i+r|}$$

is the normalized half-vector between the incident and reflected light vectors, and $L_r(i,r)$ is the reflected luminance (assuming an incident ray with unit luminance). The reflection from the material surface is fully diffuse for m=0, but becomes increasingly specular with increasing m, and becomes fully specular for m=∞.

An equivalent formulation of the Blinn-Phong model is, again in reference to FIG. 19:

$$L_r(i,r) = R(\cos \theta_n)^m \qquad (3)$$

where $\theta_n$ is the angle between the surface normal n and the normalized half-vector h.

Unfortunately, the Blinn-Phong BRDF model is not energy conservative. In order to ensure that the total amount of light remains constant as the Blinn-Phong exponent m is varied, it is necessary to add a multiplicative normalization term. A common formulation is:

$$L_r(i, r) = \frac{m+8}{8\pi} R(n \cdot h)^m \qquad (4)$$

This is known, however, to be an approximation suitable for computer graphics applications only. As such, it is not suitable for use with daylight simulation programs.

To determine the exact normalization term, the total amount of light Φ reflected from the surface is determined by integrating the reflected luminance $L_r(i,r)$ over the hemisphere:

$$\Phi = \int_\omega (\theta, \phi) \cos \theta \, d\omega \qquad (5)$$

which, expressed in spherical coordinates, is:

$$\Phi = \int_0^{2\pi}\int_0^{\pi/2} L(\theta,\phi)\cos\theta \sin\theta\, d\theta\, d\phi \tag{6}$$

If the incident light is perpendicular to the surface, the reflected luminance L is independent of $\phi$ and we have $\theta$ being the angle between the reflectance vector r and the surface normal n, which means that $\theta_n = \theta/2$. Thus:

$$\Phi = 2\pi R \int_0^{\pi/2} \left(\cos\left(\frac{\theta}{2}\right)\right)^m \cos\theta \sin\theta\, d\theta \tag{7}$$

Using the half-angle formula $$\cos\left(\frac{\theta}{2}\right) = \sqrt{(1+\cos\theta)/2}$$

and the substitution $t = \cos\theta$ (which gives $dt = -\sin\theta d\theta$), we have:

$$\Phi = 2\pi R\left(-\int_1^0 \left(\sqrt{\frac{1+t}{2}}\right)^m t\, dt\right) = 2\pi R \int_0^1 \left(\frac{1+t}{2}\right)^{m/2} t\, dt \tag{8}$$

which can be evaluated using integration by parts (that is, $$\int u\, dv = uv = -\int v\, du) \text{ using } u = \left(\frac{1+t}{2}\right)^{m/2}$$

and $v = t$, and by removing the constant reflectance R, we have:

$$2\pi\left(\left[\frac{4}{m+2}t\left(\frac{1+t}{2}\right)^{(m+2)/2}\right]_{t=0}^1 - \frac{4}{m+2}\int_0^1\left(\frac{1+t}{2}\right)^{(m+2)/2}dt\right) = \tag{9}$$

$$\frac{8\pi}{m+2}\left(\left[t\left(\frac{1+t}{2}\right)^{(m+2)/2}\right]_{t=0}^1 - \frac{4}{m+4}\left[\left(\frac{1+t}{2}\right)^{(m+4)/2}\right]_{t=0}^1\right) =$$

$$\frac{8\pi}{m+2}\left[\cos\theta\cos\left(\frac{\theta}{2}\right)^{m+2} - \frac{4}{m+4}\cos\left(\frac{\theta}{2}\right)^{m+4}\right]_{\theta=\pi/2}^0 =$$

$$\frac{8\pi\left[\cos\left(\frac{\theta}{2}\right)^{m+2}\left(4\left(\cos\left(\frac{\theta}{2}\right)\right)^2 - (m+4)\cos\theta\right)\right]_{\theta=0}^{\pi/2}}{(m+2)(m+4)} =$$

$$\frac{8\pi\left[\cos\left(\frac{\theta}{2}\right)^{m+2}(2(1+\cos\theta) - (m+4)\cos\theta)\right]_{\theta=0}^{\pi/2}}{(m+2)(m+4)} =$$

$$\frac{8\pi\left[\cos\left(\frac{\theta}{2}\right)^{m+2}(2 - (m+2)\cos\theta)\right]_{\theta=0}^{\pi/2}}{(m+2)(m+4)} =$$

$$\frac{8\pi[2^{1-((m+2)/2)} - (2-(m+2))]}{(m+2)(m+4)} = \frac{8\pi(2^{-m/2} + m)}{(m+2)(m+4)}$$

Figure 20:
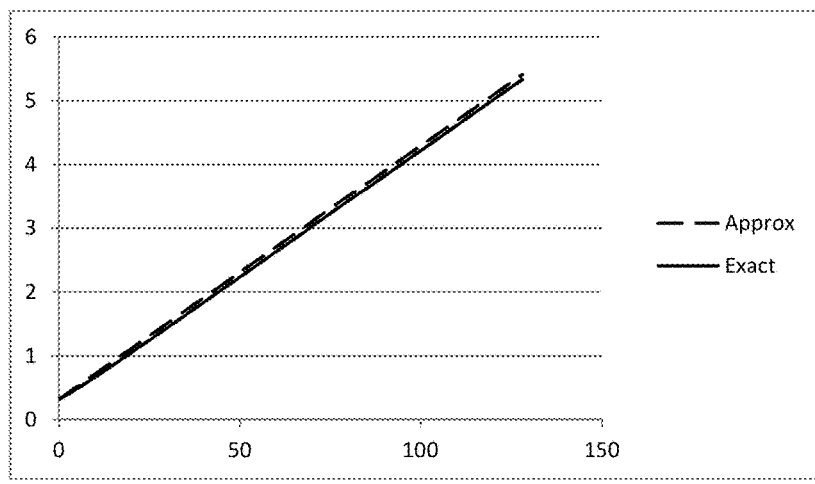
FIG. 20 plots approximate and exact Blinn-Phong normalization terms versus the Blinn-Phong exponent.

The exact energy-conserving normalization term is therefore $$\frac{(m+2)(m+4)}{8\pi(2^{-m/2}+m)},$$

and so the exact energy-conserving Blinn-Phong BRDF model is:

$$L_r(i,r) = \frac{(m+2)(m+4)}{8\pi(2^{-m/2}+m)} R(n\cdot h)^m \tag{10}$$

where both normalization terms are shown in FIG. 20.

Figure 21:
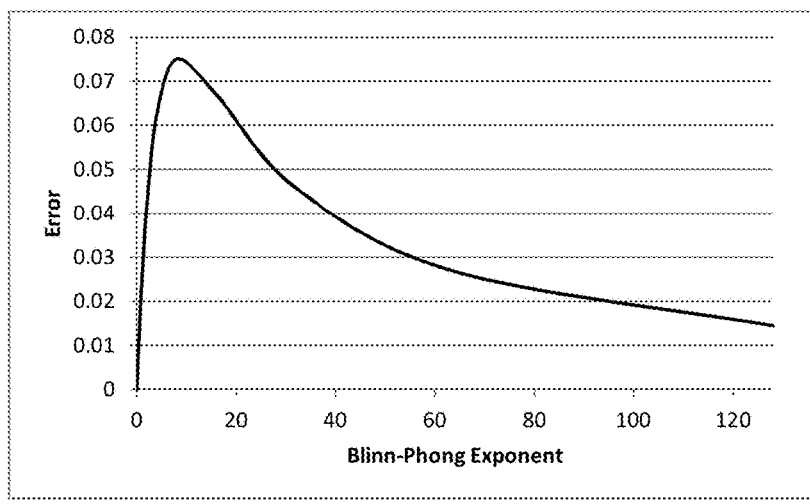
FIG. 21 plots the approximate Blinn-Phong normalization term error.

Plotted against the approximate normalization term $$\frac{m+8}{8\pi},$$

the error is shown in FIG. 21. The maximum error for m=10 is 7.5 percent, which justifies the use of the exact normalization term in physically correct global illumination calculations.

Modeling BSDFs

Figure 22:
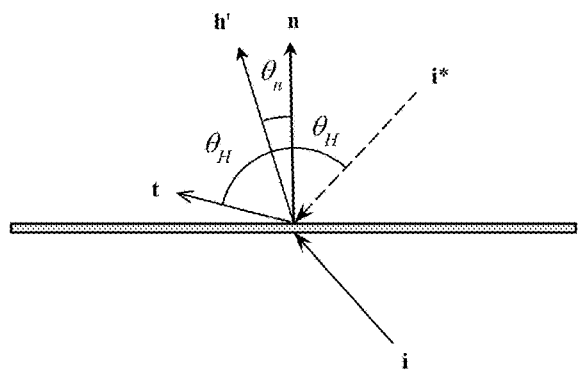
FIG. 22 illustrates the geometry of translucent surface transmittance.

Referring to FIG. 22, it is possible to model the BTDFs of translucent materials by adapting the Blinn-Phong BRDF model as follows:

$$L_t(i,t) = T(n\cdot h')^m \tag{11}$$

where t is the transmitted light vector, T is the surface diffuse transmittance, $$h' = \frac{-i+t}{|-i+t|}$$

is the normalized half-vector between the reversed incident ray i* and transmitted light ray t, and $L_t(i,t)$ is the transmitted luminance of light ray 1230 (again assuming an incident ray with unit luminance). Thus:

$$L_t(i,t) = \frac{(m+2)(m+4)}{8\pi(2^{-m/2}+m)} T(n\cdot h')^m \tag{12}$$

where the exact normalization term $$\frac{(m+2)(m+4)}{8\pi(2^{-m/2}+m)}$$

can, of course, be precalculated.

Figure 23:
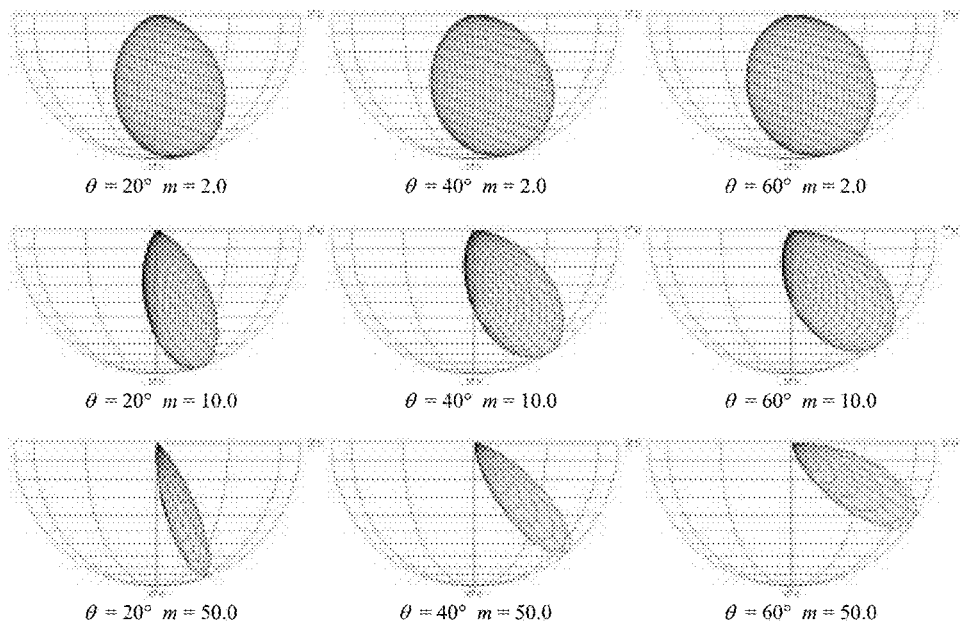
FIG. 23 shows example analytic bidirectional transmittance distribution functions.

Together, Equations 10 and 12 provide computationally efficient and physically correct analytic equations to represent the BSDFs of many common fenestration devices, with example BTDFs shown in FIG. 23 for various incidence angles 8 and Blinn-Phong exponents m. These equations are easily integrated into a ray tracing program, such as Radiance, where they may serve as probability distribution functions for the scattered light rays.

As may be readily understood, a database of fenestration devices and their associated Blinn-Phong exponents may be maintained in a computer program.

Radiosity and BSDFs

It is not immediately obvious how Equations 10 and 12 can be integrated into a radiosity-based program for daylight modeling. After all, the classic radiosity method is only capable of modeling diffuse reflection and transmission of light from surfaces. To understand how BSDFs can be modeled using radiosity, it is first necessary to review the method itself.

Figure 24:
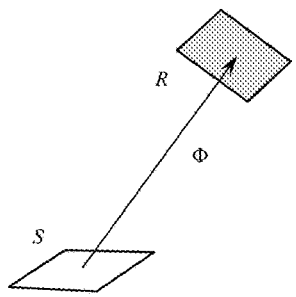
FIG. 24 show the transfer of flux Φ from source patch S to receiver patch R.

The radiosity method is based on the concept of transferring luminous or radiant flux (i.e., light) between finite area surfaces (called "patches") rather than by randomly tracing light rays. Referring to FIG. 24, at each step of the calculation process, flux Φ is diffusely emitted or reflected from source patch S and received by a receiver patch R that is visible to the source patch. (In practice, there are typically many receiver patches, some of which may partially or fully obscure the visibility of other receiver patches as seen from the source patch.)

Form Factors

The portion of the flux that is diffusely emitted by or reflected from source patch S and which is received by receiver patch R is determined by the "form factor" F between the source and receiver patches. It is an extremely difficult and arduous mathematical problem to calculate the form factor between two patches of arbitrary shape and dimension, but a geometric approach known as Nusselt's analogy (FIG. 25) can be used to determine the form factor F between an infinitesimally small source patch dS and a finite area receiver patch R.

The outline of the receiver patch as seen from the source patch is projected onto the surface of an imaginary unit radius hemisphere H centered on the source patch. This projection P is then projected downwards onto the base B of the hemisphere; the area A of the downwards projection divided by the area of the base (i.e., π) is the form factor F. That is:

$$F = A/\pi \quad (13)$$

Figure 26:
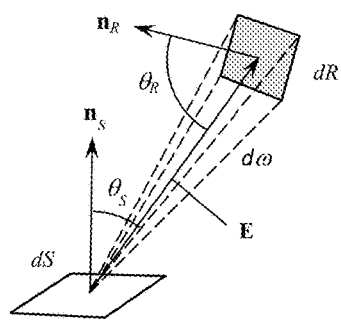
FIG. 26 shows the differential form factor dF between infinitesimal patches dS and dR.

Unfortunately, solving for the form factor F of a receiver patch of arbitrary shape and dimension using Nusselt's analogy is equally difficult, as it involves projective spherical geometry. However, given two infinitesimally small patches dS and dR separated by ray E with length r as shown in FIG. 26, the differential solid angle dω subtended by dR as seen from dS is:

$$d\omega = \cos\theta_R dA_R/r^2 \quad (14)$$

where $dA_R$ is the differential area of dR and $\theta_R$ is the angle between the ray E and the surface normal $n_R$ of receiver element dR. If we project the intersection of this solid angle with the unit hemisphere onto the hemisphere base, the area of the projection is:

$$dA = \cos\theta_S d\omega = \cos\theta_S \cos\theta_R dA_R/r^2 \quad (15)$$

where $\theta_S$ is the angle between the ray and the surface normal $n_S$ of the source patch.

Substituting Equation 15 into Equation 13 then gives:

$$dF = \frac{\cos\theta_S \cos\theta_R dA_R}{\pi r^2} \quad (16)$$

for the differential form factor dF from dS to dR.

Hemicubes

Figure 25:
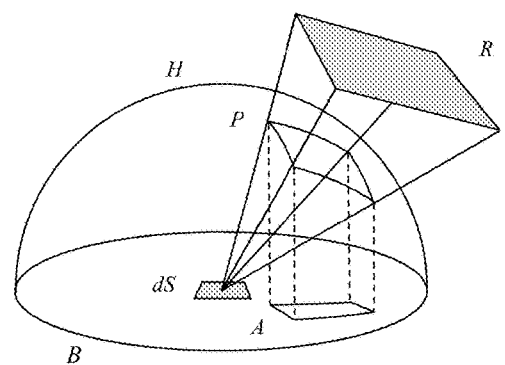
FIG. 25 show the process of form factor determination using Nusselt's analogy.
Figure 27:
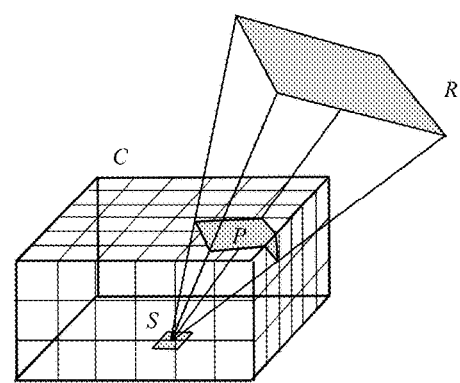
FIG. 27 projection of a planar surface onto the faces of a hemicube.

If the hemisphere H of FIG. 25 is replaced with a hemicube C (i.e., half of a cube) as shown in FIG. 27, the projection P of a receiver patch R onto the hemicube involves planar rather than spherical surfaces, and so the determination of the form factor F becomes tractable. If, for example, each face of the hemicube is subdivided into a grid of square cells, the form factor F becomes:

$$F \approx \Sigma \Delta F_{covered} \quad (17)$$

where $\Delta F_{covered}$ represents the delta form factor of each hemicube face cell that the receiver patch R projects onto. As the size of the cells decreases, the delta form factor converges to dF, and so the approximation converges to the form factor F.

Figure 28:
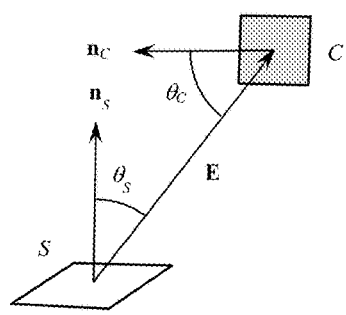
FIG. 28 shows the hemicube face cell geometry.

Referring to FIG. 28, a hemicube face cell C is oriented such that its normal $n_C$ is at an angle $\theta_C$ to the ray E with length r between the hemicube center S and the center of the face cell. From Equation 15, the delta form factor $\Delta F_C$ is therefore:

$$\Delta F_C = \frac{\cos\theta_S \cos\theta_C}{\pi r^2} \Delta A_C \quad (18)$$

where $\Delta A_C$ is the area of the face cell (as a fraction of the full face area), and the angle $\theta_S$ is determined by:

$$\cos\theta_S = E \cdot n_S/r \quad (19)$$

where $n_S$ is the hemicube plane's normal.

Cubic Tetrahedrons

Figure 29:
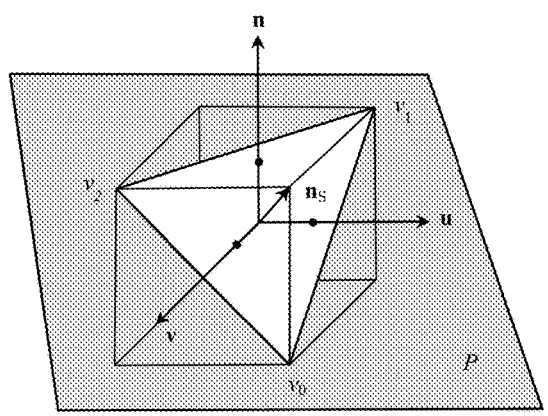
FIG. 29 shows the cubic tetrahedron geometry.

A cubic tetrahedron (a three-sided pyramid with an apex angle of 90 degrees for each side) is more computationally efficient for the purpose of calculating form factors. As shown in FIG. 29, the cubic tetrahedron is oriented in three-dimensional Cartesian coordinates (with axes u, v, and n) such that the vertices of its triangular base are positioned at $v_0 = \{1, 1, -2\}$, $v_1 = \{1, -2, 1\}$, and $v_2 = \{-2, 1, 1\}$ and lie on the plane P. With this, the cubic tetrahedron base normal $n_S$ is described by the vector $$\left\{\frac{1}{\sqrt{3}}, \frac{1}{\sqrt{3}}, \frac{1}{\sqrt{3}},\right\}.$$

Thus, referring to FIG. 28:

$$\cos\theta_S = (E_u + E_v + E_n)/\sqrt{3}r \quad (20)$$

For cells on the cubic tetrahedron face perpendicular to the v-axis, the angle $\theta_C$ is determined by:

$$\cos\theta_C = -E \cdot n_C/r \quad (21)$$

where the face cell normal $n_C$ is described by the vector $\{0, -1, 0\}$. Also, the face lies on the plane v=1. Therefore:

$$\cos\theta_C = E_v/r = 1/r \quad (22)$$

The same result can be derived for the other two faces. Thus, for any cubic tetrahedron cell:

$$\Delta F_C = \frac{E_u + E_v + E_n}{\pi r^4 \sqrt{3}} \Delta A_C \quad (23)$$

However:

$$r^2 = E_u^2 + E_v^2 + E_n^2 \quad (24)$$

and for each face, one of $E_u$, $E_v$, or $E_n$ will always be one. Therefore:

$$\Delta F_C = \frac{u + v + 1}{\pi (u^2 + v^2 + 1)^2 \sqrt{3}} \Delta A_C \quad (25)$$

where u and v range from 1 to −2.

These delta form factors can be precalculated and accessed through a lookup table when receiver patches are projected onto the cubic tetrahedron faces during radiosity calculations. It is important to note, however, that form factors apply to the calculation of diffuse flux transfer only; they cannot be applied to non-diffuse flux transfer between specular surfaces, or between glossy surfaces whose optical properties are described by bidirectional scattering distribution functions.

Modeling BSDFs

It is possible to consider Equations 10 and 12 as representing the intensity distribution of a point light source. This distribution will be dependent on the incidence angle of the incident ray, but the analogy still holds. IES RP-16-10, Nomenclature and Definitions for Illuminating Engineering [5], defines luminous and radiant intensity in a given direction as:

$$I = d\Phi/d\omega \qquad (26)$$

where $d\Phi$ is the differential radiant flux contained in an elemental cone with differential solid angle $d\omega$ that is oriented in the given direction.

Figure 30:
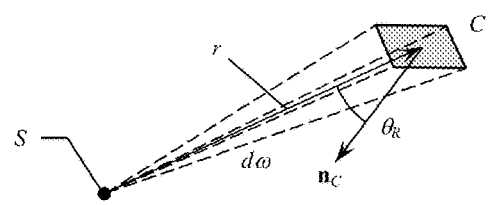
FIG. 30 shows the cubic tetrahedron face cell geometry.

Referring to FIG. 30 then, the radiant flux from a point source S with an intensity distribution $I(\theta,\phi)$ that is received by a cubic tetrahedron face cell C with surface area $\Delta A_C$ and is at a distance r and at an angle $\theta_C$ to the face cell normal $n_C$ is:

$$\Phi_C = f_{tr} I(\theta,\phi) \cos \theta_C d\omega \qquad (27)$$

where the differential solid angle $d\omega$ is approximately:

$$d\omega \approx \cos \theta_C \Delta A_C / r^2 \qquad (28)$$

For each cell with variable coordinates u and v, and n=1, we have from Equation 24:

$$r = \sqrt{u^2 + v^2 + 1} \qquad (29)$$

and from Equation 22:

$$\cos \theta_C = 1/r \qquad (30)$$

Thus the radiant flux received by each cubic tetrahedron cell is:

$$\Delta \Phi_C \approx I(\theta,\phi)/A_C(u^2+v^2+1)^{3/2} \qquad (31)$$

and similarly, for coordinates pairs u, n and v, n. (A similar derivation is possible for hemicube face cells.) The term $\Delta A_C/(u^2+v^2+1)^{3/2}$ is referred as the "diffusion parameter" of the cubic tetrahedron cell, or more generally of a ray originating from the cubic tetrahedron center in the direction of the center of the cell. Further, as previously noted, the term $I(\theta,\phi)$ may be an analytic calculation of the BSDF function such as the Blinn-Phong model, or derived from BSDF measurements of a physical fenestration device.

Thus, if the receiver patch R is projected on n cells of a cubic tetrahedron, the flux $\Phi_R$ received by the patch from the point source is approximately:

$$\Phi_R \approx \Sigma_n I(\theta,\phi) \Delta A_C/(u^2+v^2+1)^{3/2} \qquad (32)$$

which again converges to $\Phi_R$ as the cubic tetrahedron cell size decreases.

Figure 31:
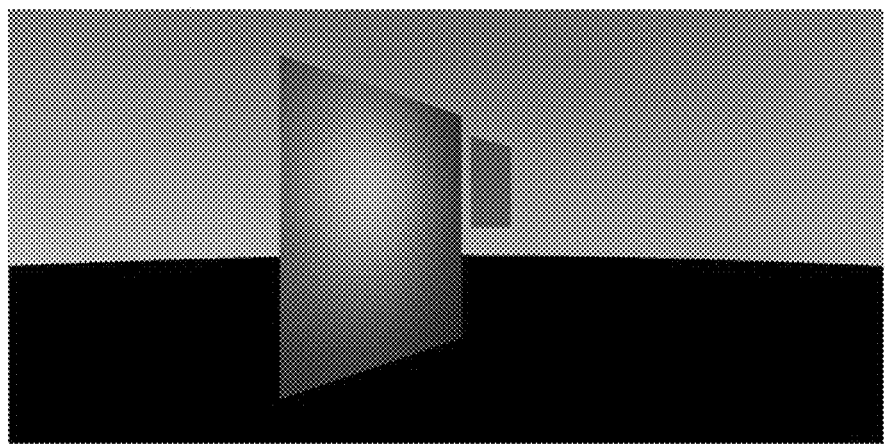
FIG. 31 shows an example of daylight transmittance through a translucent window with a Blinn-Phong exponent of m=2.0.
Figure 32:
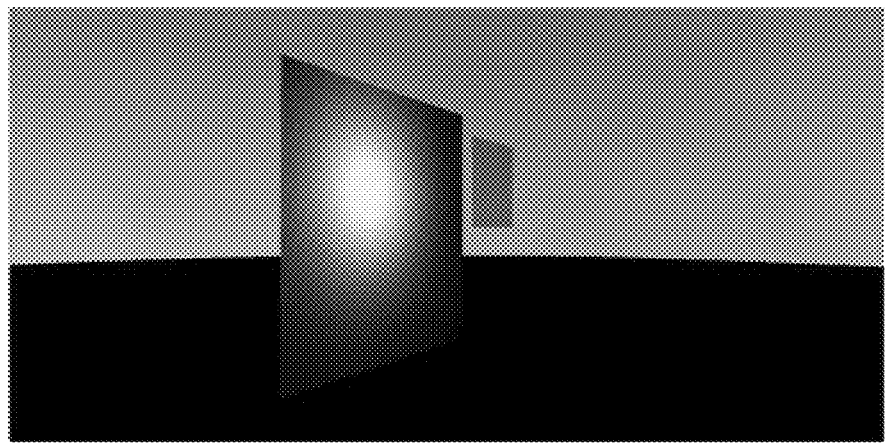
FIG. 32 shows an example of daylight transmittance through a translucent window with a Blinn-Phong exponent of m=10.0.
Figure 33:
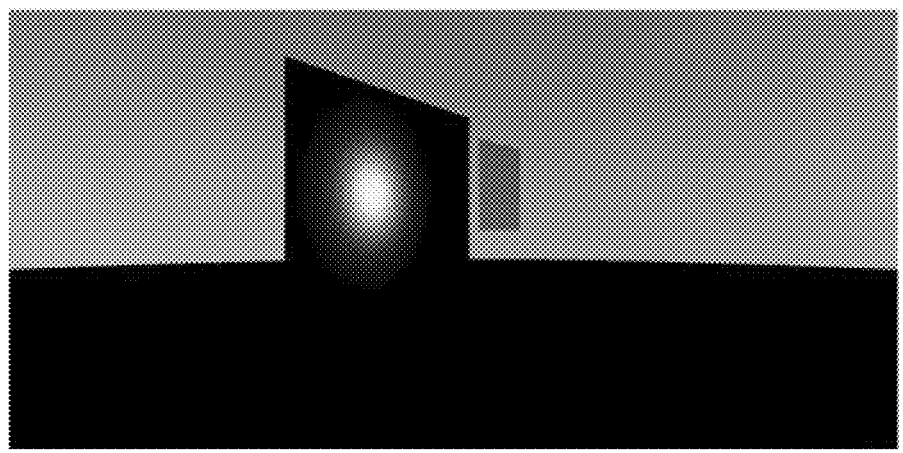
FIG. 33 shows an example of daylight transmittance through a translucent window with a Blinn-Phong exponent of m=50.0.

Examples of direct sunlight and diffuse daylight transmitted through a translucent surface onto an interior surface for different Blinn-Phong exponents m are shown in in FIGS. 31-33.

Figure 34:
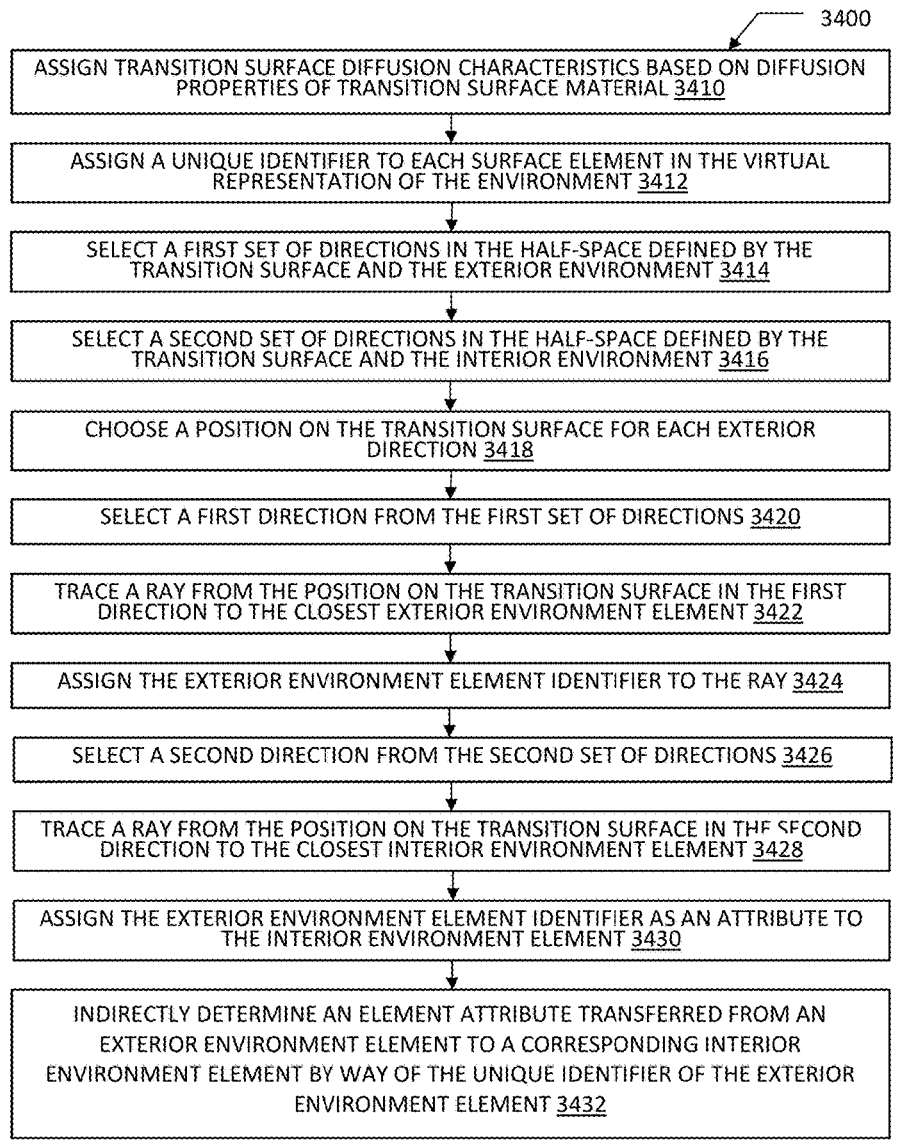
FIG. 34 is a flowchart depicting the steps in diffusion properties of a transition surface material.

Referring to FIG. 34, the method may comprise: assigning transition diffusion characteristics (such as, for example, a Blinn-Phong exponent) based on the diffusion properties of a transition surface material (Step 3410); assigning a unique identifier to each element in the virtual representation of the exterior and interior environments (Step 3412); selecting a first set of directions in the half-space defined by the transition surface and the exterior environment (Step 3414); selecting a second set of directions in the half-space defined by the transition surface and the interior environment (Step 3416); choosing a position on the transition surface for each exterior direction (Step 3418); selecting a first direction from the first set of directions (Step 3420); tracing a ray from the position on the transition surface in the first direction to the closest exterior environment element (Step 3422); assigning the exterior environment element identifier to the ray (Step 3424); selecting a second direction from the second set of directions (Step 3426); tracing a ray from the position on the transition surface in the second direction to the closest interior environment element (Step 3428); assigning the exterior environment element identifier as an attribute to the interior environment element (Step 3430); and indirectly determining an element attribute transferred from an exterior environment element to a corresponding interior environment element by way of the unique identifier of the exterior environment element (Step 3432).

In Step 3412, the first set of directions may be defined, for example, by subdividing the sky dome into 256 triangular patches and choosing the barycenter of each patch, or by calculating the annual solar path for a given geographic location and choosing solar positions for selected times and dates.

In Step 3414, the second set of directions may be defined, for example, by the centers of the face cells of a cubic tetrahedron or a hemicube.

In an embodiment, Steps 3420 through 3432 are iterated, either sequentially or in parallel, for each direction of the first set of directions, while Steps 3420 through 3432 are similarly iterated, either sequentially or in parallel, for each direction in the second set of directions.

Interior Environment

For interior environments, the light sources are the direct sunlight, diffuse daylight, and reflected light from exterior environment elements transferred through the transition surfaces, plus the artificial light emitted by the luminaires.

For daylight harvesting purposes, one or more luminaires are typically assigned to "zones" that can be independently dimmed or switched. For the purposes of illustration, there are assumed to be 'p' luminaire zones in interior environment, where 'p' may be less than or equal to the number of luminaires.

As with the exterior environment, the present invention assigns a multiplicity of 'n'+'p' unsent flux parameters and 'n'+'p' luminous or spectral radiant exitance parameters to each interior environment element, where 'n' is the number of divisions of the sky dome and solar path. Radiative flux transfer techniques can again be employed to calculate the distribution of luminous or spectral radiant flux due to interreflections between surface elements in the interior environment for each sky and solar patch and each luminaire zone. (Similar to the sky dome and solar patches, each luminaire zone is assigned unit luminous or spectral radiant intensity.) The result is the generation of 'n'+'p' separate canonical radiosity solutions for the interior environment. (The same approach can be applied, of course, to luminaire zones illuminating the exterior environment.)

In one embodiment, the set of radiosity solutions comprises a list of 'n' luminous exitance or spectral radiant exitance values for each exterior geometric element and 'n'+'p' luminous exitance or spectral radiant exitance values for each interior geometric element. In another embodiment, each such list is compressed using for example wavelet, radial basis function, or similar lossless or lossy signal compression techniques as will familiar to those skilled in the art of data communications. Further compression may be achieved through correlations between the exitance lists of geometrically adjacent or close elements, as will be familiar to those skilled in the art of multichannel data compression for electroencephalograms, electrocardiograms, and the like.

It is further noted that the number of finite elements 'm' representing an interior environment, each with an array 'n'+'p' of unsent flux and luminous exitance values, represents an 'm'×('n'+'p') array. This array can be compressed using for example two-dimensional singular value decomposition (SVD) or eigenvector techniques such as are used for image compression, and an approximate representation of a portion of the matrix reconstructed as required with limited memory.

Spectral Radiosity

According to prior art radiosity techniques, the spectral power distributions of daylight and electric light sources are represented by a multiplicity of spectral bands. In a typical embodiment, three spectral bands are employed, representing red, green, and blue light, wherein the spectral bands are defined by CIE XYZ tristimulus values rather than wavelength ranges. A radiosity solution for the environment is then calculated for each spectral band. (As will be understood by those skilled in the art, there are an infinite number of band-limited spectral power distributions that can have the same tristimulus values.)

Upon completion of the radiosity calculations, a virtual photometer may be used to determine the approximate spectral radiant exitance at any selected point on a surface element, as represented by the radiosity solution value for each spectral band, using prior art techniques. Similarly, the approximate spectral radiant exitance at an arbitrary position and orientation in the virtual environment can be determined, again using prior art techniques.

A disadvantage of this technique is that the spectral power distributions of daylight and electric sources can only be approximated by a finite number of spectral bands. With, for example, three spectral bands representing red, green, and blue light, the width of each spectral band is approximately 100 nm. Unfortunately, some lighting simulations require spectral resolutions of 10 nm or less. In horticultural lighting, for example, the growth of healthy lettuce is strongly influenced by whether the plants are irradiated by green LEDs with peak wavelengths of 510 nm, 520 nm or 520 nm (Johkan, M. et al. 2012. "Effect of Green Light Wavelength and Intensity on Photomorphogenesis and Photosynthesis in *Lactuca sativa*," Environmental and Experimental Botany 75:128-133).

A prior art brute force technique is to employ as many spectral bands as necessary to accurately represent the light source spectral power distribution and calculate a radiosity solution for each band. For 5 nm spectral resolution, for example, 60 spectral bands are required to represent visible light with wavelengths from 400 nm to 700 nm. Unfortunately, this approach typically requires excessive amounts of memory.

Figure 35:
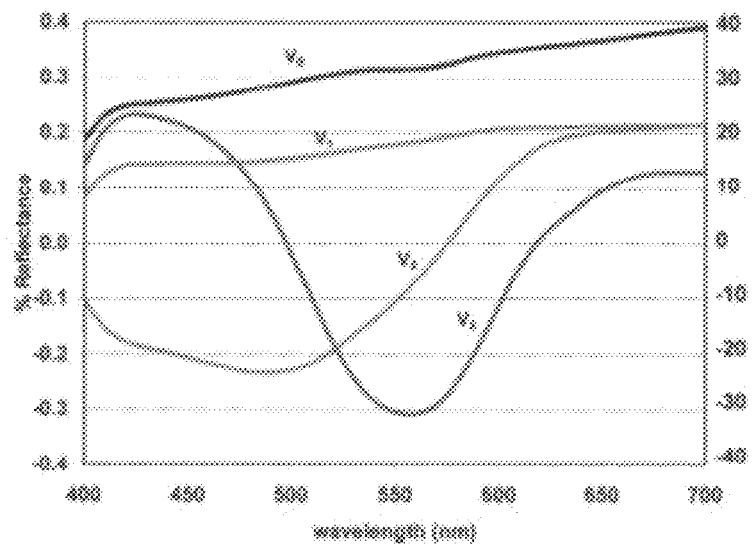
FIG. 35 shows the mean and first three principal component spectral reflectance distributions of 3,534 natural and synthetic materials.

A solution to this problem becomes evident when it is realized that the spectral transmittance distributions of transparent and translucent materials such as glass, and the spectral reflectance distributions of opaque materials, rarely feature complex spectral features. An analysis presented by Fairman, H. S., and M. H. Brill, 2004, "The Principal Components of Reflectances," Color Research and Application 29(2):104-110, for example, demonstrated that the measured spectral reflectance distributions of 3,534 object color samples of both natural and synthetic materials are relatively smooth, and can be represented by three to six principal components. FIG. 35 shows, for example, three principal components $V_1$, $V_2$ and $V_3$, plus a mean component $V_0$; any physically plausible spectral power distribution can be represented as a weighted sum of these spectral power distributions.

Figure 36:
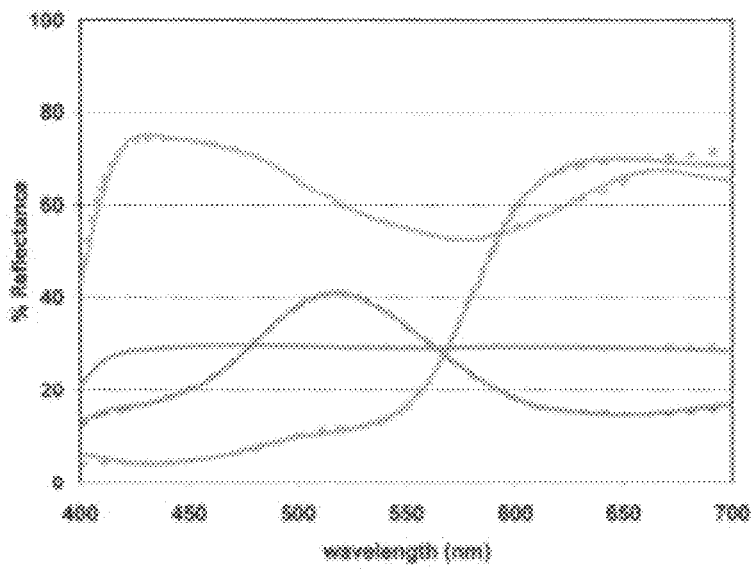
FIG. 36 shows the approximation of four randomly-selected measured spectral reflectance distributions by the weighted sums of six principal components
Figure 37:
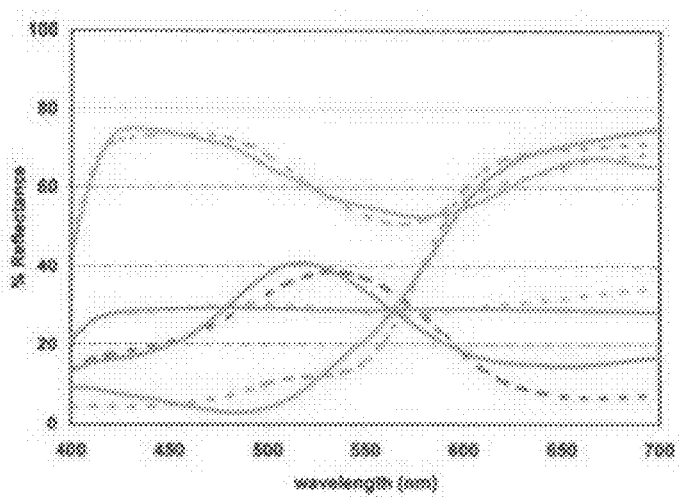
FIG. 37 shows the approximation of four randomly-selected measured spectral reflectance distributions by the weighted sums of three principal components.

With three principal components, it is possible to generate an excellent approximation to a randomly chosen measured spectral power distribution using six principal components, and a good approximation using only three principal components (FIGS. 36 and 37 respectively). As shown by Fairman and Brill, it is possible to generate a physically plausible spectral reflectance distribution for most natural and synthetic materials, knowing only their three CIE XYZ tristimulus values.

Figure 38:
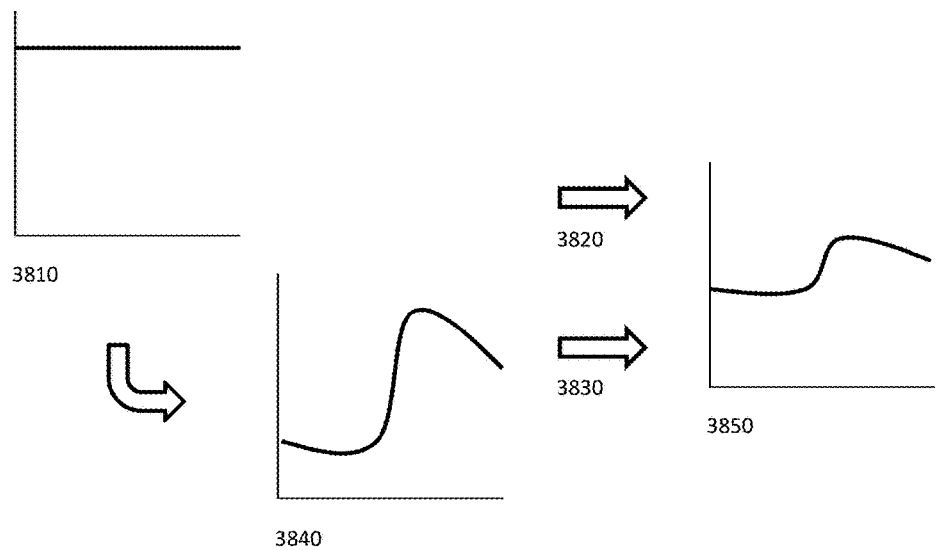
FIG. 38 shows the determination of a virtual photometer canonical spectral irradiance distribution as the summation of direct spectral irradiance and indirect spectral irradiance.

Given this, it is therefore possible to generate a physically plausible spectral irradiance distribution for a virtual photometer measurement using only three and six spectral bands. Referring to FIG. 38, if it is assumed that the spectral power distributions of the light sources in the environment (both daylight and electric lighting) have equal energy spectral power distributions 3810, the virtual photometer measurement 3850 represents the direct spectral radiant flux 3820 received from the light sources and spectral radiant flux 3830 that is reflected and/or transmitted interreflected by one or a multiplicity of surfaces in the environment. With each reflection or transmission, the surface color 3840 modifies the spectral power distribution of the spectral radiant flux that contributes to the virtual photometer spectral irradiance measurement. Virtual photometer measurement 3850 is referred to as a "canonical" spectral irradiance, due to it being based on an illuminant with an equal energy spectral power distribution.

Figure 39:
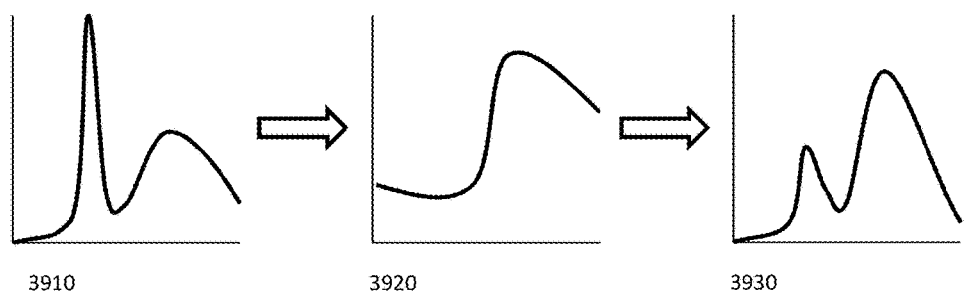
FIG. 39 shows the multiplication of a light source complex spectral power distribution by a virtual photometer canonical spectral irradiance distribution to obtain a complex spectral irradiance distribution.

Referring to FIG. 39, it therefore follows that if the light sources have a complex spectral power distribution 3930, the spectral irradiance distribution measured by the virtual photometer is simply the canonical spectral irradiance distribution measured by the virtual photometer with an equal energy spectral power distribution 3920 multiplied on a per-wavelength basis by the complex spectral power distribution 3910.

Figure 40:
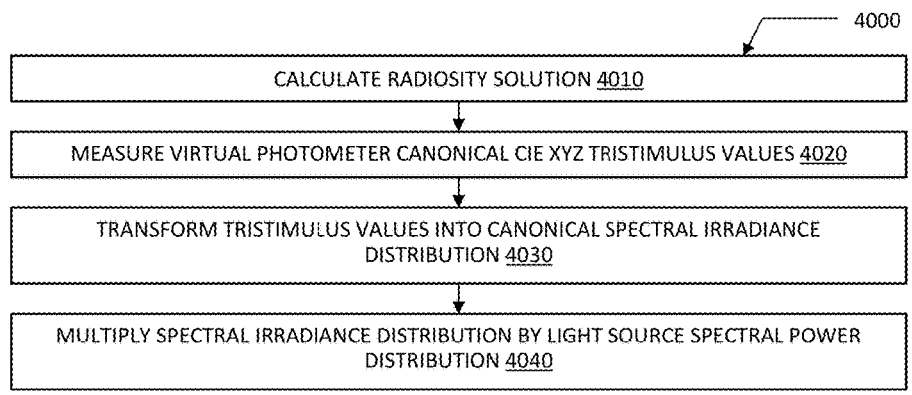
FIG. 40 is a flowchart depicting the determination of complex spectral irradiance distribution.

The flowchart shown in FIG. 40 therefore illustrates the process 4000 for calculating the spectral irradiance received by a virtual photometer due to direct and indirect spectral radiant flux from a light source with a complex spectral power distribution. In Step 4010, a radiosity solution with three to six spectral bands is calculated for the light source, which may be daylight or electric lighting, in which the light source has an equal energy power distribution. In Step 4020, a virtual photometer measures the canonical spectral irradiance due to spectral radiant flux received directly from the equal energy light source and spectral radiant flux that has been reflected and/or transmitted interreflected by one or a multiplicity of surfaces in the environment. In Step 4030, the virtual photometer measurement, comprised of three CIE XYZ tristimulus values or, more generally, three to six principal component values, is transformed in accordance to Fairman and Brill into a spectral irradiance distribution. In Step 4040, the virtual photometer canonical spectral irradiance distribution is multiplied on a per-wavelength basis with the light source complex spectral power distribution to yield the spectral irradiance distribution that is measured by the virtual photometer.

If the environment includes a plurality of light sources with different complex spectral power distributions, separate radiosity solutions must be calculated (Step 4010); these steps can be performed in parallel. The following Steps 4020, 4030 and 4040 are then performed for each radiosity solution, following which the spectral irradiance distributions are summed.

Optimal Luminous Environment

It is important to note that while the calculation of the 'n' canonical radiosity solutions for the exterior environment and 'n'+'p' canonical radiosity solutions for the interior environment may require minutes to hours of computation time, these calculations need to be calculated only once for a given environment. Thereafter, the radiosity solution for any sky luminance distribution and any dimming or switched state for the luminaire zones can be calculated as a weighted sum of the canonical radiosity solutions, where the weights are the luminances of the associated sky dome and solar patches and the luminous intensities of the luminaires for each zone. These calculations can be performed in milliseconds.

Figure 8:
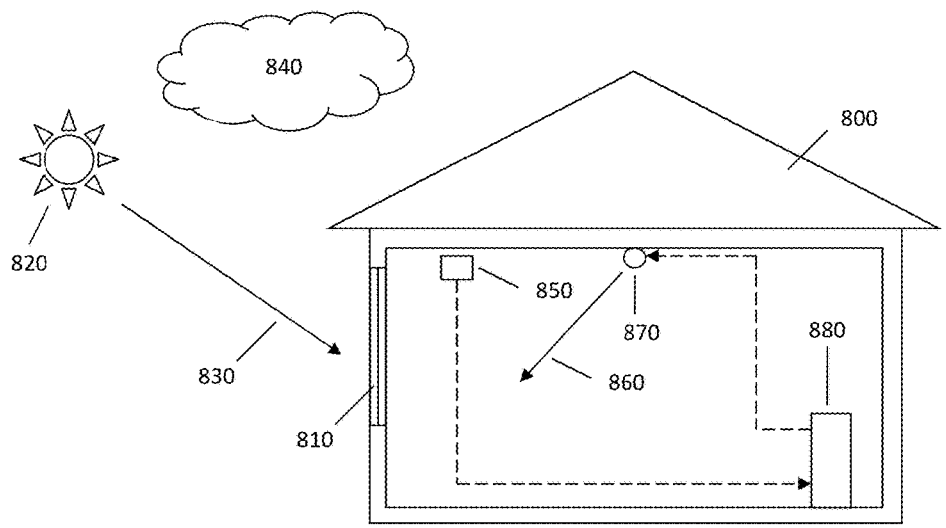
FIG. 8 shows a schematic representation of a predictive daylighting harvesting system.

A "sky condition" is uniquely determined according to the Perez (or similar) sky model by the time of day, the Julian date, the geographical position of the site in terms of longitude and latitude, and the direct normal irradiance and diffuse horizontal irradiance, which determines the spatial distribution of sky luminance and solar position. For this sky condition, there will be a range of luminaire zone dimmer or switch settings and automated fenestration states that provide a comfortable luminous environment for the occupants of the interior environment and minimize energy consumption. FIG. 8 shows for example a building 800 with a window 810 that admits daylight 830 from the Sun 820 and sky, wherein the amount of daylight is determined by the weather 840. Daylight sensor 850 senses the amount of daylight entering the building and artificial light 860 received from electric light source 870 and communicates the information to controller 880, which subsequently adjusts the amount of artificial light.

These are often competing goals. Occupants will be interested in having relatively constant illuminance of their workplaces, minimal glare from the windows, and infrequent changes in the automated fenestration devices (especially motorized blinds). Minimizing energy consumption may however dictate frequent changes in workplace illuminance and fenestration devices, especially on partly cloudy days where the available daylight may change rapidly.

Figure 4:
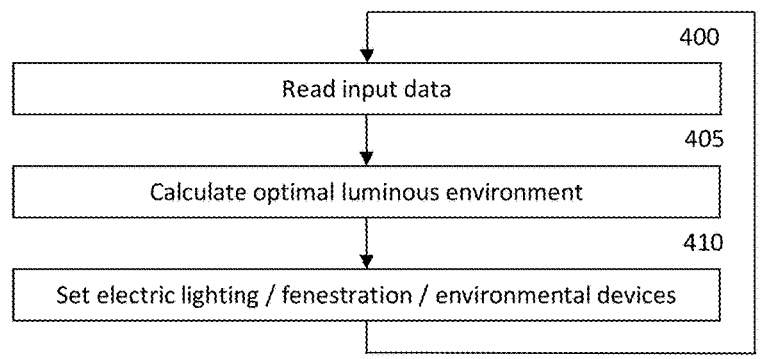
FIG. 4 shows a flowchart for operation of the predictive daylight harvesting system.

Assuming however that these competing goals can be satisfactorily resolved, the building controller operation will be as shown in FIG. 4. In Step 400, the building controller 45 reads the input devices 10 to 40 shown in FIG. 1. In Step 405, the building controller 45 calculates an optimal luminous environment. This environment will be simulated by suitable weightings of the precalculated canonical radiosity solutions. This step may include thermal and air flow calculations in response to solar heat gain. In Step 410, the controller 45 sets the dimmers or switches the circuit of the luminaire zones (i.e., the electric lighting devices 55) and in accordance with the weights of the 'p' canonical radiosity solutions for the luminaire zones. Similarly, the settings of the automated fenestration devices are set in accordance with the average transmittance of the windows (i.e., the transition surfaces), and the HVAC devices are set in accordance with the thermal and air flow calculations.

Greenhouse lighting will not typically need to be dimmed during the day, as its primary purpose is to provide supplemental lighting necessary for plant growth and health. It is however necessary for the greenhouse controller 145 to record the daylight measured by photosensors 100 at regular intervals and calculate the Daily Light Integral. If the value of this metric is less than that required for the specific plant, then supplemental lighting may be used to meet the plant's daily requirements. The greenhouse controller operation will otherwise be the same as shown in FIG. 4, although the thermal and air flow calculations will likely need to account for changes in humidity due to evaporation.

Figure 5A:
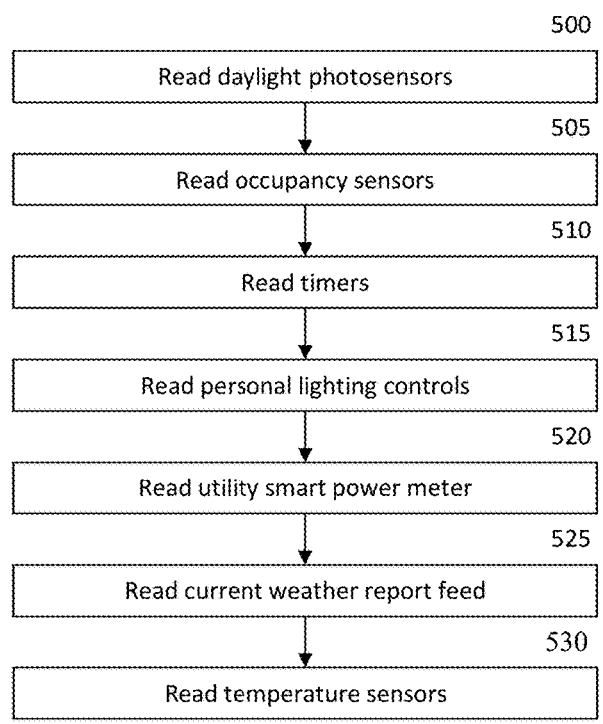
FIG. 5A shows a flowchart for reading the input data for buildings.

FIG. 5A shows the process of reading the input devices for building controller 45 in more detail, namely reading the daylight photosensors 10 (Step 500), reading the occupancy or vacancy sensors 15 (Step 505), reading the timers 20 (Step 510), reading the personal lighting controls 25 (Step 515), reading the utility smart power meters 30 (Step 520), reading the current weather report feed 35 (Step 525), and reading the temperature sensors 40 (Step 530) if present. Of course, the sequence shown in FIG. 5 is for illustration purposes only, and so is arbitrary.

Figure 5B:
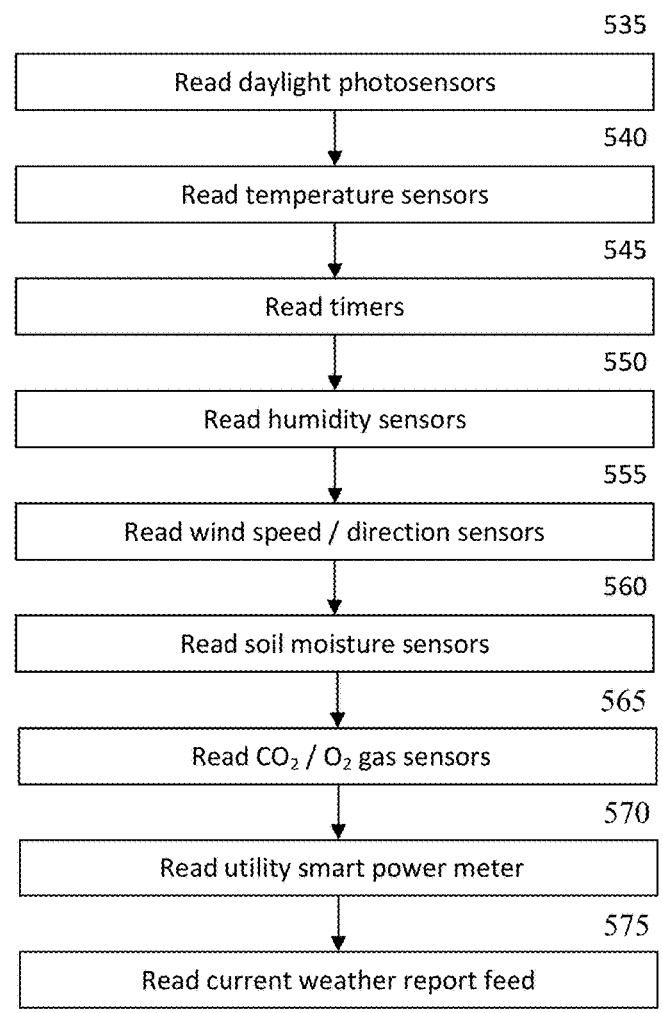
FIG. 5B shows a flowchart for reading the input data for greenhouses.

FIG. 5B shows the process of reading the input devices in more detail for greenhouse controller 145, namely reading the daylight photosensors 100 (Step 535), reading the temperature sensors 105 (Step 540), reading the timers 110 (Step 545), reading the humidity sensors 115 (Step 550), reading the wind speed and direction sensors 120 (Step 555), reading the soil moisture sensors 125 (Step 560), reading the carbon dioxide and/or oxygen gas sensors 130 (Step 565), reading the utility smart power meter 135 (Step 570), and reading the current weather report feed 140 (Step 575). Of course, the sequence shown in FIG. 5B is for illustration purposes only, and so is arbitrary.

Figure 6:
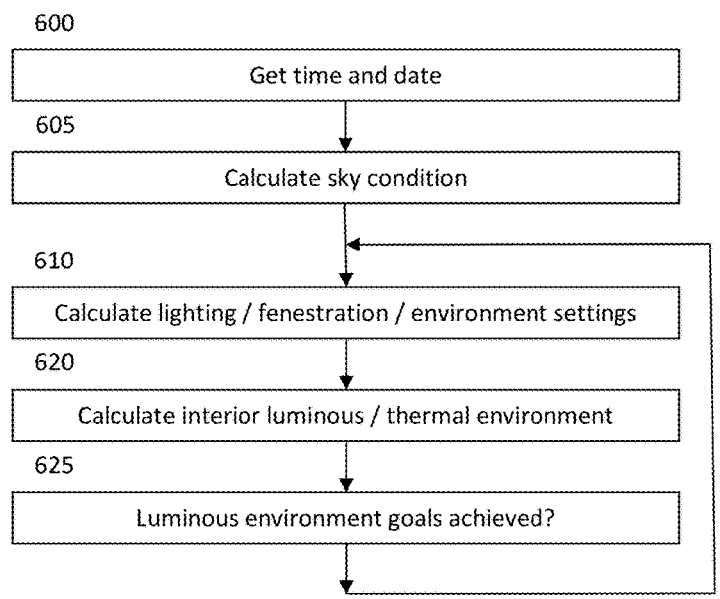
FIG. 6 shows a flowchart for calculating the optimal luminous and thermal environment.

FIG. 6 shows the process of simulating the interior luminous environment (i.e., the distribution of luminous exitance over the interior environment elements). In Step 600, the current time and date is determined. This uniquely determines the solar altitudinal and azimuthal angles. In Step 605, the current sky condition is determined from the direct normal irradiance and diffuse horizontal irradiance, which may be obtained for example from the weather report feed 35 in FIG. 1A or 140 in FIG. 1B. It may also however be inferred from the daylight photosensor readings, as will be disclosed below.

The luminaire zone, automated fenestration, and environmental device settings are determined in Step 610. These settings will in general be constrained by the input devices data, including the daylight photosensors 10, occupancy sensors 15, timers 20, personal lighting controls 25, utility power meters 30, weather report feeds 35, and temperature sensors 40 shown in FIG. 1A, and the daylight photosensors 100, temperature sensors 105, timers 110, humidity sensors 115, wind sensors 120, soil moisture sensors 125, gas sensors 130, utility power meters 135, and weather report feeds 140 shown in FIG. 1B.

Further constraints may of course be imposed or implied by the requirements of external systems accessed through the communication ports 55 or 155, such as for example an HVAC system controller, an energy storage system controller, a building automation system, a smart power grid, and so forth.

The interior luminous environment and optionally thermal environment is calculated in Step 620 using a weighted summation of the precalculated canonical radiosity solutions as previously disclosed.

The interior luminous and thermal environments are examined in Step 625 to determine whether the goals of comfortable luminous and thermal environments for the occupants, or minimum requirements for plant growth and health, and the minimization of energy consumption have been attained. If not, Steps 610 through 625 are repeated.

Figure 7A:
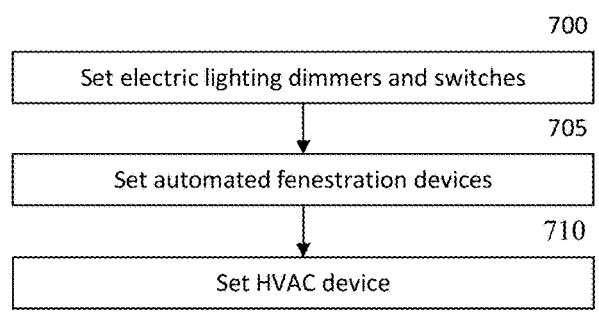
FIG. 7A shows a flowchart for controlling the electric lighting, automated fenestration devices, and HVAC devices for buildings.

FIG. 7A shows the output process of the controller 45, which consists of setting the luminaire zone dimmers and switches in Step 700, setting the automated fenestration device states in Step 705, and setting the HVAC device states in Step 710. Not shown is communication with external systems with which the controller 45 may exchange information and commands.

Figure 7B:
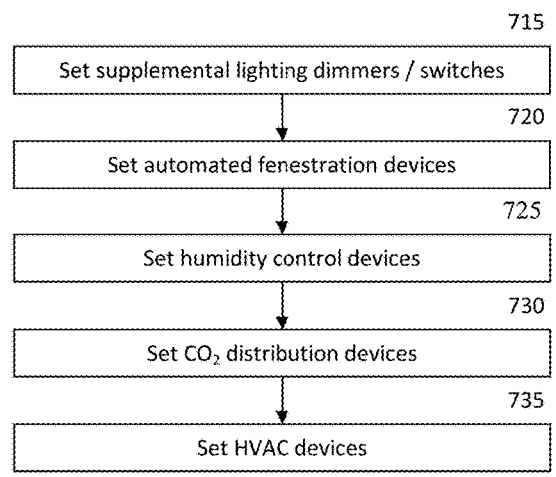
FIG. 7B shows a flowchart for controlling the electric lighting, automatic fenestration devices, HVAC devices, and supplemental carbon dioxide distribution devices for greenhouses.

FIG. 7B shows the output process of the greenhouse controller 145, which consists of setting the supplemental lighting dimmers and switches in Step 715, setting the automated fenestration device states in Step 720, setting the humidity control device states in Step 725, setting the CO2 distribution device states in Step 730, and setting the HVAC device states in Step 735. Not shown is communication with external systems with which greenhouse controller 145 may exchange information and commands.

Optimization

Referring to FIG. 1A, the controller 45 comprises a neuro-fuzzy or similar logic inference engine that can be trained using for example deep learning techniques to generate optimal luminaire zone dimmer and switch settings, automated fenestration device states, and optimal HVAC device settings for any given sky condition or time sequence thereof to satisfy the goals of comfortable luminous and thermal environments for the occupants and the minimization of annual energy consumption.

Referring to FIG. 1B, the greenhouse controller 145 similarly comprises a neuro-fuzzy or similar logic inference engine that can be trained using for example deep learning techniques to generate optimal luminaire zone dimmer and switch settings, automated fenestration device states, and optimal HVAC and other environmental settings for any given sky condition or time sequence thereof to satisfy the goals of minimal requirements for plant growth and health, and the minimization of annual energy consumption.

More generally, a neuro-fuzzy or similar logic inference engine can be trained to optimize for multiple goals, including but limited to power consumption, water consumption, fuel consumption, and various environmental factors, plant requirements, animal requirements, aquaculture requirements, human requirements, and waste reduction, wherein the satisfaction of such goals may be subject to short-term and long-term constraints, including but not limited to varying power, fuel and water costs, plant fertilizer and animal feed costs, environmental compliance requirements, and waste handling and removal costs.

As an example of multiple goal satisfaction, a building or greenhouse may derive electrical power from a combination of utility power, wind turbines, biomass generators, and electrical storage batteries, wherein said power may be required for supplemental electric lighting and heating. The most cost-effective combination will involve utility power costs, biomass generator capacity, and battery discharge states, all of which may vary continually. Training the controller logic inference engine therefore involves both historical and current weather data, as well as data obtained from ongoing system operation.

A key requirement of any logic inference engine is an input data set from which the engine can be trained to generate suitable outputs. Given the ability to quickly simulate the interior luminous environment using the radiosity-based method disclosed herein, suitable training data sets may include the Typical Meteorological Year (TMY) historical weather data files available for most geographic locations in North America (or equivalent weather data for other continents). These files provide hour-by-hour direct solar irradiance and diffuse irradiance values that can be used directly with the present invention.

As will be appreciated by those skilled in the art, there are many different artificial intelligence engines that can be trained to generate suitable output values for a range of input values; the neuro-fuzzy logic engine is merely one embodiment.

With the ability to train the building controller 45 or greenhouse controller 145 offline prior to deployment using a virtual representation of the environment, it becomes possible to design a daylight harvesting system with predictable energy savings performance. This includes the ability to locate and orient the daylight photosensors within the virtual interior environment such that the neuro-fuzzy logic engine can learn to correlate their outputs with known virtual sky conditions. When the controller is used with physical daylight photosensors within the physical interior environment, it is likely that the controller will be able to infer the correct sky condition strictly from the photosensor outputs without the need for direct normal and diffuse horizontal irradiance values from the weather report feed.

In one embodiment, the desired spatial illuminance distribution due to the combination of daylight and electric lighting across surfaces and workplanes in the virtual representation of the environment for each time and Julian date under various sky conditions is densely sampled with virtual photosensors spaced for example 30 centimeters on center. The predicted virtual photosensor outputs are arranged in a rectangular array. Using singular value decomposition (SVD) or eigenanalysis, the dominant singular vectors or eigenvectors of the array are determined. These vectors typically require much less storage space than the full matrix, and can later be used to reconstruct an approximation of the full matrix using for example truncated SVD for determining correlations between the virtual photosensor outputs and the spatial illuminance distributions.

In another embodiment, the virtual photosensor outputs are correlated directly with the dominant singular vectors or eigenvectors of the arrays, thereby eliminating the need to reconstruct approximations of the full matrices.

With multiple daylight photosensors 10 or 100, possibly mounted in each luminaire, it further becomes possible for the controller to perform data fusion by dynamically combining the photosensor outputs. That is, the controller may autonomously learn during its training with the TMY data set that a given weighting of photosensor outputs reliably predicts the correct sky condition during the morning, while another weighting is better during the afternoon. These weighted photosensor outputs can similarly be correlated with the corresponding spatial illuminance distributions or their corresponding dominant singular vectors or eigenvectors during the training period.

With multiple gas concentration sensors 130, it further becomes possible for the controller to perform data fusion by dynamically combining the gas sensor outputs. That is, the controller may autonomously learn during its training with the TMY data set that a given weighting of gas sensor outputs reliably predicts the desired gas concentration for a given sky condition during the morning, while another weighting is better during the afternoon. These weighted gas sensor outputs can similarly be correlated with the corresponding spatial illuminance distributions or their corresponding dominant singular vectors or eigenvectors during the training period.

Once the building controller 45 or greenhouse controller 145 has been suitably trained, the three-dimensional finite element representation of the exterior and interior environments may optionally be removed from the controller memory, as it may be sufficient during operation of the controller to determine the most likely spatial illuminance distribution according to its correlation with the physical photosensor outputs. This eliminates the need to recalculate the spatial illuminance distribution in real time according to the photosensor outputs.

If on the other hand the three-dimensional finite element representation of the exterior and interior environments is retained in the controller memory or otherwise readily accessible to the controller, the radiative flux transfer can be iteratively recalculated with changes to the material reflectances, window transmittances, lamp lumen outputs, and other model parameters at regular intervals (for example, once per week) to improve the correlations between the predicted and measured photosensor outputs, or to suggest more appropriate positions and orientations for the physical photosensors.

Similarly, the controller may autonomously learn during its training with the TMY data set that the goals of a comfortable luminous and thermal environment for the occupants and the minimization of annual energy consumption are best satisfied with a dynamic configuration of luminaire zones. This may be particularly easy to accomplish if each luminaire is assigned an Internet address or other unique identifier such that a single dimming command can be sent to any number of luminaires.

Further, controller training need not be limited to the TMY or equivalent weather data set. As will be known to those skilled in the art, the controller can learn to adapt its behavior to changes in the environment, such as changing user preferences for illumination or occupancy sensor events, or to changes in the requirements of external systems such as for example an HVAC controller or smart power grid.

In another embodiment, the three-dimensional finite element representation of the interior environment is augmented with virtual representation of occupants (for example, office workers) whose stochastic behavior includes movement within the environment to simulate occupancy sensor events, and whose user preferences dim or switch the luminaires at various locations (such as for example open office cubicles or workstations). These virtual occupants can be used to similarly train the controller offline prior to deployment, and to determine an optimal placement of occupancy sensors.

Following deployment, the controller can similarly record occupancy sensor events and personal lighting control operations to refine the stochastic behavior of the virtual occupants.

During the controller training period, problems such as lamp failures, lamp lumen depreciation, photosensor and occupancy sensor failures, and network communication failures can be simulated, thereby enabling the controller to learn appropriate response strategies to minimize energy consumption, optimize spatial illuminance distributions, and satisfy other predetermined goals.

It will further be evident to those skilled in the art that neuro-fuzzy logic and similar artificial intelligence engines can be trained to recognize temporal patterns. In particular, the controller can implement a Kalman filter or other construct to observe a minute-by-minute sequence of sky conditions and predict the sky condition and occupant behavior (as determined for example by the occupancy sensor outputs and personal lighting control commands) for some period of time into the future. Based on this ongoing sequence of predictions, it can develop a long-term strategy of daylight harvesting system settings that will satisfy the goals of occupant comfort and annual energy savings.

The controller may also receive input data from and send output data to a plurality of buildings that may be geographically proximate or remote. The controller may thereby learn commonalities and differences in operational requirements between a possibly disparate set of buildings that further refines its behavior to changes in the environment.

Finally, in yet another embodiment, the physical controller is simulated in software for the purposes of training during the design phase. The resultant data from the training period is then used to program the physical controller prior to deployment.

Controller Topology

In one embodiment, the building controller 45 or greenhouse controller 145 is implemented as a centralized system. In another embodiment, the controller is implemented as a decentralized and self-organizing system with computational intelligence embedded in each luminaire and associated "Internet of Things" hardware devices connected via a bidirectional communications network.

The luminaire network topology may be based on swarm intelligence, such as for example particle swarm or ant colony optimization, where the goals are for example desired spatial illuminance distributions, minimal energy consumption, user preferences, minimal visual glare, and so forth.

Reinforcement learning algorithms can be employed to provide self-learning capabilities for the controller in achieving these goals. In one embodiment, the controller can simultaneously operate the physical daylight harvesting system in real time and model the environment offline using "what-if" scenarios to improve controller performance over time, wherein these scenarios may be implemented using evolutionary algorithms, including genetic algorithms.

Figure 9:
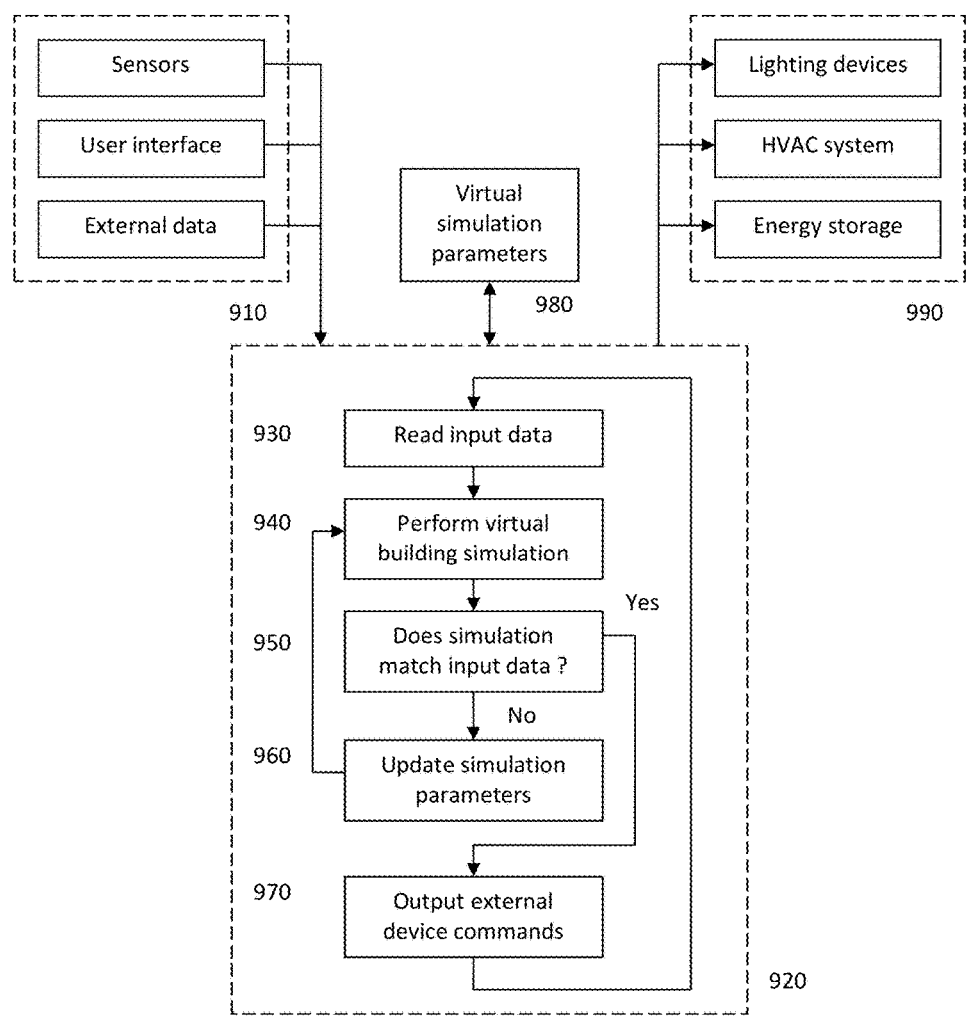
FIG. 9 shows a block diagram of a predictive daylight harvesting system.

FIG. 9 shows a plurality of sensors and data feeds 910 providing real-time information to a controller 920. In Step 930, the controller reads the input data, then in Step 940 performs a virtual simulation of the building environment based on the virtual simulation parameters 980. The results of this simulation are compared with the predicted sensor data in Step 950. If the difference between the predicted and measured data exceeds predefined limits, the simulation parameters are updated and Steps 940 and 950 are repeated; otherwise Step 970 outputs commands to the external devices 990.

Aquaculture

In another embodiment, the environment is an aquaculture system comprised of tanks, ponds, or ocean and lake enclosures used to raise fish for commercial purposes, where overhead or underwater lighting may be used to control feeding, reproduction, circadian rhythms, and other species management factors (US 2014/0355254). Supplemental lighting may be required, particularly during winter months. Given the often remote locations of marine net pens, providing electrical power often entails considerable costs.

In addition to the Perez sky model or similar mathematical model for predicting sky conditions, a mathematical model representing the distribution of light in turbid fluid media may be employed. Such models enable the prediction of illuminance and other photometric parameters at specified depths and distances for specified or measured water turbidity. Additional parameters such as tidal depth and fish or shellfish behavior models may also be employed.

Figure 10:
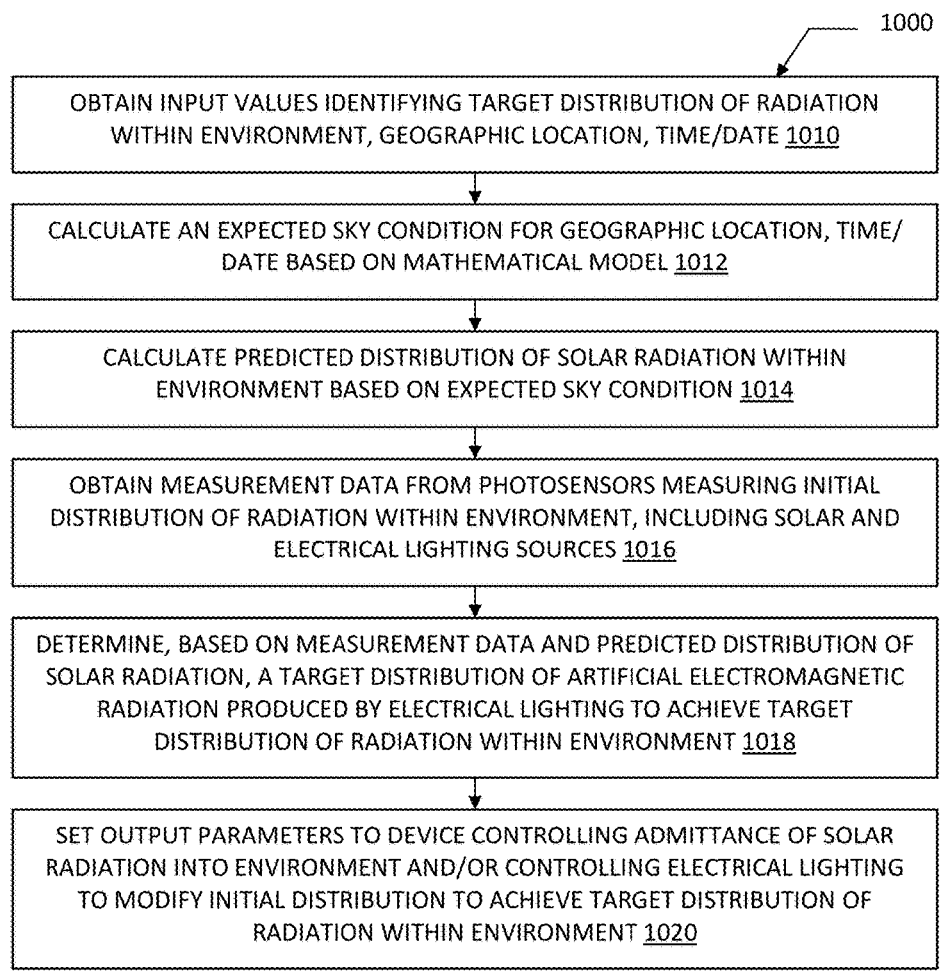
FIG. 10 is a flow diagram depicting an example method.

Aspects of the present disclosure may be implemented as a method performed by a predictive daylight harvesting system. FIG. 10 is a flow diagram depicting an example method 1000.

At 1010, the method includes obtaining one or more input values identifying a target distribution of direct and interreflected radiation within an environment. Additionally, or alternatively at 1010, the method includes obtaining one or more input values identifying a geographic location, a time of day, and a date. Input values may be obtained received from external sources, internally generated, or retrieved from memory. As an example, a target distribution of radiation may be user-defined, whereas the time and date may refer to the current time and date, or a future time and date. The geographic location may refer to a geographic location of a building or other environment that is to be controlled.

At 1012, the method includes calculating an expected sky condition for the geographic location, the time of day, and the date based on a mathematical model. In an example, the mathematical model incorporates historical weather data. Alternatively, or additionally, the mathematical model was previously trained on or using historical weather data. Alternatively, or additionally, the method may include obtaining a current weather feed from a remote device over a communications network, and calculating the expected sky condition may be further based on information contained in the current weather feed.

At 1014, the method includes calculating a predicted distribution of direct and interreflected solar radiation within the environment based on the expected sky condition. In at least some implementations, calculating the predicted distribution of direct and interreflected solar radiation within the environment based on the expected sky condition includes determining a transfer of solar radiation through one or more windows or openings within a virtual representation of the environment by: (1) assigning a unique identifier to each surface element in the virtual representation of the environment; (2) capturing an image of visible surface elements of an exterior of the environment as seen through a window or an opening of the one or more windows or openings; (3) projecting the image onto the visible surface elements of an interior of the environment as seen through the window or the opening; and (4) indirectly determining luminance or spectral radiant exitance transferred from an exterior surface element to a corresponding interior surface element for one of a multiplicity of canonical radiosity solutions by way of the unique identifier of the exterior surface element.

At 1016, the method includes obtaining measurement data from one or more photosensors measuring an initial distribution of direct and interreflected radiation within the environment. The initial distribution of direct and interreflected radiation may include radiation from solar and/or electrical lighting sources. In at least some implementations, the measurement data obtained from the one or more photosensors provides a less dense spatial sampling of the initial distribution of direct and interreflected radiation within the environment than the predicted distribution of direct and interreflected solar radiation within the environment.

At 1018, the method includes determining, based on the measurement data and the predicted distribution of direct and interreflected solar radiation, a target distribution of direct and interreflected artificial electromagnetic radiation produced by electrical lighting to achieve the target distribution of direct and interreflected radiation within the environment. In at least some implementations, the target distribution of direct and interreflected artificial electromagnetic radiation produced by the electrical lighting may be calculated by performing radiative flux transfer calculations with a virtual representation of the environment. The virtual representation may include geometry and material properties of objects that influence the distribution of luminous flux in the environment. As an example, a photosensor in the virtual representation of the environment may comprise a transparent surface element with a finite area that records radiant flux transferred from a selected light source or surface element at each iteration of the radiative flux transfer calculations.

At 1020, the method includes setting output parameters to one or more devices controlling admittance of solar radiation into the environment and/or controlling the electrical lighting to modify the initial distribution to achieve the target distribution of direct and interreflected radiation within the environment. The target distribution of direct and interreflected radiation within the environment may include solar and/or artificial electromagnetic radiation components.

In at least some implementations, the method at 1020 may further include setting the output parameters to maximize the solar radiation admitted into the environment as a component of the target distribution of direct and interreflected radiation while maintaining one or more additional environmental parameters within a predefined range. As an example, the output parameters may be set to supplement the solar radiation admitted into the environment with the target distribution of direct and interreflected artificial electromagnetic radiation produced by the electrical lighting. Non-limiting examples of environment parameters include temperature, humidity, light spectrum, light intensity, and/or other parameters described herein.

In at least some implementations, the method may further include calculating a distribution of solar heat gain within the environment based on the measurement data and/or the predicted distribution of direct and interreflected solar radiation. One or more effects of the distribution of solar heat gain on one or more environmental parameters may be calculated. A target value for each environmental parameter may be obtained. Setting the output parameters to one or more devices may further varying a relative proportion of solar radiation to artificial electromagnetic radiation within the target distribution of direct and interreflected radiation to achieve the target value for each of the one or more environmental parameters. Additional measurement data may be received from one or more additional sensors measuring the one or more environmental parameters within the environment. Calculating the one or more effects of the distribution of solar heat gain on the one or more environmental parameters may be further based on the additional measurement data received from the one or more additional sensors.

In at least some implementations, the method may further include receiving one or more information feeds from external sources. The measurement data, the information feeds, and the output parameters may be used to train an artificial intelligence engine to control the one or more devices in response to the measurement data and information feeds.

In at least some implementations, the methods and processes, or portions thereof described herein may be tied to a computing system that includes one or more computing devices. Such methods and processes may be implemented as a computer-application program or service, an application-programming interface (API), a library, and/or other computer-program type.

Figure 11:
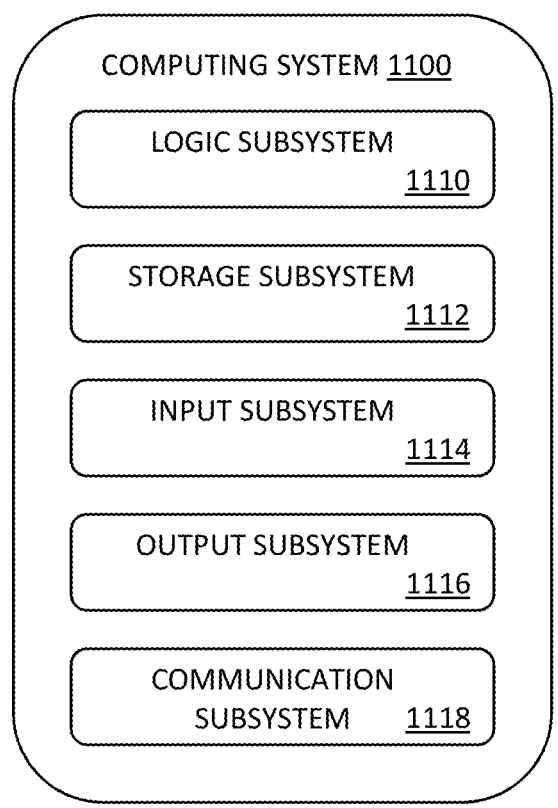
FIG. 11 is a schematic diagram depicting an example computing system.

FIG. 11 is a schematic diagram depicting an example computing system 1100. Computing system 1100 is a non-limiting example of a control system or controller that forms part of a predictive daylight harvesting system. Computing system 1100 can perform the methods and processes, or portions thereof described herein. Computing system 1100 is shown in simplified form. Computing system 1100 may take the form of one or more personal computers, server computers, mobile computing devices, electronic controller devices, and/or other computing devices.

Computing system 1100 includes a logic subsystem 1110 and a storage subsystem 1112.

Computing system 1100 may further include an input subsystem 1114, an output subsystem 1116, a communication subsystem 1118, and/or other components not shown in FIG. 11.

Logic subsystem 1110 may include one or more physical logic devices configured to execute instructions. For example, the logic subsystem may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem may include one or more processors (as an example of physical logic devices) configured to execute software instructions. Additionally, or alternatively, the logic subsystem may include one or more hardware and/or firmware logic machines (as an example of physical logic devices) configured to execute hardware or firmware instructions. Processors of the logic subsystem may be single-core or multi-core, and the instructions executed thereon may be configured for sequential, parallel, and/or distributed processing. Individual components of the logic subsystem may be distributed among two or more separate devices, which may be remotely located and/or configured for coordinated processing. Aspects of the logic subsystem may be virtualized and executed by remotely accessible, networked computing devices configured in a cloud-computing configuration.

Storage subsystem 1112 includes one or more physical, non-transitory memory devices configured to hold instructions executable by the logic subsystem in non-transitory form, to implement the methods and processes described herein. When such methods and processes are implemented, the state of storage subsystem 1112 may be transformed—e.g., to hold different data. Storage subsystem 1112 may include removable and/or built-in devices. Storage subsystem 1112 may include optical memory devices, semiconductor memory devices, and/or magnetic memory devices, among other suitable forms.

Storage subsystem 1112 may include volatile, nonvolatile, dynamic, static, read/write, read-only, random-access, sequential-access, location-addressable, file-addressable, and/or content-addressable devices. Aspects of logic subsystem 1110 and storage subsystem 1112 may be integrated together into one or more hardware-logic components. While storage subsystem 1112 includes one or more physical devices, aspects of the instructions described herein alternatively may be propagated by a communication medium (e.g., an electromagnetic signal, an optical signal, etc.) that is not necessarily held by a physical device for a finite duration.

The terms "module," "program," and "engine" may be used to describe an aspect of computing system 1100 implemented to perform a particular function. In some cases, a module, program, or engine may be instantiated via logic subsystem 1110 executing instructions held by storage subsystem 1112. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc. A "service", as used herein, may refer to an application program executable across multiple user sessions. A service may be available to one or more system components, programs, and/or other services. In some implementations, a service may run on one or more server-computing devices.

Input subsystem 1114 may include or interface with one or more user-input devices such as a keyboard, mouse, touch screen, microphone etc. Input subsystem 1114 may include or interface with one or more sensor devices, such as previously described herein. Non-limiting examples of such sensor devices include daylight illuminance sensors, photosynthetic photon flux density sensors, ultraviolet radiation sensors, infrared radiation sensors, spectroradiometric sensors, temperature sensors, humidity sensors, soil moisture sensors, carbon dioxide sensors, oxygen sensors, wind speed/direction sensors, water turbidity sensors, gas concentration sensors, and plant phytometric sensors. Input subsystem 1114 may additionally receive input data from information feeds such as weather report feeds, building automation systems, energy storage systems, solar panels, electrical power utilities, and smart power grids.

Output subsystem 1116 may include or interface with one or more user-output devices such as a graphical display device, touch screen, audio speakers, etc. Output subsystem 1116 may include or otherwise interface with one or more devices that control admittance of solar radiation into an environment and/or control electrical lighting, as well as the various other control devices described herein. Other example devices that may form part of the output subsystem or may otherwise interface with the output system include luminaire switches and dimmers, moveable shades, electrochromic windows, and heating, ventilation, and air conditioning equipment. Such devices may be referred to as external devices if they are not integrated with an electronic controller.

Communication subsystem 1118 may be configured to communicatively couple computing system 1100 with one or more other devices. Communication subsystem 1100 may include wired and/or wireless communication devices compatible with one or more different communication protocols. As non-limiting examples, the communication subsystem may be configured for communication via a wired or wireless wide area network, local area network, and/or personal area network. In an example, the communication subsystem may allow computing system 1100 to send and/or receive messages to and/or from other devices via a communications network.

As described herein, a variety of information in the form of data may be measured, collected, received, stored, retrieved from storage, processed, analyzed, organized, copied, reported, and/or transmitted in raw and/or processed forms. Data includes a set of one or more values (i.e., data values) of one or more parameters or variables. Such values may be quantitate or qualitative in nature. Data may be represented by one or more physical quantities, attributes, or characteristics of one or more signals or object states.

An object state refers to a physical state of a tangible, physical object, such as a device or machine. Within the context of a computing system or other electronic system, an object state may include a value of a bit stored in a memory cell or other suitable bistable or multistable electronic circuit (e.g., flip-flop or latch) of a memory device. As an example, a value of a bit may be defined by a high or low physical voltage value of a memory cell, corresponding to values of 1 or 0 for the bit, respectively.

Data represented by one or more signals (i.e., data signals) may be propagated by a communication medium, in the form of electrical signals, electromagnetic signals, optical signals, etc. Data signals may be communicated over one or more wired and/or wireless communications links or paths. Data signals may take the form of or form part of a modulated signal or a non-modulated signal. Data signals may be formatted or otherwise organized into one or more messages, streams, packets, datagrams, and/or frames as defined by one or more communications protocols.

Data may be represented in a variety of digital and/or analog forms. Within the context of digital data, an object state or signal component representing an individual data unit may be observed or identified as having a discrete value of two or more discrete values. Within the context of analog data, an object state or signal component representing an individual data unit may be observed or identified as having a value within a range of non-quantized values.

A collection of data may take the form of a set instructions that are executable by a machine to perform one or more operations. Such instructions may be referred to as machine-readable instructions that direct the machine to perform one or more operations. A set of instructions may take the form of software or a portion thereof (e.g., a software component). Software may include firmware, an operating system, an application program or other program type, a software plug-in, a software update, a software module, a software routine, or other software component.

An organized collection of data may take the form of a database system or other suitable data structure (e.g., an electronic file). A database system includes one or more databases that define relationships and associations between and among data objects. As an example, a data object (e.g., a user identifier) that includes a set of one or more data values may be associated with one or more other data objects (e.g., a user setting). A database system may be integrated with or form part of a software component.

Data may include metadata that describes other data. Metadata describing the structure of other data, such as a relationship or association of data objects in a database may be referred to as structural metadata. Metadata describing the content of other data may be referred to as guide metadata. A collection of data may include metadata and other data described by that metadata.

The configurations and/or approaches described herein are exemplary in nature, and specific implementations or examples are not to be considered in a limiting sense, because numerous variations are possible. The specific methods or processes described herein may represent one or more of any number of processing strategies. As such, various acts illustrated may be performed in the sequence illustrated, in other sequences, in parallel, or in some cases omitted. Likewise, the order of the above-described processes may be changed. The subject matter of the present disclosure includes all novel and nonobvious combinations and subcombinations of the various methods, processes, systems and configurations, and other features, functions, acts, and/or properties disclosed herein, as well as any and all equivalents thereof.

The embodiments of the invention may be varied in many ways. Such variations are not to be regarded as a departure from the spirit and scope of the invention, and all such modifications as would be obvious to one skilled in the art are intended to be included within the scope of the claims.

Dynamic Lighting Simulation

Figure 41:
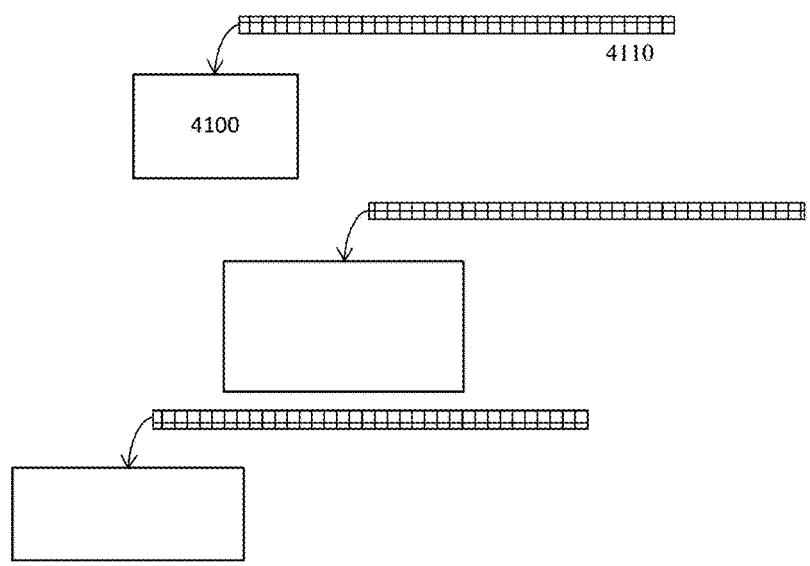
FIG. 41 shows the n canonical radiosity solutions of a virtual environment.

A multiplicity of n canonical radiosity solutions are calculated for a given virtual environment, wherein each said radiosity solution represents the sum of the direct and indirect illumination of all surfaces due to light emitted by a single sky or solar patch, and wherein each environment geometric element 4100 is assigned an array 4110 of n parameters representing the luminous or spectral radiant exitance of the element according to the n canonical radiosity solutions (FIG. 41).

Once the n canonical radiosity solutions have been calculated, the radiosity solution for any given sky luminance distribution for a specified time and date can be calculated as a weighted sum of the canonical radiosity solutions, where the weights are the luminances of the associated sky and solar patches as predicted by a sky luminance distribution model.

Given that the sky and solar patches are light emitters, the concept may be trivially extended to electric light sources, including physical luminaires with measured luminous intensity distributions and diffusely-emitting light sources such as organic light-emitting diode (OLED) panels, and wherein each canonical radiosity solution represents the sum of the direct and indirect illumination of all surfaces due to light emitted by all the light sources assigned to a lighting channel.

Similarly, a specific radiosity solution can be calculated as a weighted sum of the canonical radiosity solutions, where the weights are the luminous flux outputs of the light sources as determined by the set of lighting channel intensity settings. For color-changing luminaires, the gamut of colors can be represented by red-green-blue (RGB) virtual light sources whose intensities are independently controlled by three lighting channels.

It is further evident that the set of n canonical radiosity solutions may include both those due to sky and solar (i.e., daylight) patches and electric light sources, and specific radiosity solutions derived accordingly. Specific radiosity solutions may be calculated in milliseconds, as opposed to minutes to hours for prior art approaches.

The same approach can also be applied to "virtual photometers," which are comprised of user-defined positions and orientations in the 3D environment where the incident illuminance is calculated for each canonical radiosity solution. Photometer readings for specific radiosity solutions can then be calculated according to the assigned weights of the lighting channels and daylight patches.

The real-time 3D interactive display of photometric analysis of specific radiosity solutions may include as architectural visualizations. As shown by prior art implementations, however (e.g., the AGi32 lighting design and analysis software program by Lighting Analysts), graphical application programming interfaces (APIs) such as OpenGL with appropriate hardware acceleration by commodity graphics processing units (GPUs) can provide real-time 3D interactive display capabilities—but only for precalculated static radiosity solutions with predetermined light source intensities and sky and solar patch luminances. (Each geometric element is comprised of three or four vertices, whose RGB values are bilinearly interpolated from the element spectral radiant exitances as described in, for example, the book "Radiosity: A Programmer's Perspective". These vertex RGB values are then used for OpenGL rendering purposes.)

Texture Maps

The OpenGL API, which is continually evolving, introduced the OpenGL Shading Language (GLSL) in 2006. This programming language provided software developers with more direct control of the GPU graphics pipeline. One of the features of this language is the ability to assign and modify user-defined attributes to each vertex of the environment surfaces. (Microsoft similarly offers its proprietary High Level Shading Language (HLSL) for Direct3D.)

This suggests an approach wherein a multiplicity of canonical radiosity solutions is stored on a per-vertex basis as vertex attributes. Each attribute is a 32-bit value, which is sufficient to represent the appropriately-scaled spectral radiant exitance for a single canonical radiosity solution. These attributes can then be weighted by the associated lighting channel intensity or daylight patch luminance values in real time for display purposes.

The problem with this approach is that the minimum number of per-vertex attributes that an OpenGL implementation must support is 16. Further, some of these attributes may be allocated for vendor-specific functions, further limiting the number of available per-vertex attributes.

On the other hand, commodity graphic cards in desktop and laptop computers typically include 512 megabytes to several gigabytes of random-access memory. This memory is most often used to store texture maps, including color, stencil, and depth buffers, which are specific to the rendered images.

Figure 42:
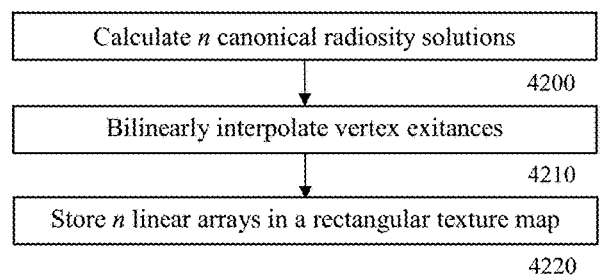
FIG. 42 shows a flowchart for the data storage of a multiplicity of canonical radiosity solutions in a two-dimensional texture map.

In the present invention, this memory is repurposed to store the n canonical radiosity solutions on a per-vertex basis. As shown in FIG. 42, this comprises the steps of:

1. Step 4200—calculate n canonical radiosity solutions. Each solution is comprised of a linear array of m=p+r floating point values representing the spectral (red-green-blue) radiant exitances of the p geometric elements and (optionally) luminances or spectral radiant exitances of the r daylight patches.
2. Step 4210—bilinearly interpolate the spectral radiant exitance and (optionally) luminance values of the element and patch vertices.
3. Step 4220—store the n linear arrays in sequence as a rectangular texture map in the graphics card texture memory. The maximum dimensions of a texture are vendor- and product-specific, typically ranging from 1024 to 8192 pixels. The element addresses of the n linear arrays therefore need to be appropriately mapped to the row and column addresses of the texture map. (If needed, the linear arrays can be stored across multiple texture maps.)

A particular advantage of storing the canonical radiosity solutions as one or more texture maps is that the memory is accessible to the GPU via its high-bandwidth memory bus, rather than needing to be marshalled by the CPU from main memory and transferred through the much slower graphics card bus.

Data Storage

Once the canonical radiosity solutions have been calculated, it is necessary to store the data and the associated geometry and materials information for later display. While there are many possible data storage formats, one example suffices to demonstrate the principles.

For architectural visualization applications involving daylight, it is convenient to separate the environment geometry into "interior" and "exterior" elements. One reason is that the average illuminance of interior (e.g., room) surfaces is typically orders of magnitude less than that of exterior surfaces. By applying different scaling factor to the interior and exterior vertex colors, more aesthetically pleasing images that include both types of surfaces can be produced.

In some lighting designs, the lighting channels may not be consecutively numbered. An "active channel map" is then required that maps each user-defined lighting channel number to the index of one of the canonical radiosity solutions.

It is further convenient to represent objects in the virtual environment as "instances," wherein each instance is comprised of one or more "surfaces."

The example binary file format therefore consists often sections:

1. Header
2. Opaque Exterior Surface Blocks List
3. Opaque Interior Surface Blocks List
4. Textured Exterior Surface Blocks List
5. Textured Interior Surface Blocks List
6. Placeholder Exterior Surface Blocks List
7. Placeholder Interior Surface Blocks List
8. Transparent Surface Blocks List
9. Virtual Photometers List
10. Texture Maps Header
11. Texture Maps List where each "block" represents the triangular elements comprising an instance surface.

Header

The file header consists of the following:

| Offset | Type | Name | Size | Description | Notes |
|---|---|---|---|---|---|
| 0x0000 | DWORD | version | 1 | Version | 1 |
| 0x0004 | BYTE | ident | 16 | UUID identifer | 2 |
| 0x0014 | float | ec_scale | 1 | Exterior color scaling factor | 3 |
| 0x0018 | float | ic_scale | 1 | Interior color scaling factor | 3 |
| 0x001C | float | max_x | 1 | Maximum x-axis limit | |
| 0x0020 | float | max_y | 1 | Maximum y-axis limit | |
| 0x0024 | float | max_z | 1 | Maximum z-axis limit | |
| 0x0028 | float | min_x | 1 | Minimum x-axis limit | |
| 0x002C | float | min_y | 1 | Minimum y-axis limit | |
| 0x0030 | float | min_z | 1 | Minimum z-axis limit | |
| 0x0034 | DWORD | num_oesurf | 1 | Number of opaque exterior surfaces | |
| 0x0038 | DWORD | num_oisurf | 1 | Number of opaque interior surfaces | |
| 0x003C | DWORD | num_oeind | 1 | Number of opaque exterior surface indices | |
| 0x0040 | DWORD | num_oiind | 1 | Number of opaque interior surface indices | |
| 0x0044 | DWORD | num_oevert | 1 | Number of opaque exterior surface vertices | |
| 0x0048 | DWORD | num_oivert | 1 | Number of opaque interior surface vertices | |
| 0x004C | DWORD | num_tesurf | 1 | Number of textured exterior surfaces | |

-continued

| Offset | Type | Name | Size | Description | Notes |
|---|---|---|---|---|---|
| 0x0050 | DWORD | num_tisurf | 1 | Number of textured interior surfaces | |
| 0x0054 | DWORD | num_teind | 1 | Number of textured exterior surface indices | |
| 0x0058 | DWORD | num_tiind | 1 | Number of textured interior surface indices | |
| 0x005C | DWORD | num_tevert | 1 | Number of textured exterior surface vertices | |
| 0x0060 | DWORD | num_tivert | 1 | Number of textured interior surface vertices | |
| 0x0064 | DWORD | num_pesurf | 1 | Number of placeholder exterior surfaces | |
| 0x0068 | DWORD | num_pisurf | 1 | Number of placeholder interior surfaces | |
| 0x006C | DWORD | num_peind | 1 | Number of placeholder exterior surface indices | |
| 0x0070 | DWORD | num_piind | 1 | Number of placeholder interior surface indices | |
| 0x0074 | DWORD | num_pevert | 1 | Number of placeholder exterior surface vertices | |
| 0x0078 | DWORD | num_pivert | 1 | Number of placeholder interior surface vertices | |
| 0x007C | DWORD | num_dsurf | 1 | Number of transparent surfaces | |
| 0x0080 | DWORD | num_dindex | 1 | Number of transparent surface indices | |
| 0x0084 | DWORD | num_dvertex | 1 | Number of transparent surface vertices | |
| 0x0088 | long | oeblist_offset | 1 | Opaque exterior surface blocks list offset | |
| 0x008C | long | oiblist_offset | 1 | Opaque interior surface blocks list offset | |
| 0x0090 | long | teblist_offset | 1 | Textured exterior surface blocks list offset | |
| 0x0094 | long | tiblist_offset | 1 | Textured interior surface blocks list offset | |
| 0x0098 | long | peblist_offset | 1 | Placeholder exterior surface blocks list offset | |
| 0x009C | long | piblist_offset | 1 | Placeholder interior surface blocks list offset | |
| 0x00A0 | long | dblist_offset | 1 | Transparent surface blocks list offset | |
| 0x00A4 | long | pmlist_offset | 1 | Photometer list offset | |
| 0x00A8 | long | tmlist_offset | 1 | Texture maps list offset | |
| 0x00AC | WORD | num_alc | 1 | Number of active lighting channels | 4 |
| 0x00AE | WORD | num_meters | 1 | Number of virtual photometers | |
| 0x00B0 | WORD | num_tex | 1 | Number of textures | |
| 0x00B2 | WORD | padding | 1 | Reserved | |
| 0x00B4 | short | alc_ids | 65 | Active lighting channel identifiers array | 5, 6 |
| 0x0136 | short | chan_map | 65 | Channel map array | 7, 8 |
| 0x01B8 | float | cie_cat02_00 | 1 | CIE CAT02[0][0] | |
| 0x01BC | float | cie_cat02_01 | 1 | CIE CAT02[0][1] | |
| 0x01C0 | float | cie_cat02_02 | 1 | CIE CAT02[0][2] | |
| 0x01C4 | float | cie_cat02_10 | 1 | CIE CAT02[1][0] | |
| 0x01C8 | float | cie_cat02_11 | 1 | CIE CAT02[1][1] | |
| 0x01CC | float | cie_cat02_12 | 1 | CIE CAT02[1][2] | |
| 0x01D0 | float | cie_cat02_20 | 1 | CIE CAT02[2][0] | |
| 0x01D4 | float | cie_cat02_21 | 1 | CIE CAT02[2][1] | |
| 0x01D8 | float | cie_cat02_22 | 1 | CIE CAT02[2][1] | |
| 0x01DC | BOOL | day_flag | 1 | Daylight flag | 9, 10 |

The daylight file header data consists of the following:

| Offset | Type | Name | Size | Description | Notes |
|---|---|---|---|---|---|
| 0x01E0 | DWORD | units | 1 | Measurement units | 10 |
| 0x01E4 | float | compass | 1 | Compass rotation (degrees) | |
| 0x01E8 | float | latitude | 1 | Site latitude (degrees) | |
| 0x01EC | float | longitude | 1 | Site longitude (degrees) | |
| 0x01F0 | WORD | num_meters | 1 | Number of meters | |
| 0x01F2 | BYTE | reserved | 526 | Reserved | |

Notes

1. Vertex RGB color values should be multiplied by ec_scale for displaying exterior surfaces and ic_scale for displaying interior surfaces.
2. The UUID (Universally Unique Identifier) provides a unique identifier for the file.
3. Vertex RGB color values are not gamma-corrected.
4. For the purposes of num_alc, color-changing luminaires are considered to have a single active lighting channel with three independent subchannels.
5. Each active lighting channel identifiers array (alc_ids) element can have one of five values:
    −1—Inactive channel
    0—Red color channel only
    1—Green color channel only
    2—Blue color channel only
    3—All color channels
6. The zeroth element of alc_ids represents constant intensity luminaires, and has a value of 3 (all color channels).
7. The channel map array (chan_map) elements map active lighting channel identifiers to the vertex color offsets in the block color_table arrays (see below).
8. The zeroth element of chan_map represents constant intensity luminaires, and has a value of 0.
9. The optional daylight parameters are required only if day_flag, is TRUE.
10. Valid units values are:
    0—feet
    1—meters
    2—millimeters Surface Blocks OpenGL indexed vertex arrays require the same OpenGL state for each array. There are therefore four surface block types:
   1. Opaque surfaces (exterior and interior);
   2. Textured surfaces (exterior and interior);
   3. Placeholder surfaces (exterior and interior); and
   4. Transparent surfaces.

Opaque surfaces do not have assigned textures.

Textured surfaces are opaque surfaces that have assigned BGR texture maps.

Placeholder surfaces are semitransparent surfaces that have assigned BGRA texture maps.

Transparent surfaces comprise interior and exterior glass and window (exterior-interior transition) surfaces.

Each surface block consists of the following:

| Offset | Type | Name | Size | Description | Notes |
|---|---|---|---|---|---|
| 0x00 | char | entity_name | 33 | Entity name | 1 |
| 0x21 | BYTE | layer_id | 1 | Surface layer identifier | 3 |
| 0x22 | WORD | tex_id | 1 | Texture identifier | 4 |
| 0x24 | WORD | tex_param | 1 | Texture parameters | |
| 0x26 | WORD | — | 1 | Padding | |
| 0x28 | float | avg_red | 1 | Average texture map red reflectance | |
| 0x2C | float | avg_green | 1 | Average texture map green reflectance | |
| 0x30 | float | avg_blue | 1 | Average texture map blue reflectance | |
| 0x34 | DWORD | num_index | 1 | Number of indices | |
| 0x38 | DWORD | num_vert | 1 | Number of vertices | |
| 0x3C | DWORD | index_table | num_index | Vertex indices table | |
| 0x40 | float | position_table | num_vert * 3 | Vertex position table | |
| — | float | chan_table | num_vert * q | Vertex channel table | 5, 6 |
| — | float | day_table | num_vert * d | Vertex daylight patch table | 5, 7 |
| — | float | coord_table | num_vert * 2 | Texture coords table | 8, 9 |

Notes
1. The null-terminated entity_name has a maximum length of 32 characters. This field can be used by the application program to identify and selectively display entities.
2. This field can be used by the application program to selectively display surface layers.
3. Texture identifiers are one-based; a tex_id of zero indicates that no texture is associated with the surface.
4. For opaque and textured surface (including placeholder) blocks, q = (num_alc + 1); for transparent surface blocks, q = 1. (The vertex colors of transparent and placeholder surfaces are dependent only on the material color.)
5. Vertex channel and daylight patch spectral radiant exitances are written in RGB order using the Ward LogLuv encoding format (Larson, G. W. 1998. "The LogLuv Encoding for Full Gamut, High Dynamic Ranges Images," Journal of Graphics Tools 3(1): 15-31) with adaptive run-length encoding (Glassner, A. S. 1991. "Adaptive Run-Length Encoding," in Graphics Gems II, pp. 89-92. San Diego, CA: Academic Press).
6. If num_alc > 0, opaque and textured surface (including placeholder) vertex spectral radiant exitances for successive active lighting channels are stored in the channel_table. For example, if num_alc = 2 and the active lighting channels are 5 (color-changing luminaire) and 8 (white light luminaire), the first vertex would be represented as:

Channel   Red              Green            Blue
None      color_table[0]   color_table[1]   color_table[2]
5         color_table[3]   color_table[4]   color_table[5]
8         color_table[6]   color_table[7]   color_table[8]

7. For opaque and textured surface blocks, d = 257 if day_flag in the file header is TRUE; otherwise d = 0. For transparent surface blocks, d = 0.
8. Texture parameters are as required by OpenGL.
9. The vertex texture coordinates table is present only if tex_id is non-zero.

Virtual Photometers List

Each of the num_meter records in the virtual photometers list is comprised of:

| Offset | Type | Name | Size | Description | Notes |
|---|---|---|---|---|---|
| 0x00 | float | xpos | 1 | Position x-axis coordinate | |
| 0x04 | float | ypos | 1 | Position y-axis coordinate | |
| 0x08 | float | zpos | 1 | Position z-axis coordinate | |
| 0x0C | float | xori | 1 | Orient x-axis coordinate | |
| 0x10 | float | pori | 1 | Orient y-axis coordinate | |
| 0x14 | float | zori | 1 | Orient z-axis coordinate | |
| 0x18 | float | chan_table | q | Channel values table | 1 |
| — | float | day_table | d | Daylight patch values table | 2 |

Notes
1. q = num_alc + 1.
2. d = 257 if day_flag in the file header is TRUE; otherwise d = 0.

Texture Maps

BGR (24-bit) and BGRA (32-bit) texture maps are stored in order according to their (one-based) texture identifiers.

Each texture map is preceded by its texture map header:

| Offset | Type | Name | Size | Description | Notes |
|---|---|---|---|---|---|
| 0x00 | BOOL | alpha_flag | 1 | Alpha flag | 1 |
| 0x01 | WORD | num_row | 1 | Number of rows | |
| 0x03 | WORD | num_col | 1 | Number of columns | |
| 0x05 | long | tm_offset | 1 | Texture map offset | |

Notes
1. The texture map type is BGRA if alpha_flag is TRUE; otherwise it is BGR.
2. Texture maps do not have gamma correction applied.

OpenGL Rendering

To generate real-time dynamic lighting simulations using OpenGL or Direct3D, the geometric information is read from the data storage medium and used to generate index vertex arrays, while the texture maps are read into the GPU memory. Similarly, the per-vertex channel and daylight patch spectral radiant exitances are decompressed and used to generate one or more texture maps to represent the canonical radiosity solutions.

To display the real-time images (typically at 30 or more frames per second), the CPU portion of the program manages the display and user interaction of lighting channel settings and (optionally) the daylight patch luminances according to the user-defined sky model. This minimal amount of information is transferred to the GPU for each frame, where it is stored in a "uniform" (i.e., global) data array. (In an alternative embodiment, the setting and luminance values are transferred only if they have changed since the previous frame.)

In a first embodiment, the lighting channel settings are obtained from user controls, such as slider bars, that are displayed by the program. The user controls may optionally implement industry-standard dimming curves such as, for example, square law or sigmoid ("S") curves.

In a second embodiment, the lighting channel settings are obtained by means of executing a predefined lighting script, whose instructions determine the channel on/off settings and dimmer fade rates according to a time schedule. Such a script may, of course, include audio track synchronization cues and virtual camera path instructions.

Figure 43:
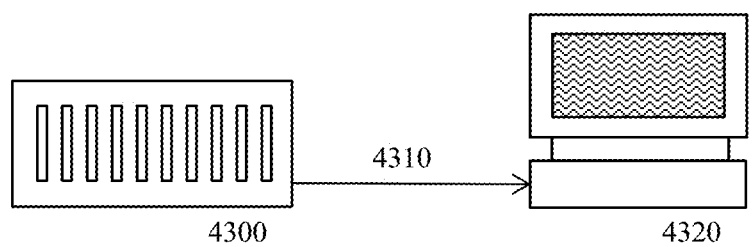
FIG. 43 shows a system for displaying virtual real-time dynamic lighting systems using an external lighting console as an input source.

In a third embodiment (shown in FIG. 43), the lighting channel settings are derived from an external light console 4300 that generates a data stream 4310 of dimmer instructions based on, for example, the USITT DMX512-A communication protocol. These instructions directly control the intensities of the light sources displayed in the virtual environment generated on the monitor of computer 4320.

GPU Graphics Pipeline

The GPU portion of the program, as implemented using the GLSL or HLSL shading languages, comprises two separate subprograms referred to as the "vertex shader" and the "fragment shader," representing two stages of the GPU's graphics pipeline.

Figure 44:
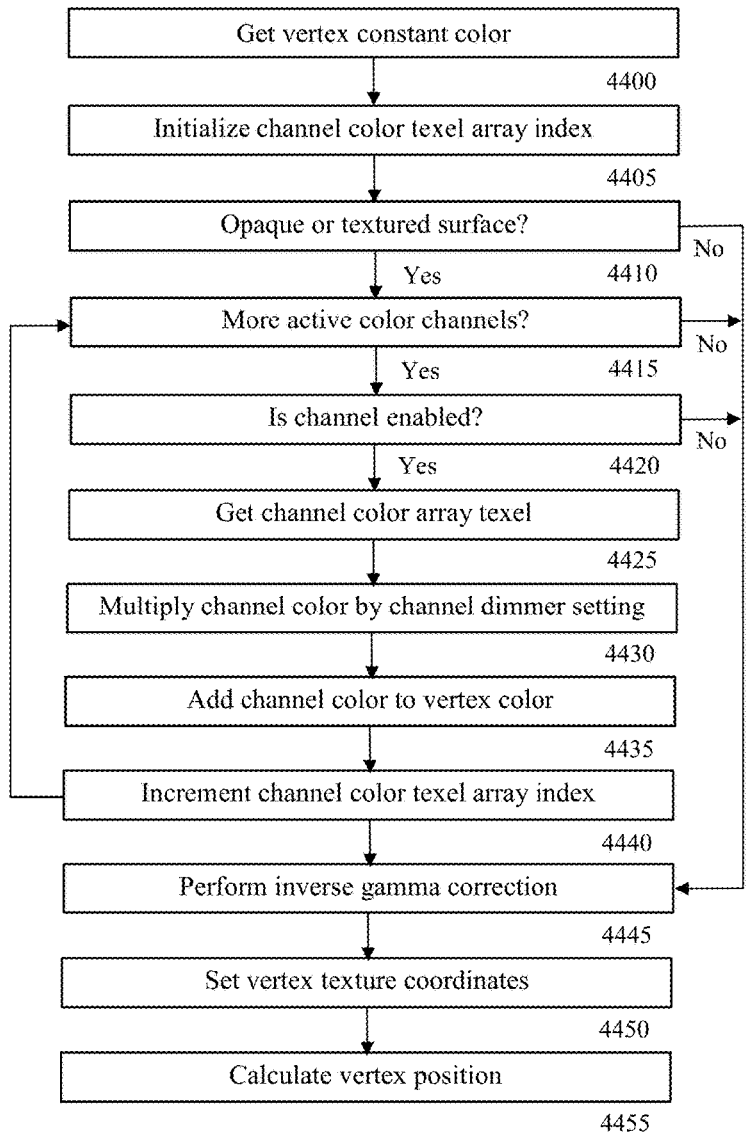
FIG. 44 shows a flowchart of a vertex shader program for displaying an interactive dynamic lighting simulation in real time.
Figure 45:
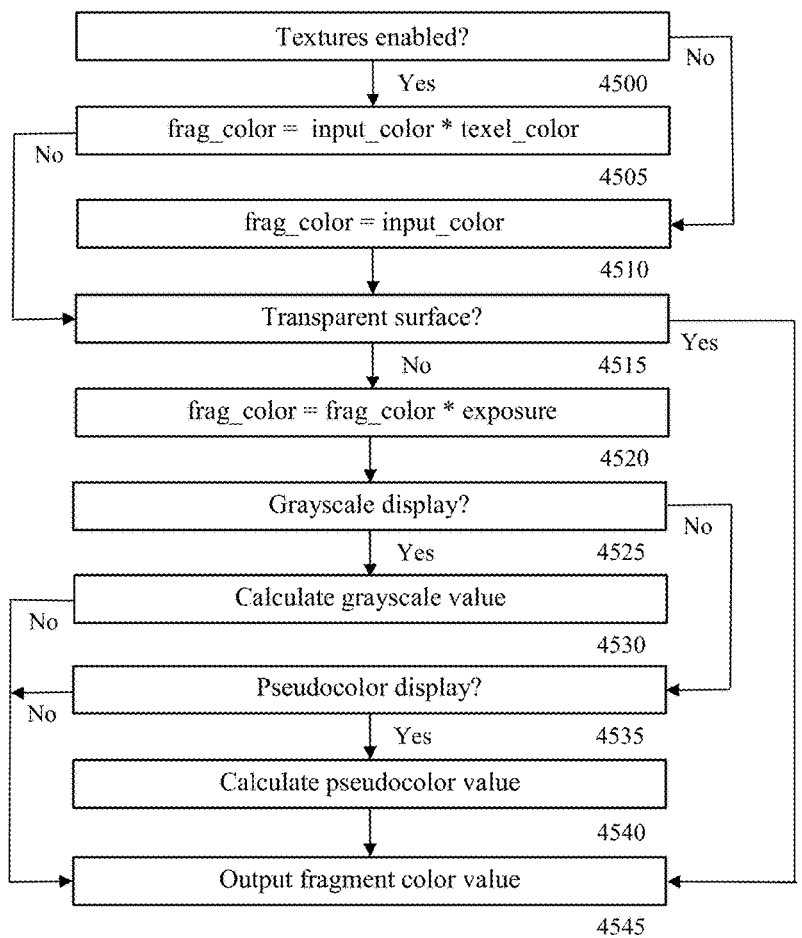
FIG. 45 shows a flowchart of a fragment shader program for displaying an interactive dynamic lighting simulation in real time.

The vertex shader program is executed on a per-vertex basis for the entire environment, where the GPU has dozens to thousands of processor cores performing the program calculations in parallel. Expressed in pseudocode, this program is:

```
Get vertex constant color
Initialize channel color texel array index
IF opaque or textured surface
    FOR each active color channel
        IF channel is enabled
            Get channel color array texel
            Multiply channel color by channel dimmer setting
            Add channel color to vertex color
            Increment channel color texel array index
        ENDIF
    ENDFOR
ENDIF
Perform inverse gamma correction
Set vertex texture coordinates
Calculate vertex position
``` with the equivalent flowchart shown in FIG. 44.

In Step 4400, the program fetches the vertex constant color from the texture map and uses its value to initialize the display vertex color. Of the n canonical radiosity solutions, one solution may represent the direct and indirect illuminance distribution within the environment for constant (i.e., non-dimmable) electric light sources. Each vertex therefore has a constant (albeit possibly zero) color.

In Step 4405, the program initializes the vertex channel color texel array index in order to access the spectral radiant exitances array associated with the vertex. (A "texel" is the OpenGL terminology for a texture map pixel.)

In Step 4410, the program determines whether the vertex belongs to an opaque or a textured surface. If true, the program proceeds to Step 4415; otherwise, it proceeds to Step 4445.

In Step 4415, the program iteratively determines whether there are more active color channels to be processed. If true, the program proceeds to Step 4420; otherwise, it proceeds to to Step 4445.

In Step 4420, the program determines whether the color channel is currently enabled. If, for example, the lighting channel associated with the color channel has been disabled, the color channel will also be disabled. If true, the program proceeds to Step 4425; otherwise, it proceeds to to Step 4445.

In Step 4425, the program fetches the vertex channel color texel from the texture map.

In Step 4430, the program multiplies the vertex channel color represented by the texel with the associated global (or, in OpenGL terminology, "uniform") channel dimmer setting or sky patch luminance.

In Step 4435, the vertex channel color is added to the display vertex color.

In Step 4440, the vertex channel color texel array index is incremented, following which program control returns to Step 4415 to process the next active color channel (if any).

In Step 4445, inverse gamma correction is applied to the display vertex color. For historical reasons related to cathode ray tube (CRT) technology, most computer displays exhibit a nonlinear relationship between specified pixel intensity I (typically in the range of 0 to 255) and pixel luminance L, described by the relationship $L=I^{2.2}$, where the nominal exponent 2.2 is referred to as the display gamma. To ensure that there is a linear relationship between the vertex color and the displayed pixel luminance, each component C of the red-green-blue triplet must undergo an inverse gamma correction: $C'=C^{0.45}$.

In Step 4450, the vertex texture coordinates are set as required for any vertex shader program.

In Step 4455, the vertex position is calculated as required for any vertex shader program.

The fragment shader program is executed on a per-pixel basis for the entire displayed image, where again the GPU has dozens to thousands of processor cores performing the program calculations in parallel. Expressed in pseudocode, this program is:

```
IF textures enabled
    frag_color = color * texel_color
ELSE
    frag_color = color
ENDIF
IF NOT transparent surface
    frag_color = frag_color * exposure
    IF grayscale display
        gsv = color.red * 0.2125 + color.green * 0.7154
              + color.blue * 0.0721
        frag_color = gsv
    ELSE IF pseudocolor display
        gsv = color.red * 0.2125 + color.green * 0.7154
              + color.blue * 0.0721
        IF gsv < 0.25
            frag_color.red = 0.0
            frag_color.green = 4.0 * gsv
            frag_color.blue = 1.0
        ELSE IF gsv < 0.5
            frag_color.red = 0.0
            frag_color.green = 1.0
            frag_color.blue = 2.0 - 4.0 * gsv
        ELSE IF gsv < 0.75
            frag_color.red = 4.0 * gsv - 2.0
            frag_color.green = 1.0
            frag_color.blue = 0.0
        ELSE
            frag_color.red = 1.0
            frag_color.green = 4.0 - 4.0 * gsv
            frag_color.blue = 1.0
        ENDIF
    ENDIF
ENDIF
``` with the equivalent flowchart shown in FIG. 5.

In Step 4500, the program determines whether textures are enabled for the displayed image. If true, the program proceeds to Step 4505; otherwise, it proceeds to Step 4510.

In Step 4505, the fragment color is initialized as the input color times the texel color, following which program control proceeds to Step 4515. (The terms "fragment," "input," and "texel" are understood as being GLSL shading language terminology for fragment shaders.)

In Step 4510, the fragment color is initialized as the input color, following which program control proceeds to Step 4515.

In Step 4515, the program determines whether the surface is a transparent surface. If false, the program proceeds to Step 4545; otherwise, it proceeds to Step 4520.

The user may specify an exposure setting to lighten or darken the displayed image. In Step 4520, the fragment color is multiplied by the exposure setting (which by default is unity).

The user-specified display type may be RGB color, grayscale, or pseudocolor. In Step 4525, the program determines whether a grayscale display has been specified. If true, the program proceeds to Step 4530; otherwise, it proceeds to Step 4535.

In Step 4530, the program calculates the fragment color as the luminance L (i.e., its grayscale value) of its red-green-blue (RGB) values as $L=0.2125*R+0.7154*G+0.0721*B$, following which program control proceeds to Step 4545. (The constants assume a video display calibrated in accordance with the ITU-R BT.709 standard for high-definition television displays; display calibrated in accordance with other standards will require different constants.)

In Step 4535, the program determines whether a pseudocolor display has been specified. If true, the program proceeds to Step 4540; otherwise, it proceeds to Step 4545.

In Step 4540, the program calculates the fragment color as a pseudocolor. As an example, an algorithm to calculate the pseudocolor of a luminance value L in the range of 0.0 to 1.0 is:

```
IF L < 0.25
    R = 0.0
    G = 4.0 * L
    B = 1.0
ELSE IF L < 0.5
    R = 0.0
    G = 1.0
    B = 2.0 – 4.0 * L
ELSE IF L < 0.75
    R = 4.0 * L – 2.0
    G = 1.0
    B = 0.0
ELSE
    R = 1.0
    G = 4.0 – 4.0 * L
    B = 0.0
ENDIF
```

In Step 4545, the program output the fragment color value as required for any fragment shader program.

Implemented as a combination of CPU and GPU procedures in a software program as disclosed herein, it is possible to interactively display dynamic lighting of virtual environments with hundreds of thousands of vertices and hundreds of lighting channels in real time on commodity desktop and laptop computers.

This invention has been disclosed in terms specific to the OpenGL graphical application programming interface, but it is equally applicable Direct3D and other graphical APIs that provide direct control of the GPU graphics pipeline.

Dynamic Lighting Simulation Optimization

A neuro-fuzzy or similar logic inference engine that can be trained using for example deep learning techniques to generate optimal memory and data storage including texture maps, data storage, headers, surface blocks, virtual photometers, rendering, CPU usage, and GPU usage for dynamic lighting simulation.

We claim:

1. A method performed by a lighting modelling system for displaying real-time dynamic lighting simulations, the method comprising:

encoding a texture map as a multiplicity of canonical radiosity solutions, each representing a lighting channel;

storing the solutions in a texture memory of a graphics processing unit (GPU);

generating a multiplicity of lighting channel intensity settings;

storing the lighting channel intensity settings;

accessing the canonical radiosity solutions on a per-vertex basis with a vertex shader program;

multiplying vertex channel colors associated with the vertices by the lighting channel intensity settings; and summing resultant colors to generate a display vertex color for display.

2. The method of claim 1 wherein, for each vertex, a vertex constant color value from the texture map is used to initialize the display vertex color with one of the multiplicity of canonical radiosity solutions, wherein said one canonical radiosity solution is used to represent a direct and indirect illuminance distribution within an environment for constant electric light sources.

3. The method of claim 2 wherein a vertex channel color texel array index is initialized in order to access a spectral radiant exitances array associated with each vertex.

4. The method of claim 3, wherein for one or more active color channels to be processed:

a vertex channel color texel from the texture map is fetched;

the vertex channel color represented by the texel is multiplied with an associated global channel dimmer setting or sky patch luminance;

the vertex channel color is added to the display vertex color;

the vertex channel color texel array index is incremented; and the next active color channel, if any, is processed.

5. The method of claim 2 wherein an inverse gamma correction is applied to the display vertex color, comprising:

each component of a red-green-blue triplet undergoing an inverse gamma correction;

setting vertex texture coordinates as required for the vertex shader program;

calculating a vertex position as required for the vertex shader program; and executing a fragment shader program on a per-pixel basis for an entire displayed image, utilizing a multiplicity of GPU processor cores.

6. The method of claim 3 wherein an inverse gamma correction is applied to the display vertex color comprising:

each component of a red-green-blue triplet undergoing an inverse gamma correction;

setting vertex texture coordinates as required for the vertex shader program;

calculating a vertex position as required for the vertex shader program; and executing a fragment shader program on a per-pixel basis for an entire displayed image, utilizing a multiplicity of GPU processor cores.

7. The method of claim 1, wherein textures are enabled for a displayed image and a fragment color is initialized as an input color times a texel color.

8. The method of claim 1, wherein a fragment color is initialized as an input color.

9. The method of claim 7, wherein the vertex belongs to an opaque surface, the method comprising the steps of:
specifying an exposure setting to lighten or darken the displayed image; and
multiplying the fragment color by the exposure setting.

10. The method of claim 8, wherein the vertex belongs to a textured surface, the method comprising the steps of:
specifying an exposure setting to lighten or darken the displayed image; and
multiplying the fragment color by the exposure setting.

11. The method of claim 9, wherein a grayscale display has been specified, the method comprising the steps of:
calculating the fragment color as a luminance of its red-green-blue values;
calculating the fragment color as a pseudocolor; and
outputting a value of the fragment color as required for a fragment shader program.

12. The method of claim 10, wherein a grayscale display has been specified, the method comprising the steps of:
calculating the fragment color as a luminance of its red-green-blue values;
calculating the fragment color as a pseudocolor; and
outputting a value of the fragment color as required for a fragment shader program.

13. The method of claim 9, wherein the fragment color value is output as required for a fragment shader program.

14. The method of claim 1, wherein the channel intensity settings are executed by a central processing unit.

15. The method of claim 1, wherein the lighting modelling system includes a daylight harvesting modelling system.

16. The method in claim 1, wherein the lighting modelling system for displaying real-time dynamic lighting simulations is for a building.

17. The method in claim 1, wherein the lighting modelling system for displaying real-time dynamic lighting simulations is for horticultural lighting purposes.

18. The method in claim 16, wherein the lighting modelling system for displaying real-time dynamic lighting simulations is for a space in a building.

19. The method in claim 16, wherein the lighting modelling system for displaying real-time dynamic lighting simulations is for a greenhouse.

20. The method in claim 16, wherein the lighting modelling system for displaying real-time dynamic lighting simulations is for theatrical lighting.

* * * * *